US006610578B2

(12) United States Patent
Norström et al.

(10) Patent No.: US 6,610,578 B2
(45) Date of Patent: *Aug. 26, 2003

(54) METHODS OF MANUFACTURING BIPOLAR TRANSISTORS FOR USE AT RADIO FREQUENCIES

(75) Inventors: Hans Norström, Solna (SE); Stefan Nygren, Uppsala (SE); Ola Tylstedt, Vällingby (SE)

(73) Assignee: Telefonaktiebolaget LM Ericsson (publ), Stockholm (SE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/114,282

(22) Filed: Jul. 13, 1998

(65) Prior Publication Data

US 2001/0012655 A1 Aug. 9, 2001

(30) Foreign Application Priority Data

Jul. 11, 1997 (SE) ................................ 9702693
Dec. 15, 1997 (SE) ................................ 9704659

(51) Int. Cl.⁷ ............................................ H01L 21/331
(52) U.S. Cl. .................. 438/369; 438/327; 438/329; 438/375
(58) Field of Search .................. 257/640, 647; 438/309, 369, 329, 327, 335; 4/4, 11

(56) References Cited

U.S. PATENT DOCUMENTS

| 3,246,214 A | | 4/1966 | Hugle |
| 4,110,125 A | * | 8/1978 | Beyer .......................... 257/640 |
| 4,247,861 A | | 1/1981 | Hsu et al. |

(List continued on next page.)

FOREIGN PATENT DOCUMENTS

DE  42 19 342  12/1992

(List continued on next page.)

OTHER PUBLICATIONS

Wolf, S.; Silicon Processing for the VLSI Era vol. 2: Process Integration, Sunset Beach, CA, 1990, p.p. 473–475, 486, 487, and 510–513.*

(List continued on next page.)

*Primary Examiner*—John F. Niebling
*Assistant Examiner*—Christopher Lattin
(74) *Attorney, Agent, or Firm*—Burns, Doane, Swecker & Mathis, L.L.P.

(57) ABSTRACT

A bipolar transistor of type NPN has an active region at the surface of the component, which is surrounded, as seen along the surface of the component, in the conventional way by thick field oxide areas. The active region is partly covered by an electrically isolating surface layer, preferably comprising a nitride layer. A base region in the active region is defined by a well-defined opening, which is lithographically produced, in the electrically isolating surface layer. For a bipolar lateral transistor of type PNP, which instead has emitter and collector regions surrounded by such thick field oxide areas, the emitter and collector regions can in the corresponding way be defined by a lithographically defined opening in an electrically isolating surface layer. Owing to the well defined openings the base-collector capacitance and the emitter-collector capacitance respectively can be reduced in these cases, what results in better high frequency characteristics of the transistors. A region of the silicon nitride layer is at the same time used as an efficient dielectric in a simultaneously manufactured capacitor. The NPN-transistor can be provided with a thin side string made of nitride for isolation between an emitter connection and a base connection. In the same semiconductor plate special, deep and shallow substrate connecting terminals can be provided for electrically isolating component areas. Trenches can be used for electrical isolation of component areas and they can at their sidewalls have a laminate of at the bottom oxide and thereon nitride in order to facilitate planarizing etching and in order to act as a diffusion barrier.

14 Claims, 50 Drawing Sheets

U.S. PATENT DOCUMENTS

| | | | |
|---|---|---|---|
| 4,323,986 A | * 4/1982 | Malaviva | 257/640 |
| 4,622,735 A | 11/1986 | Shibata | |
| 4,740,484 A | 4/1988 | Norström et al. | |
| 4,745,081 A | 5/1988 | Beyer et al. | |
| 4,789,885 A | 12/1988 | Brighton et al. | |
| 4,810,668 A | * 3/1989 | Ito | 257/640 |
| 4,819,054 A | * 4/1989 | Kawaji et al. | 257/640 |
| 4,958,213 A | 9/1990 | Eklund et al. | |
| 5,037,768 A | 8/1991 | Cosentino | |
| 5,256,586 A | 10/1993 | Choi et al. | |
| 5,302,538 A | 4/1994 | Ishikawa et al. | |
| 5,374,845 A | 12/1994 | Havemann | |
| 5,485,034 A | * 1/1996 | Maeda et al. | 257/592 |
| 5,541,124 A | 7/1996 | Miwa et al. | |
| 5,606,197 A | 2/1997 | Johansson et al. | |
| 5,789,285 A | * 8/1998 | Yoshihara | 430/202 |
| 5,869,380 A | * 2/1999 | Chang | 438/309 |

FOREIGN PATENT DOCUMENTS

| | | |
|---|---|---|
| EP | 0 303 435 | 2/1989 |
| EP | 0 375 323 | 6/1990 |
| EP | 0 767 499 | 4/1997 |
| GB | 2 291 257 | 1/1996 |
| JP | 07029850 | 1/1995 |
| JP | 07245313 | 9/1995 |
| JP | 09027550 | 1/1997 |
| WO | 95/33348 | 12/1995 |
| WO | 97/19465 | 5/1997 |
| WO | 97/35344 | 9/1997 |
| WO | 97/45873 | 12/1997 |
| WO | 98/53489 | 11/1998 |

OTHER PUBLICATIONS

Wilson, M. C., "The application of a selective implanted collector to an advanced bipolar process", *Plessey Research,* pp 349–353, (1990).

Adams A.C. et al., "Planarization of Phosphorus–Doped Silicon Dioxide", *Bell Labratories,* vol. 128, No. 2, pp 423–429, (Feb. 1981).

Hunt, P.C. et al., "Process HE: A Highly Advanced Trench Isolated Bipolar Technology for Analogue and Digital Applications", *Plessey Research and Technology,* (1988).

Appels, J.A. et al., "Local Oxidation of Silicon and its Application in Semiconductor–Device Technology", pp 119–132, (1970).

Torre, V. et al. "Mosaic V—A Very High Performance Bipolar Technology", Motorola Inc. pp21–24, (1991).

* cited by examiner

METHODS OF MANUFACTURING BIPOLAR TRANSISTORS FOR USE AT RADIO FREQUENCIES

This application claims priority under 35 U.S.C. §§119 and/or 365 to 9702693-4 and 9704659-3 filed in Sweden on Jul. 11, 1997, and Dec. 15, 1997, respectively; the entire content of which is hereby incorporated by reference.

The present invention relates to manufacturing IC components suited for signals within the radio frequency range and manufactured using bipolar technology based on silicon (Si), in particular for simultaneously manufacturing vertical NPN-transistors, capacitors and lateral PNP-transistors on a silicon substrate and for producing deep substrate contacts.

BACKGROUND

Nowadays it is possible to produce fast bipolar circuits having a high packing density by using bipolar transistors (Bip-transistors) which are manufactured having two layers of polysilicon and thus are transistors of the so called double poly-Si-type, using self-aligning or self-aligning technology combined with electrical isolation provided by trenches surrounding the transistor, so called trench isolation. A schematic cross-sectional view of such a previously known trench isolated bipolar transistor of "double poly-Si-type", which is manufactured using self-aligning technology, is shown in FIG. 1.

In the known manufacturing process for bipolar transistors of double poly-Si-type one lets the first deposited polysilicon layer form a base connection. If the transistor is NPN-type, this poly-Si-layer is doped strongly to type P. The last deposited polysilicon layer, which is doped strongly to type N and forms an emitter electrode, is physically separated from the first deposited polysilicon layer forming the base connection by an underlying electrically isolating layer and isolating side-strings, also called "spacers". The advantage of the self-aligning method when manufacturing bipolar transistors is that both the base resistance and the capacitance between base and collector are reduced. Furthermore, the introduction of isolation provided by trenches drastically reduces the capacitance between collector and substrate. Thereby, circuit performances are considerably improved.

Hereinafter, a frequently used, known way of manufacturing a trench-isolated bipolar transistor of NPN-type will be described in detail with reference to FIGS. 2 to 6, which schematically show the production method. As a base material a monocrystalline silicon substrate 101 of type P is used having its surface located in a (100)-plane of the silicon crystal structure, see FIG. 2. The bottom diffusion 102 which is a so called "buried layer" and which can be constituted of for example an ion implanted layer of arsenic or antimony, is lithographically defined, after which an epitaxial silicon layer 103 having a thickness of about a couple of $\mu$m is applied to the plate 101. Thereafter N- and P-areas are defined on the plate 101 using lithography combined with ion implantation. The N-areas 104, which are produced by ion implantation using e.g. phosphorous, are placed directly above the bottom diffusion 102 of type N+. Other areas 105, which are located between the N-areas 104, are P-doped and are manufactured by e.g. ion implantation of boron, see FIG. 2.

Then the active areas are defined by means of conventional LOCOS-methods ("LOCal Oxidation of Silicon"), see J. A. Appel et al., "Local oxidation of silicon and its application in semiconductor technology", Philips Research Report, Vol. 25, 1970, pp. 118–132. Then first an isolating mask 106 of a suitable material is applied, see FIG. 3, which is then lithographically patterned. After that silicon 107 is thermally grown in the apertures in the mask 106, so that a base area 108 and a collector area 109 for the transistor to be produced remain and are formed within the areas, where the mask covers the surface. After thus having defined the active areas, separated by an oxide layer area 109', and having removed the mask layer 106, isolating trenches 110 are lithographically defined, the windows in the trench etching mask, not shown, being placed at the boundary line between the N-type epitaxial areas 104 and the P-type epitaxial areas, whereafter the thermally grown silicon oxide material 107 and the substrate material 101 are etched away in said windows using isotropic dry etching, until the trenches 110 have acquired a desired depth, about 5 to 10 $\mu$m, and extend down into the non-affected P-substrate 101.

The walls of the trenches 110 are then thermally oxidized, so that a thin, electrically isolating layer, not shown, is obtained, after which the trenches are filled with an isolating or semi-isolating material 111, for example silicon oxide or polycrystalline silicon, also called poly-Si or polysilicon. The filling material is then etched away by dry etching until a flat surface is obtained. Then the surface of the plate is oxidized and in particular the silicon material in the openings of the trenches 110 is oxidized in the case where the trenches have been filled polysilicon, in order to obtain an isolating layer, not shown, at the surface of the openings. If the trenches 110 are already, from the start, filled with only oxide, no such extra oxidizing step is required. The result is shown in FIG. 3. It can be observed that the extension of the base area 108 in FIG. 3 is defined using LOCOS-methods according to the discussion above. The drawback of this method will be discussed later, among other things in conjunction with a description of a modified process for manufacturing a transistor.

After forming the trenches 110 a collector plug 112 is lithographically defined, see FIG. 4, i.e. a low resistance connection between the surface of the component plate and the bottom diffusion 102, within the collector area 109. After that a dopant is applied, usually phosphorous, by ion implanting in the lithographically defined openings.

The description of the continued manufacturing process will be made for the above mentioned NPN-transistor of double poly-Si-type having a self-aligned base-emitter junction, since this component type is usually combined with electrical isolation obtained by trenches.

After the definition of active areas 108, 109, see FIG. 2, and forming a collector plug 112 as described above, a thin layer 113 of polysilicon is deposited having a thickness of some hundreds of nm, see FIG. 4. The polysilicon layer 113 is then doped to become type P+ by ion implanting boron, after which a thin silicon oxide layer 114 is deposited on top of the polysilicon layer by means of CVD ("Chemical Vapour Deposition"). This polysilicon layer of type P+ doped with boron will after the finished manufacture form a so called extrinsic base 113' or base connection or base terminal by the diffusion of dopant into the surface layer of the N-epitaxial area 104 directly under the polysilicon layer 113. The oxide layer 114 produced by CVD and the polysilicon layer 113 located thereunder are lithographically patterned in order to define an emitter opening 115 located within the base area 108. Thereafter those portions of these two layers are removed, which are not covered by the lithographic mask, not shown, by a dry etching method such as plasma etching. After patterning the emitter opening 115 a thin thermal oxide 116 is grown for protecting the surface in the emitter opening, whereafter a so called intrinsic base, indicated by the crosses 117, is produced by ion implanting boron. The intrinsic base 117 is thus located precisely in and beneath the emitter opening 115.

In order to separate the emitter to be produced from the extrinsic base "spacers" or side strings 118 are formed along the sides of the emitter opening 115, see FIG. 5. This is made by first depositing an oxide layer by CVD conformally over the plate, after which an anisotropic dry etching procedure is used to etch away this oxide layer on the flat surface portions of the plate. Thereby a side string or spacer 118 of CVD oxide is formed along those steps which are formed when making the patterning for producing the emitter opening 115. After forming such spacers 118 a thin polysilicon layer 119 is deposited having a thickness of some hundreds of nm on the surface of the plate. This layer is implanted with arsenic in order to become type N+ and will after annealing form the emitter electrode 120 of the transistor. After patterning and etching the N+ polysilicon layer 119 in order to produce the emitter electrode the structure obtains the configuration shown in FIG. 5. Usually, one lets areas of this upper polysilicon layer 119 doped to N+, which thus forms the emitter electrode, also remain on top of the collector area 109, see also FIG. 3, and the collector plug 112, where it serves as a collector terminal 121.

The circuit is then passivated by a layer 122 of for example silicon oxide, see FIG. 6, in which contact holes 123, 124, 125 to the base, emitter and collector of the transistor are lithographically defined. After etching the contact holes the circuit is coated with a metal layer 126 by sputtering for example aluminum, which penetrates into the contact holes 123, 124, 125 and will form electrical contacts for connection to the exterior. The conductor layer 126 is then defined by lithography and etching in order to produce exterior terminals 127, 128, 129 and the final result appears from FIG. 6, compare also FIG. 1. FIG. 1 is a better picture of the final component, even if also there the thicknesses of the layers in certain cases are exaggerated.

As appears from the description above, the base area 108 is defined by means of the LOCOS-methods, see FIG. 3. Then preferably a two layer structure is used consisting of silicon dioxide, which is located directly on top of monocrystalline silicon, and silicon nitride as a local oxidation mask when thermally growing the so called field oxide 107. When making the field oxidation some lateral diffusion of oxygen will occur along the boundary layer between monocrystalline silicon and silicon oxide, and then some growth of oxide also occurs under the margin of the nitride layer, see 130 in FIG. 3. This oxide 130 is popularly called a "birds-beak". Thereby the extension of the base area will be only to some extent defined by the lithographically defined nitride-oxide-mask structure. One can say that the accuracy of the area is defined by the remaining "birds-beak" after finished manufacture. In order to compensate for lacking accuracy and process variations when producing these "birds-beaks" the base area 108 is made unnecessary large. Thereby, an unnecessary large capacitance between the base and the collector is obtained.

Furthermore, when producing the field oxide 107 in the N-area 104 a concentration 131 of dopant, a so called "dopant pile up", will occur in the boundary layer between the field oxide 107 and the surface of the monocrystalline silicon substrate 101, see FIG. 3. When then the polysilicon layer 113 of type P+, which forms the extrinsic base, is made to come in contact with the base area 108 outside the side strings 118, it results in an increased capacitance between the base and the collector in the finished NPN-transistor, see FIGS. 3 and 4.

A basic type of vertical transistor is e.g. disclosed in U.S. Pat. No. 3,246,214 for F. B. Hugle. Vertical transistors using field oxide for defining active regions are disclosed in the published European Patent Application 0 375 323 for Texas Instruments (Brighton et al.) and the published Japanese Patent Application 95-245313 (Application No. 94-32764).

When manufacturing a transistor to be a part of electronic circuits on a semiconductor chip, there may also be a need for other components, e.g. passive components such as capacitors, inductors and resistors, to be included in the circuits. When manufacturing such a complicated device as a high frequency transistor of the general type described above many processing steps are required and then it may be advantageous if some of the processing steps can be employed to produce such other devices, and it will be in particular be advantageous if no extra processing steps at all are required, i.e. generally if some kind or kinds of passive components can be integrated in the same process flow requiring as few extra additional processing steps as possible. In the published Japanese Patent Application 90-27550 (Application No. 71-75779) is disclosed how a capacitor and a vertical transistor are simultaneously manufactured at the surface of a substrate. However, the capacitor can have a considerable series resistance resulting in losses owing to the resistance of the electrical connection to a bottom capacitor electrode located under the dielectric layer.

The production of the electrically isolating side-strings, also called "spacers", mentioned above, serving to electrically isolate the active region from connection structures made of a layer of highly doped silicon such as polysilicon are for example described in the published European Patent Application 0 303 435 for Sony Corp. (Hiroyoki Miwa), U.S. Pat. No. 5,037,768 for Cosentino and U.S. Pat. No. 5,541,124 for Hiroyoki Miwa et al. The spacers have, using the conventional manufacturing methods using anisotropic etching in a single step, some width in the horizontal direction along the surface of the transistor to be produced which can be unnecessary large and perhaps also somewhat badly defined. If possible, this isolating structure should thus be replaced by some structure made of a better defined, thinner isolating layer.

Polysilicon conductors in transistors arranged for electrically connection to active layers are disclosed in U.S. Pat. No. 5,037,768 for Cosentino et al. (vertical transistor) and U.S. Pat. No. 5,302,538 for Ishikawa et al. (field effect transistor).

Electrically isolated component areas at a surface of a substrate of an integrated circuit are disclosed in U.S. Pat. No. 4,958,213 for Eklund et al. P-wells can be used for isolating N-wells from each other, the N-wells having highly doped buried regions under them and the N-wells having buried doped regions doped to a lower level. However, the electrical isolation provided in this way can in some cases be unsatisfactory, in particular for applications involving high radio frequencies. Deep substrate connections can be used for connecting portions of a substrate which are substantially unaffected by layers of components and isolating devices to ground when the integrated circuit is used are disclosed in the published British Patent Application 2 291 257 for International Rectifier Co. (C. C. Choi et al.). However, such substrate connections can also appear to operate in an unsatisfactory way for high frequency radio applications.

SUMMARY

It is an object of the present invention to solve the problems mentioned above and thus to provide semiconductor components, in particular bipolar transistors, having higher performance, in particular a bipolar NPN-transistor having a reduced capacitance between its base and collector and a bipolar lateral PNP-transistor having a reduced capacitance between its emitter and collector.

It is another object of the invention to provide such a solution to the problems presented above, that a substrate capacitor, i.e. a passive capacitor component located at the surface of the substrate, is formed at the same time as the capacitance between the base and the collector in a bipolar NPN-transistor is reduced.

It is another object of the invention to provide a substrate capacitor which can be formed at the same time as a bipolar NPN-transistor is produced and which has low losses and occupies a small surface area.

It is another object of the invention to provide shallow and deep substrate contacts for electrically isolating component areas at the surface of a substrate.

It is another object of the invention to provide a transistor structure having field oxide regions which are left intact and not unnecessarily eroded in the dry etching step.

It is another object of the invention to provide a transistor structure having electrically connecting silicide only at desired places.

It is another object of the invention to provide an integrated circuit including components such as transistors, which has component areas which are efficiently electrically isolated from each other, in particular in lateral directions along the surface of the integrated circuit.

It is another object of the invention to provide an efficient substrate connection for an integrated circuit including components such as transistor.

It is another object of the invention to provide a transistor, generally a bipolar device, isolated by a trench or trenches, in which the trench or trenches can be produced in an efficient way.

In order to produce an NPN-transistor thus a laminated layer of silicon oxide and silicon nitride is introduced which is located on top of the active area (collector area) of the NPN-transistor. The laminate is lithographically patterned, so that the base area of the transistor is defined by an opening in the laminated layer. At the same time a lateral PNP-transistor can be produced using lithographically defined openings in order to produce the emitter and collector of this transistor.

It will thereby also be possible to form a substrate capacitor, which uses the silicon nitride layer as a dielectric, without any extra mask step, at the same time as the capacitance between the base and collector of the bipolar NPN-transistor is reduced.

A semiconductor component, which can be a bipolar transistor of type NPN, has an active area at the surface of the component, which is surrounded, as seen along the surface of the component, in the conventional way by thick field oxide areas. The active area is partly covered by an electrically isolating surface layer, preferably including a nitride layer. A base area in the active area is determined by a well defined opening lithographically produced in the electrically isolating surface layer. In the case where the semiconductor component, which in this case can be a bipolar transistor of PNP-type, instead has emitter and collector areas, which at the surface of the component are surrounded, as seen along the surface of the component, by such thick field oxide areas, an emitter area and/or a collector area can in the corresponding way be determined by a lithographically defined opening in an electrically isolating surface layer. By the lithographic definition in these two cases the electrically isolating surface layer will extend over and beyond surrounding field oxide areas, so that a strip of the electrically isolating surface layer exists between the base area and between the emitter or collector area, respectively, and the field oxide areas located closest to this area.

The electrically isolating surface layer includes advantageously a laminate of silicon nitride at the top and thereunder silicon oxide. The silicon nitride layer is advantageously used as an efficient dielectric in a simultaneously produced capacitor resulting in small area occupied by the capacitor. This capacitor will then be located at the surface of the substrate and comprises a dielectric layer covering a portion of the surface of a doped or low-doped region of the substrate doped to a first doping level. An electrically conducting layer is arranged over the dielectric layer and forms a capacitor electrode. An electrically conducting connection extends to a region under the dielectric layer from a surface of a portion of the substrate which is not covered by the dielectric layer. Furthermore, the dielectric layer is arranged over a buried, highly doped region doped to a second doping level significantly higher than the first doping level. A contact plug having a high doping doped to a third doping level, the third doping level being significantly higher than the first doping level, extends from a portion of the surface of the substrate, which is not covered by the dielectric layer, down the buried region. Such a connection of the bottom capacitor electrode formed by the material directly under the dielectric layer will have a low series resistance and the capacitor will have small losses.

An electrode plug having a high doping doped to substantially the third doping level for forming a bottom electrode of the capacitor can extend from the under side of the dielectric layer down to the buried region. For such an electrode plug, the first doping level can be very small and even substantially correspond to a substantially intrinsic semiconducting material. Using such an electrode, which is produced at the same time as the connection to the buried layer from the surface, will still more reduce the losses of the capacitor.

In the bipolar, a side-string structure is used at an active area, at which area electrically conducting silicon material is arranged in contact with a border region at the active area. By means of a process comprising materials having different etching characteristics an electrically isolating layer conformally arranged substantially only on vertical surface portions of the electrically conducting silicon portions can be obtained. The electrically isolating layer then has everywhere substantially the same or a uniform thickness. An electrically isolating oxide layer different from the electrically isolating layer is then preferably arranged at substantially the whole surface of the electrically conducting silicon material and under the electrically isolating layer, which advantageously is a silicon nitride layer.

When making such a side-string structure, which can generally be said to be a process of producing a free area at a surface of a substrate, the free area being defined by edges of an electrically isolating layer, the following steps can be executed:

Applying a material layer to the surface over and above a first area having edges, which first area is intended to form the free area. The material layer can be a layer of electrically conducting material, e.g. doped silicon such as highly doped polysilicon serving as a base connection. This conducting layer is then at least at portions close to the first area in electrical contact with the surface of the substrate;

Applying conformally a first silicon oxide layer over the material layer;

Making an opening through the first oxide layer and through the material layer down to the surface of the substrate. The opening is made somewhat larger or a little larger than the first area and has substantially vertical edges defining it, so that the substantially vertical edges of the opening have a substantially constant distance to the edges of the first area;

Applying conformally an electrically isolating layer over all of the surface. This electrically isolating layer must be different from the first oxide layer or being another type than the first oxide layer. It can preferably be a silicon nitride layer;

Applying conformally a second oxide layer having etching characteristics different from etching characteristics of the first oxide layer over all of the electrically isolating layer;

Making a first anisotropic etching for removing the second oxide layer only at substantially all flat, horizontal surfaces. Then the electrically isolating layer will be is exposed on substantially all of the flat, horizontal surfaces and "disposable" side-strings of the general triangular shape and made up of the second oxide layer will then remain on vertical surfaces;

Making a second etching for removing the electrically isolating layer only at surfaces which are not covered by the second oxide layer, the electrically isolating layer then being removed substantially only on flat, horizontal surfaces;

Making a third etching, using the fact that the second oxide layer has etching characteristics different from the etching characteristics of the first oxide layer, for removing only remaining portions of the second oxide layer without substantially attacking free surface portions of the first oxide layer, whereby portions of the electrically isolating layer remain substantially only on vertical edge surfaces of the material layer and the first oxide layer surrounding the first area.

The side-string structure as described above and produced by this method may be advantageous since the opening in the material layer, typically a highly doped polysilicon layer, will be only very little narrowed since the electrically isolating layer can be made very thin.

The process can also be said to comprise first conformally applying a first electrically isolating layer over the surface of the substrate and then conformally applying a second electrically isolating layer over the first electrically isolating layer. The materials of the first electrically isolating layer and the second electrically isolating layer must be selected to have etching characteristics which are different from each other. Finally selective etchings are made for first removing the second electrically isolating layer and the first electrically isolating layer everywhere except on substantially vertical surface portions and for then removing the first electrically isolating layer also on the substantially vertical surface portions. The first etching can preferably be made in two steps comprising first a first substep, in which only the second electrically isolating layer is removed only on horizontal surface portions and then a second substep, in which the first electrically isolating layer is removed only on horizontal surface portions.

In a process for among other purposes avoiding unnecessary silicidizing a transistor is thus generally produced at the surface of a substrate. An electrically conducting silicon layer such as a doped polysilicon layer is produced on top of the surface for electrical contact with doped regions in the surface and then an electrically isolating layer of preferably silicon oxide is applied directly on top of the electrically conducting silicon layer. Thereafter an additional electrically conducting layer, also usually of electrically conducting silicon such is a polysilicon, is applied directly on top of the electrically isolating layer. Finally the electrically isolating layer is removed within regions, which are not covered by the additional electrically conducting layer, in order that an electrical contact will be attained therewith from later applied electrically conducting metal layers. When removing the electrically isolating layer, it is removed only within selected regions and then at least one selected region is smaller than a region not covered by the additional electrically conducting layer.

When removing only the selected regions of the electrically isolating region, a mask can be used, in which openings are lithographically made to produce remaining portions of the mask. The remaining portions of the mask are arranged to cover selected first regions of formerly applied electrically isolating layers and also second regions, at which a silicidation is to be avoided in a later applying of electrically conducting metal layers. Then the first regions and the second regions, after removing the electrically isolating layer only within the selected regions, are still covered by the additional electrically isolating layer.

This procedure involving a patterning before removing the electrically isolating layer will protect earlier produced electrically isolating layers such as regions of field oxide. Also, the electrically isolating layer can be left on surface portions where a silicide is not desired.

In an integrated circuit of the general kind considered herein which comprises components at the surface of a substrate, an efficient electrical isolation between the components can be achieved by using P-wells and N-wells. Generally then, each component is produced substantially as built on a first region doped to a first doping type, preferably an N-well, and is located in the surface layer of the substrate. A first buried region is located directly under the first region and is highly doped to the first doping type. The integrated circuit further comprises second regions, such as P-wells, doped to a second doping type opposite the first doping type and arranged between the components in the surface layer of the substrate. Second buried regions are located directly under the second regions and have a moderate doping of the second doping type. They form electrical connections of the second regions to the substrate, the second regions electrically isolating the first regions and thereby the components from each other. In order to enhance the isolation an electrically well conducting layer is arranged on top of the second regions in the surface layer of the substrate and it is intended to be connected to electrical ground when using the integrated circuit. Enhanced doped regions may be located directly under the electrically well conducting layer in the second regions, the enhanced doped regions containing dopants which have diffused, during a suitable annealing process, out of the electrically well conducting layer for reducing the electrical resistance between the electrically well conducting layer and the second regions. Also, separate substrate connections may be arranged, preferably in the second regions. Such connections comprise a deep hole extend from the surface and end in the substrate under the second buried region which is located directly under the second region. The hole is filled with electrically conducting material such as a metal.

The contact of the electrically well conducting material in the deep substrate connections can be improved by making, before filling with electrically conducting material, a doping only at the bottom of the deep hole in order to reduce the resistance between the electrically conducting material and the substrate. The doping can be produced by implantation and annealing a dopant such as boron. After the doping at least one thin layer containing titanium be applied to walls and the bottom of the deep hole in order to increase the electrical contact.

Trenches can be used for isolating the components and can be produced in the conventional way by etching. Thereafter a laminated layer is applied to the walls of the trenches, the layer comprising at the bottom thermally grown silicon dioxide and thereon a thin silicon nitride layer, applied by deposition. Finally the remaining main portions of the trenches are filled by applying an electrically isolating or semi-isolating layer, such as a silicon oxide layer or a layer of undoped silicon, for example microcrystalline silicon, over the surface of the plate, for example by a suitable kind of deposition. The silicon nitride layer then acts as an etch stop in a subsequent planarizing etching for planarizing the layer, with which the main portions of the trenches are filled. Furthermore, if the material, which is used when filling the trenches, would have impurities, the silicon nitride layer prevents them from diffusing into the substrate material. Such a diffusion could reduce the electrically isolating function of the trenches.

Additional objects and advantages of the invention will be set forth in the description which follows, and in part will be obvious from the description, or may be learned by practice of the invention. The objects and advantages of the invention may be realized and obtained by means of the methods, processes, instrumentalities and combinations particularly pointed out in the appended claims.

BRIEF DESCRIPTION OF THE DRAWINGS

While the novel features of the invention are set forth with particularly in the appended claims, a complete understanding of the invention, both as to organization and content, and of the above and other features thereof may be gained from and the invention will be better appreciated from a consideration of the following detailed description of non-limiting embodiments presented hereinbelow with reference to the accompanying drawings, in which:

DETAILED DESCRIPTION

With reference to FIGS. 7–38 production of various electronic components having high performance will be described, which all can be produced simultaneously on the same substrate. Some of these figures, which show cross-sectional views of a substrate, are very schematic whereas other ones better show the resulting structures which are naturally best shown in the photographic pictures. It will also be observed that for some components which in the following are described as produced and constructed of materials having definite types of doping, also the corresponding component can be produced of materials having the opposite types of doping, i.e. a component made of definite P-doped first materials and definite N-doped second materials can in some cases as well be made of the corresponding N-doped first materials and the corresponding P-doped second materials.

Figure 7:
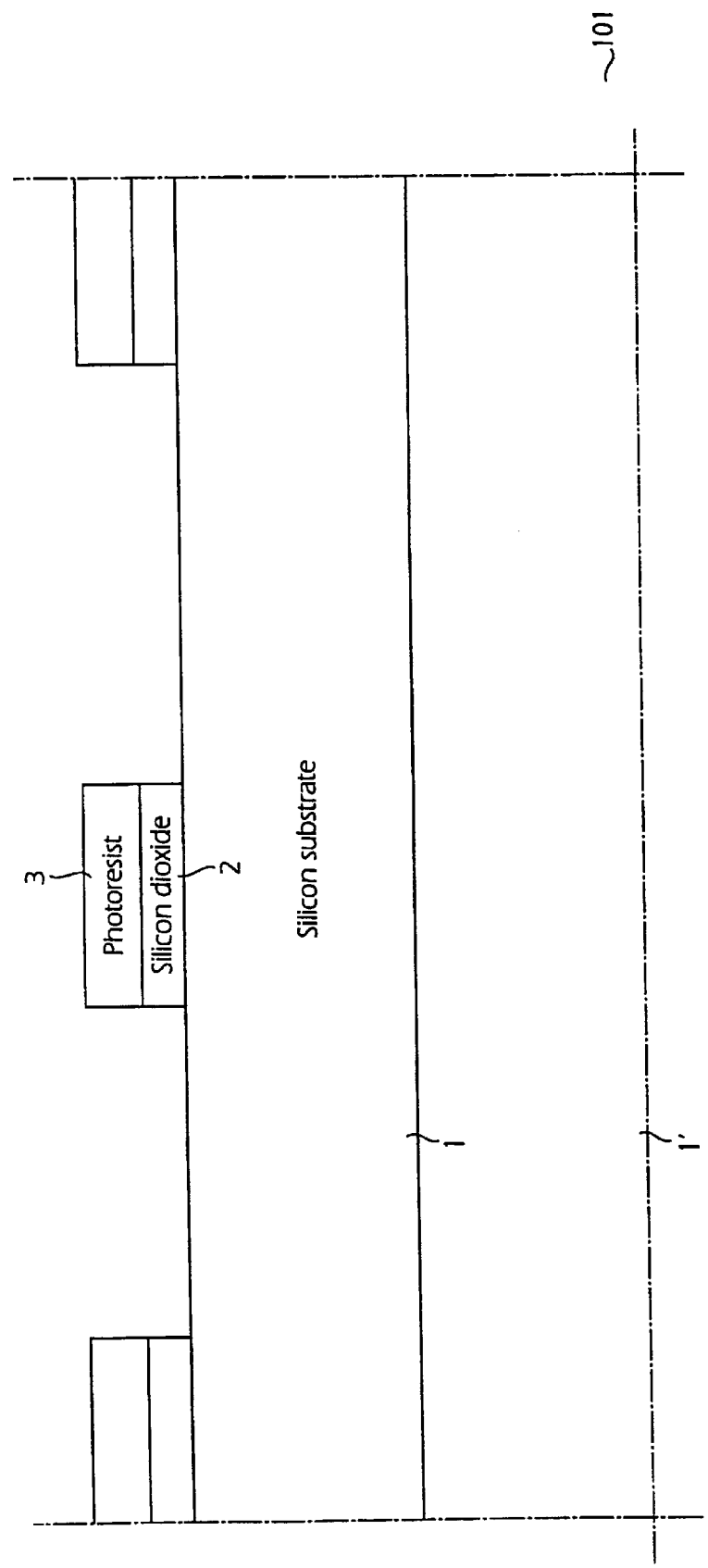
FIG. 7 is a cross-sectional view of a silicon plate and layers arranged thereupon, intended for producing primarily an NPN-transistor having good high frequency characteristics but also for producing a capacitor and a lateral PNP-transistor, the cross-sectional view showing the plate before forming bottom diffusions.

In FIG. 7 a cross-section of a silicon plate 1 of P-type, preferably doped with boron, is shown before forming a bottom diffusion or buried layer of N-type. The silicon plate 1 can either be constituted of a homogenous, very weakly doped plate of P-type, having typically a resistivity of 10–20 ohms·cm, which can be described as being of type P−, or of a so called epi-plate, in which the substrate 1' is constituted of a highly doped plate of P-type (P+) having typically a resistivity of some tenths of mohms·cm, on which an epitaxial weakly doped layer of P-type has been grown, of type P−. The grown epitaxial layer of type P− is typically 5–10 μm thick having a resistivity of 10–20 ohms·cm. A start material similar to that used in the last-mentioned case is used in the bipolar structure which is disclosed in the article of V. dela Torre et al., "MOSAIC V—A Very High Performance Technology", BCTM 1991, pp. 21–24. According to this article a highly doped substrate of type P+ is used and thereon an epitaxial intrinsic layer, i.e. a layer having no doping. At the surface of the intrinsic layer then structures are formed similar to those which will be described is hereinafter, such as bottom diffusions, etc.

A rather thick protective layer 2 of silicon dioxide is applied to the surface of the silicon plate 1 using some known method, e.g. by thermal oxidation. The thickness of the oxide layer 2 is selected to be preferably about 0.8 μm. It is lithographically patterned by applying and patterning a photoresist layer 3, after which the oxide is solved or etched away in those portions which are not protected by the photoresist layer 3, as is illustrated in FIG. 7. The removal of oxide can be performed by well known wet chemical or dry chemical methods, after which the photoresist layer 3 is removed in some known way.

Figure 8:
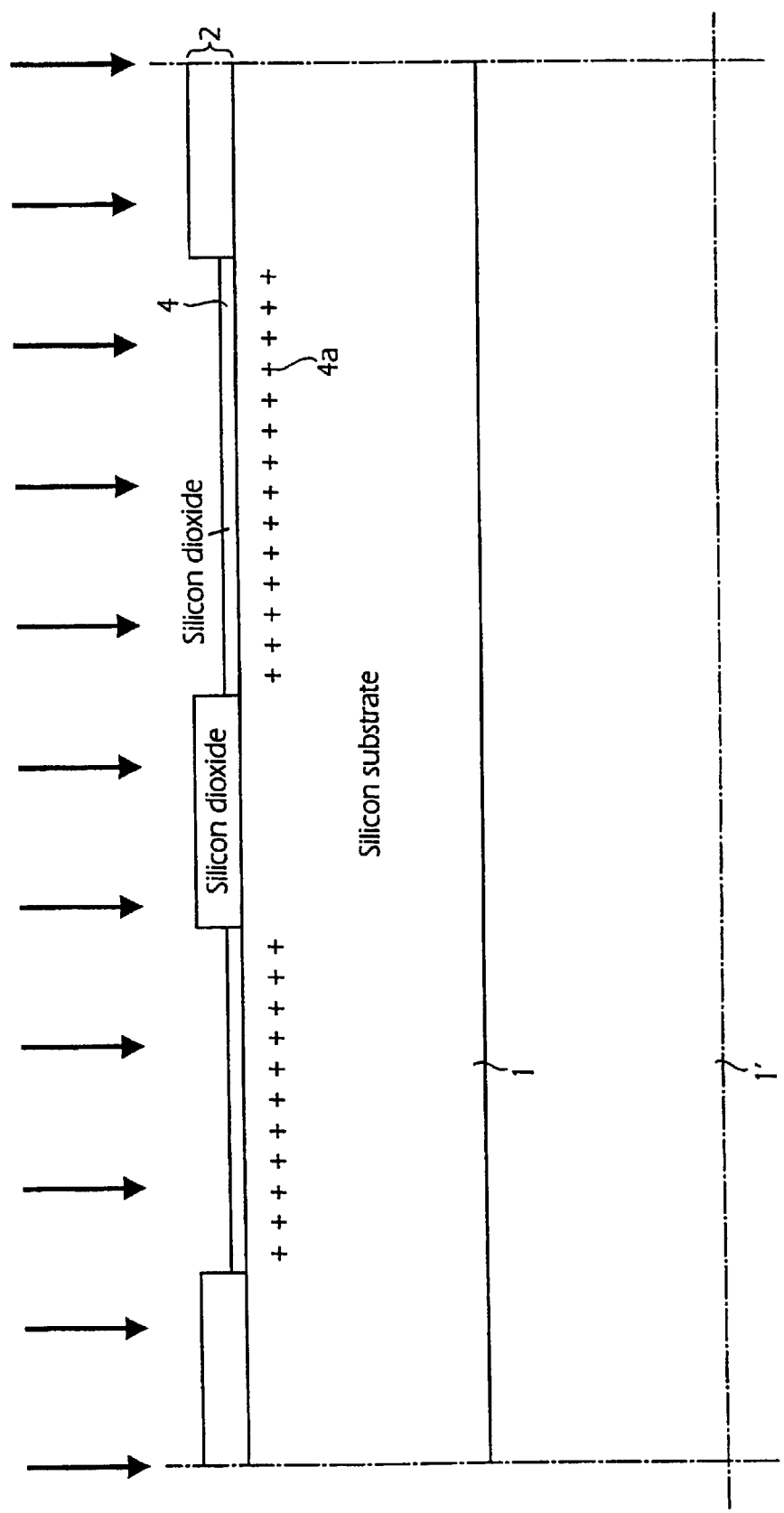
FIG. 8 is a cross-sectional view similar to FIG. 7 showing the state of the plate after forming bottom diffusions.
Figure 9:
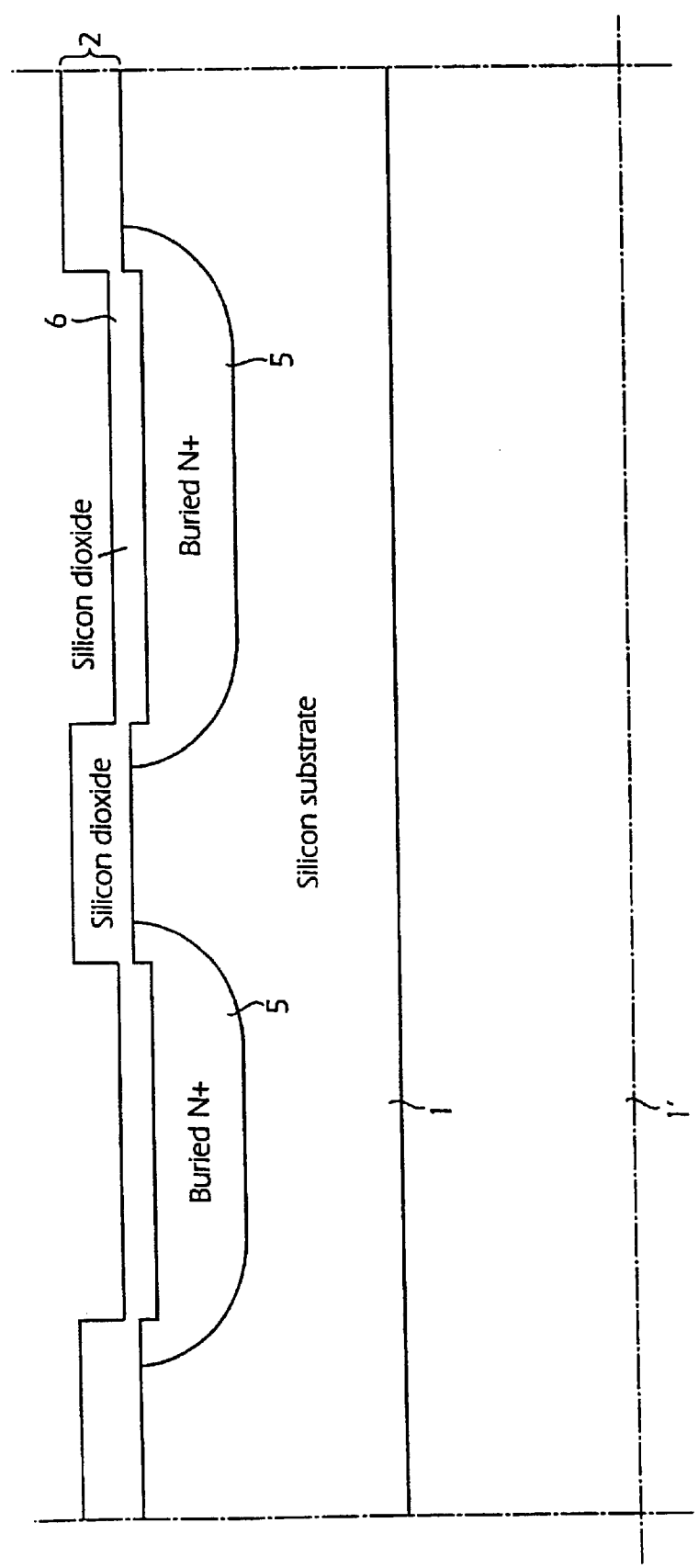
FIG. 9 is a cross-sectional view similar to FIG. 8 but after forming bottom diffusions.

A thin protective oxide layer 4, having typically a thickness of a couple of hundreds of Angstroms, is thermally grown over the surface of the plate 1, see FIG. 8, this protective layer in particular being located on the areas between the comparatively much thicker remaining portions of the previously applied silicon dioxide layer 2, whereas it owing to its little thickness is not noticeable in said portions, which in addition are the same type of material. Thereafter a bottom diffusion layer of type N+ or a so called "N+ buried layer" is produced, by first making an ion implantation, as is indicated by the arrows in FIG. 8. In this ion implantation step preferably arsenic is used, which is implanted with an energy of about 50 keV and a dose of about $3 \cdot 10^{15}$ ions/cm$^2$. The remaining portions of the thick oxide layer 2 will during the implantation serve as a mask and then the energy in the implantation must be adapted, so that only those ions, which hit the thin oxide 4, are capable of penetrating into the silicon substrate 1, as is indicated by the crosses at 4a in FIG. 8, whereas other ions are obstructed by the thick oxide layer 2. After finished implantation an anneal is performed for driving in the implanted dopant, i.e. in the preferred case the arsenic atoms, the term "driving in" as used herein having the meaning of making the implanted dopant atoms diffuse into the material, the diffusion being made by an annealing procedure, i.e. subjecting the plate to a high temperature, typically during 30 minutes at 1100° C., in order to produce the bottom diffusion layer 5, see FIG. 9. The resulting depth of the bottom diffusion areas 5 of type N+ ("an N+ buried layer") is after this "driving-in" step of making atoms diffuse about 1.5 μm. In the diffusing operation simultaneously a further oxidation of the surface of the silicon occurs, silicon atoms at the surface then being consumed, so that the thickness of the protective layer 4 of thin silicon oxide increases to about 200 nm, whereby layers 6 having a larger thickness are obtained. By the consuming of silicon atoms then also a step or a shelf is obtained in the very surface of the monocrystalline silicon substrate between those areas which are covered by the previously applied thick oxide layer 2, and those areas, which have now been made thicker and are still covered by a still significantly thinner oxide layer, which steps in the subsequent process are used as alignment marks.

Naturally also other dopants of N-type can be used in the implantation for producing the bottom diffusion layers 5, such as e.g. antimony. However, the use of antimony requires an annealing procedure made at a somewhat higher driving-in temperature, typically during some half of an hour at about 1250° C.

Figure 10:
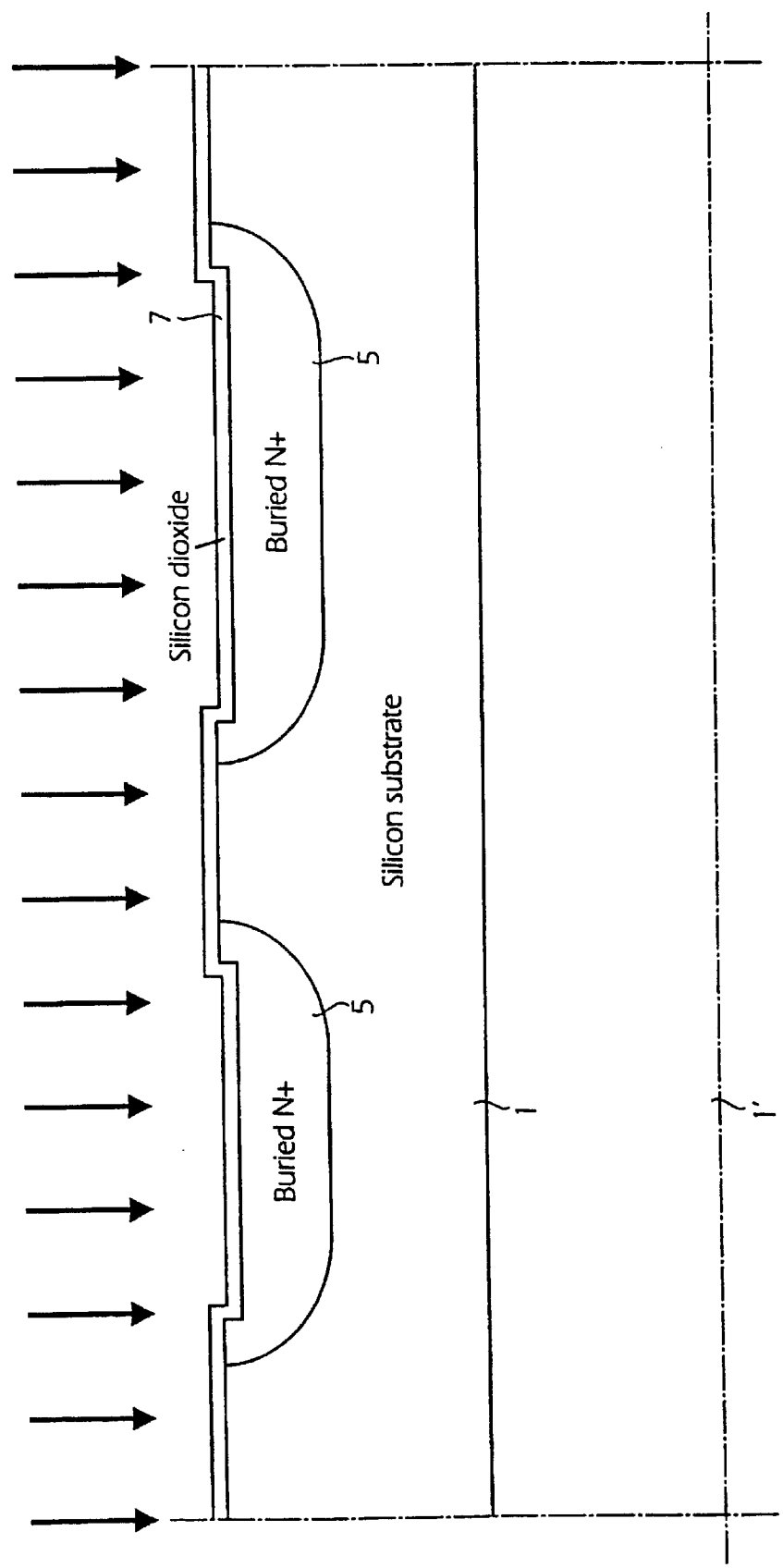
FIG. 10 is a cross-sectional view similar to FIG. 9 showing the state of the plate when producing an extra P-doping.

After the operation of diffusion annealing for producing the bottom diffusion 5 of type N+ all oxide is solved away, preferably in a wet chemical way, from the surface of the plate, the previously mentioned steps in the surface of the monocrystalline silicon plate then being visible, see FIG. 10. Thereafter a thin protective oxide layer 7 is produced, typically 30–40 nm thick, over the surface of the plate, preferably by thermal growing. An extra doping of P-type is produced in those areas which are located between the bottom diffusion areas 5 of type N+ by making over all of the surface of the plate an ion implantation of preferably boron having an energy of about 100 keV and a dose of about $4 \cdot 10^{12}$ ions/cm$^2$, as indicated by the arrows in FIG. 10. This implantation energy and this dose are adjusted, so that those boron atoms, which are then implanted in the bottom diffusion areas 5 of type N+ doped with arsenic are completely enclosed and compensated by the doping in these areas, whereby the bottom diffusion 5 continues to be of type N+ with only a relatively small or neglectable reduction of the content of donor atoms.

Figure 1:
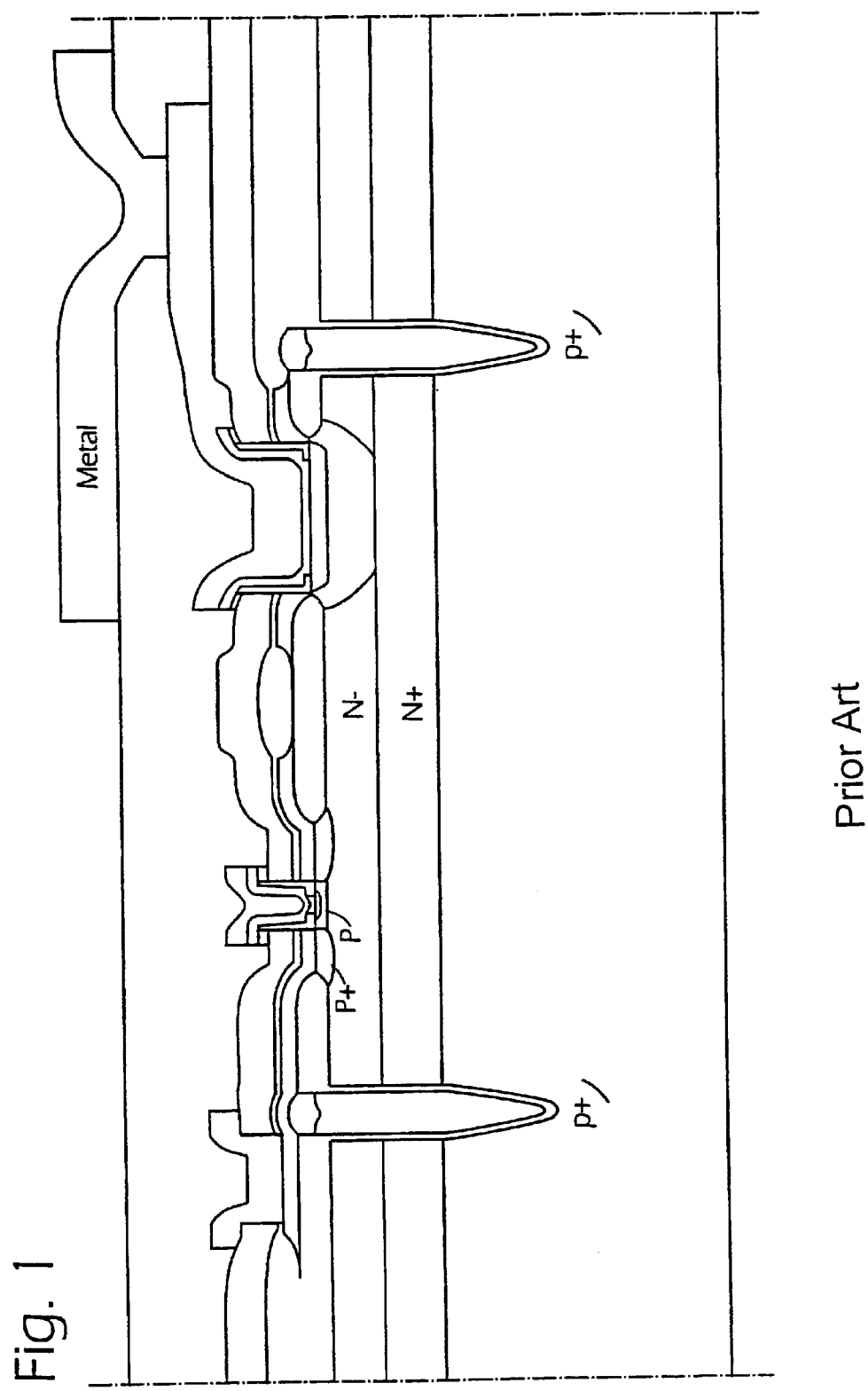
FIG. 1 is a cross-sectional view of a bipolar self-aligned double poly-Si transistor having an electric isolation provided by trenches.
Figure 2:
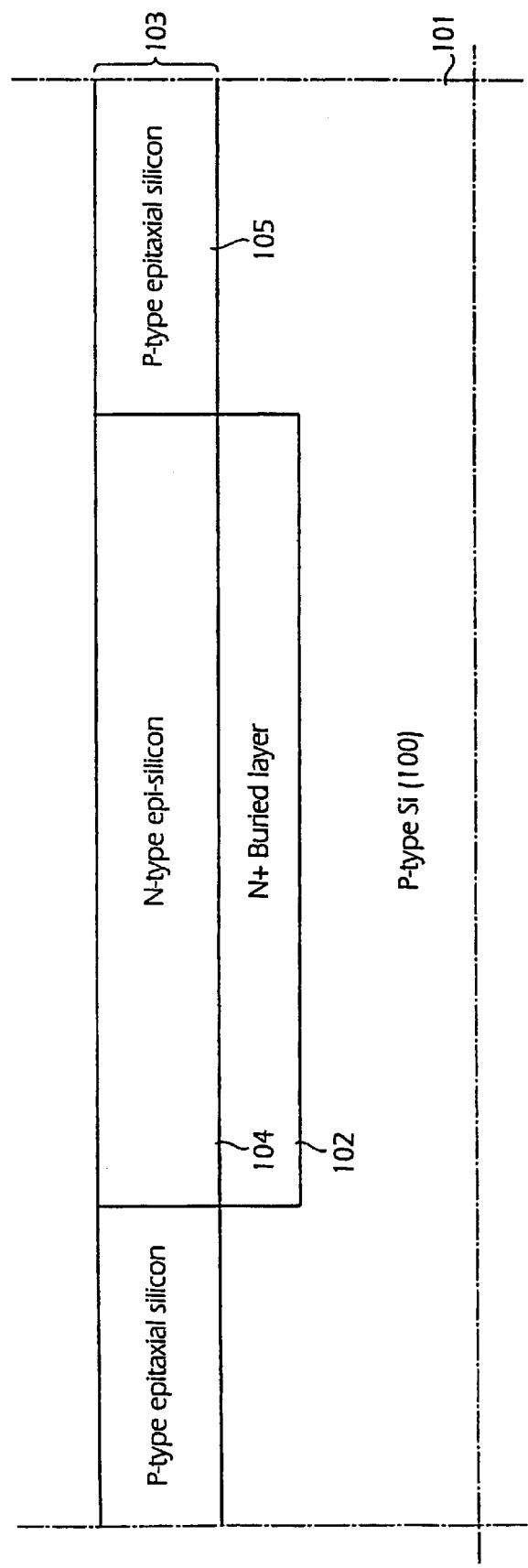
FIG. 2 is a cross-sectional view of the start material for producing the transistor shown in FIG. 1 after forming a bottom diffusion and an epitaxial surface layer.
Figure 3:
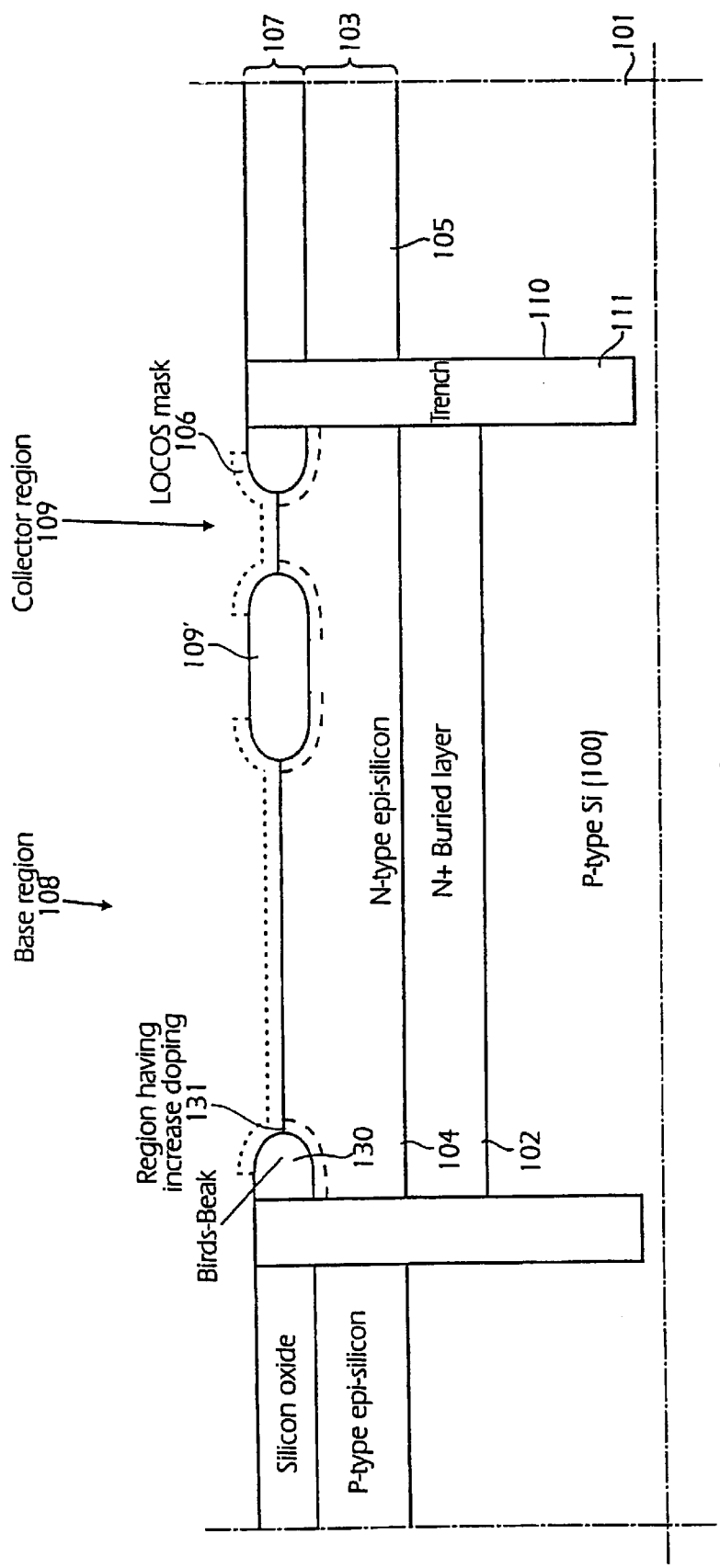
FIG. 3 is a cross-sectional view similar to FIG. 2 but after defining the active area and after isolating by trenches.
Figure 4:
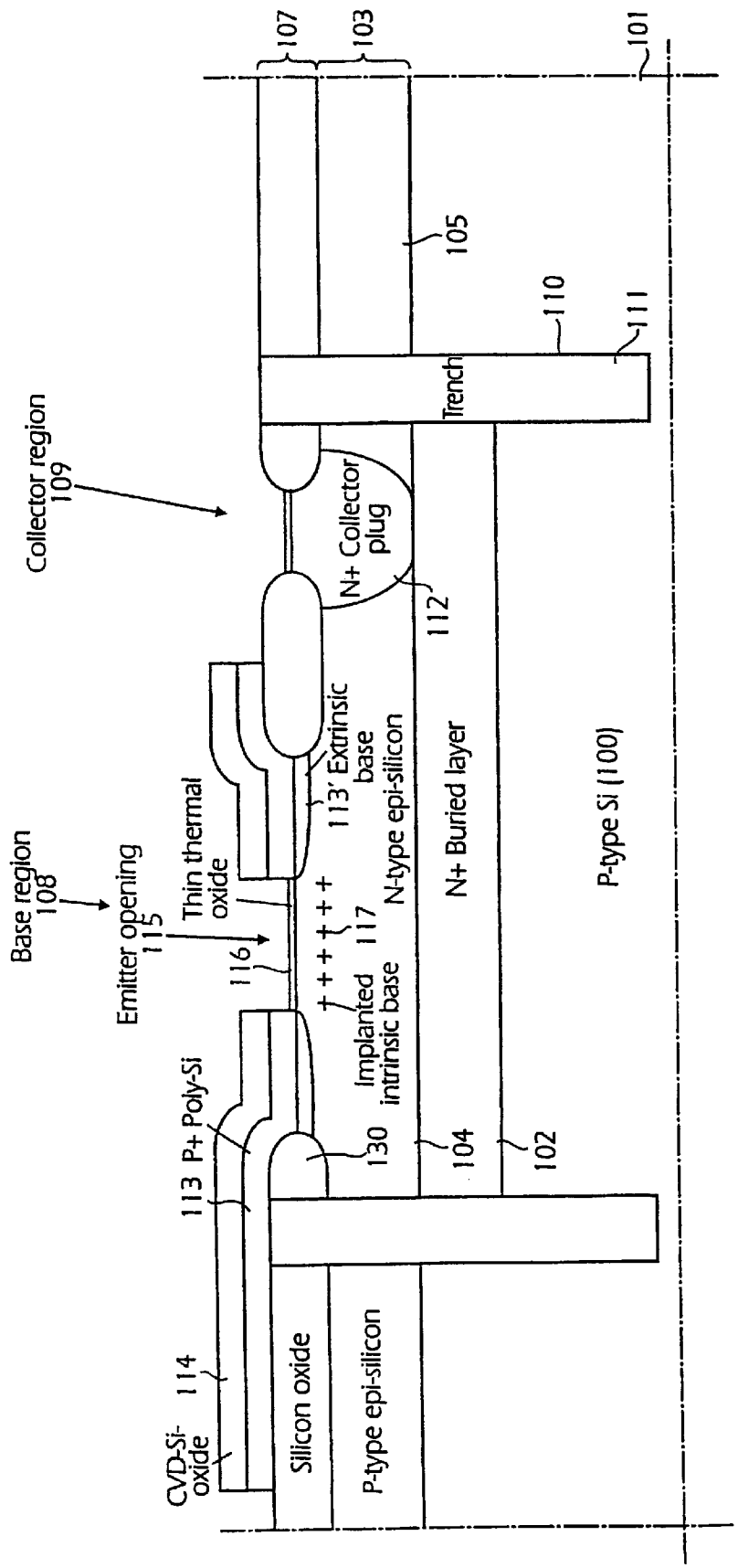
FIG. 4 is a cross-sectional view similar to FIG. 2 but after defining an emitter opening and an extrinsic base.
Figure 5:
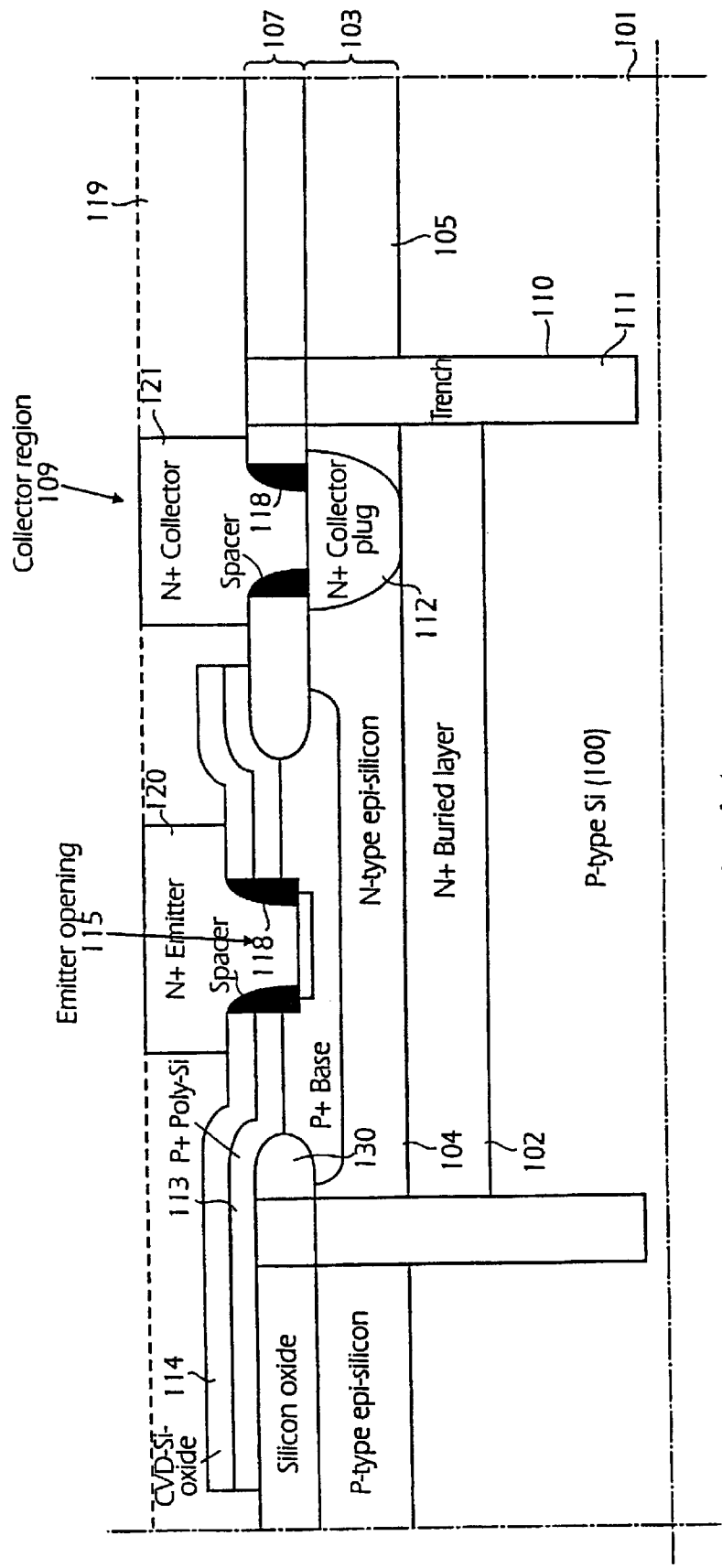
FIG. 5 is a cross-sectional view similar to FIG. 2 but after defining spacers and emitter and collector.
Figure 6:
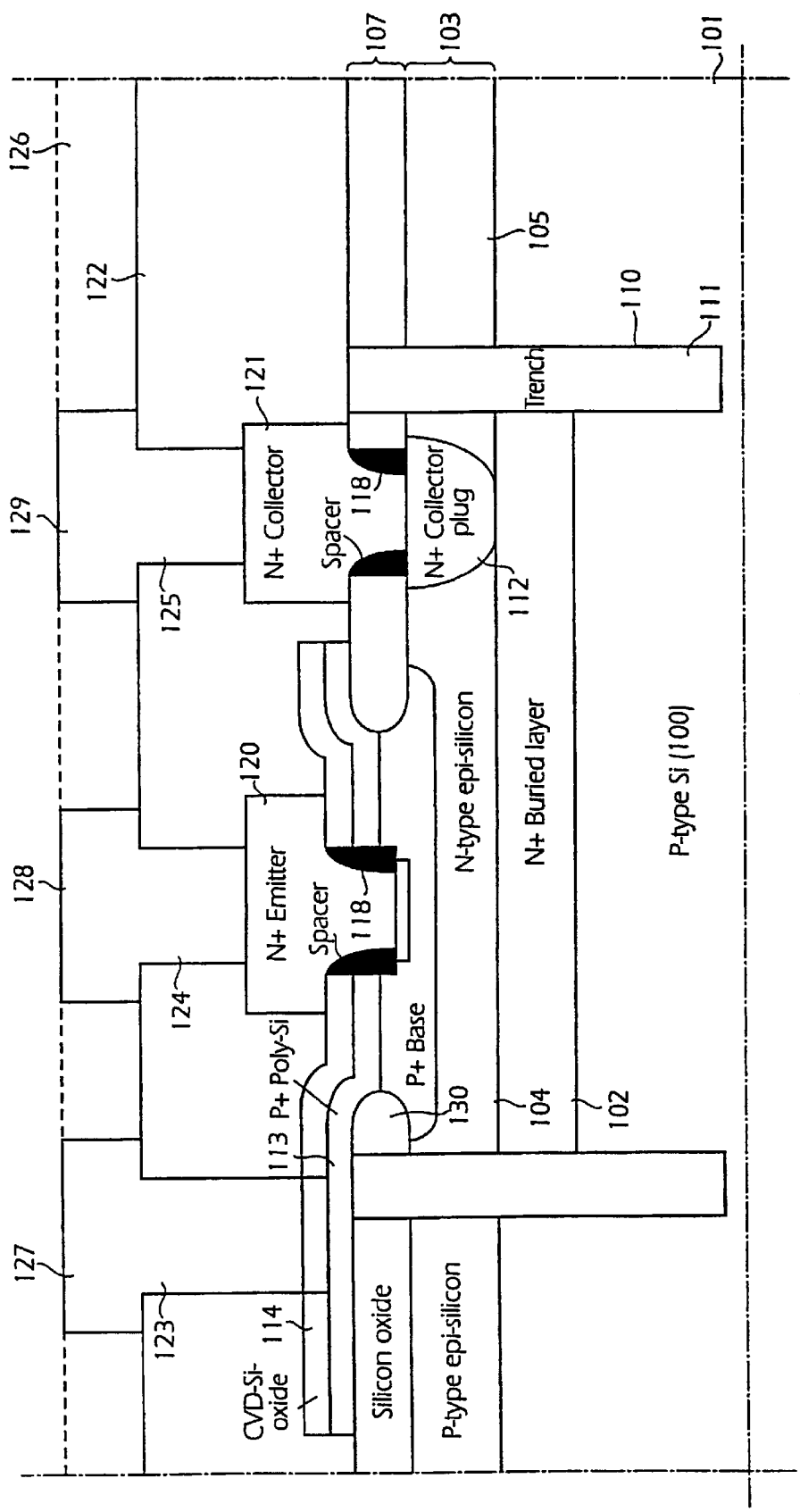
FIG. 6 is a cross-sectional view similar to FIG. 2 but after defining a first metal layer.

It is worth observing that one very well can manage without the above-mentioned implantation of boron and obtain well functioning components, by increasing the degree of doping in the start material 1 already from the beginning from being very low-doped, close to intrinsic, to instead be type P−. However, the contribution to the capacitance from the bottom diffusion regions 5 of type N+ in the final component will be higher in that case. The general method of producing bottom diffusions of type N+ and intermediate areas of some P-type is also disclosed in U.S. Pat. No. 5,374,845 for Havemann, see the description of FIGS. 2 and 3 in this patent.

Figure 11:
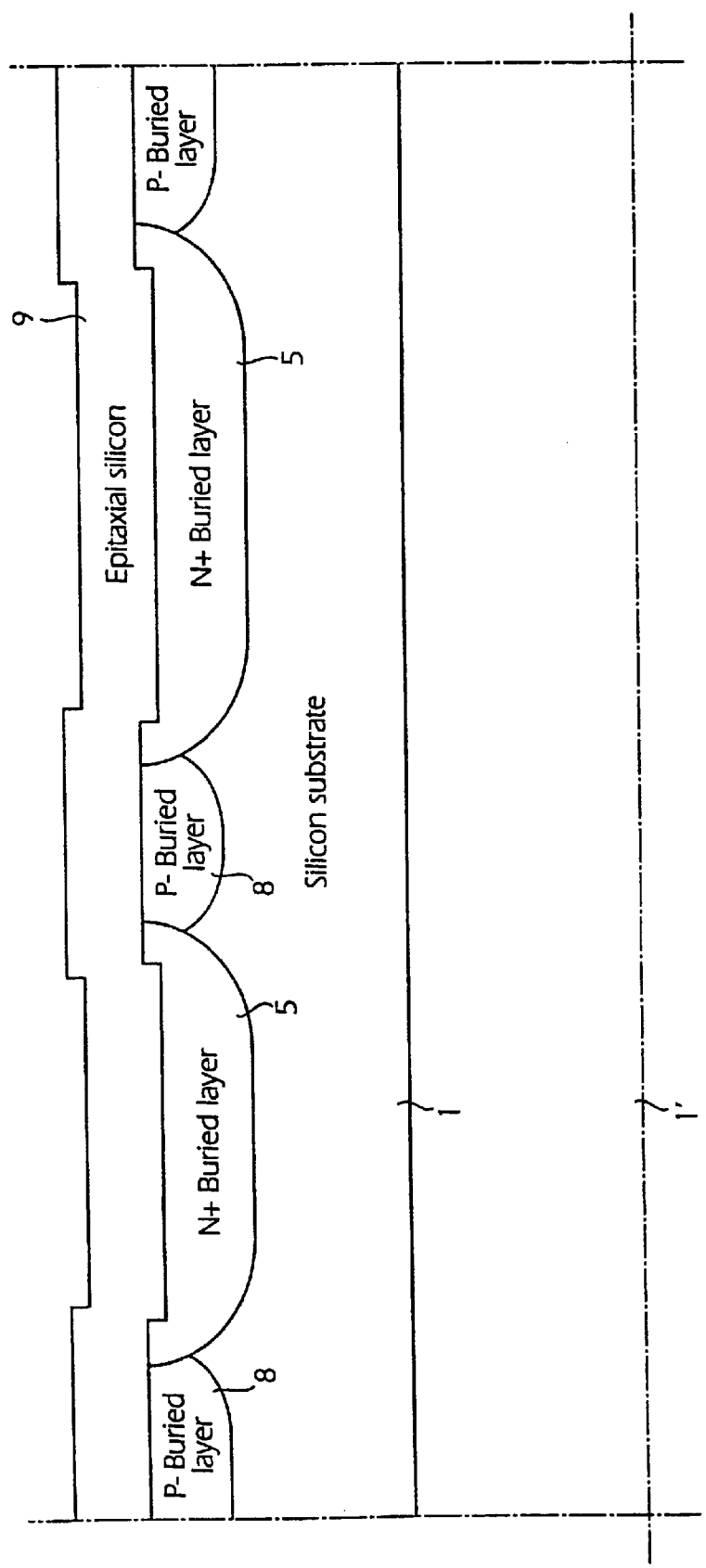
FIG. 11 is a cross-sectional view similar to FIG. 10 after depositing epitaxial silicon on the surface of the plate.

After the preferred implantation of boron as described above, when regions having a weak P-doping, i.e. of type P−, are obtained between the bottom diffusion regions 5, again all oxide is solved away, preferably in a wet chemical way, from the surface of the plate, so that steps again appear, whereupon an epitaxial silicon layer 9 is grown on the substrate surface using some known method, see FIG. 11. The epitaxial layer 9, which is about 1.2 μm thick, is preferably undoped, so called "intrinsic silicon". If desired, the layer 9 can be doped to N-type already in the epitaxial growth. The doping content is in that case typically of the magnitude of order of $1 \cdot 10^{16}$/cm$^3$. In the U.S. patent for Havemann cited above the corresponding epitaxial layer is very lightly doped having a resistivity greater than 10 ohm·cm, but is however said to be substantially intrinsic, i.e. undoped. However, a homogeneously doped epitaxial layer makes the possibility of a later connecting of the substrate from the surface, when making so called "topdown contacts", more difficult. In the epitaxial growth such temperatures are used, that the acceptor atoms in the previously implanted regions of type P− will diffuse into the substrate 1 and the simultaneously formed epitaxial layer 9, so that buried regions 8 of type P− are obtained at the connection between the substrate 1 and the epitaxial silicon layer 9 at those locations where no bottom diffusion 5 of type N+ exists, as is illustrated by FIG. 11. Also the epitaxial layer 9 has steps in its upper, exterior surface.

The epitaxial layer 9 will, as will appear from the description hereinafter, be doped selectively in order to obtain regions of N- and P-type, respectively (so called "N-wells and P-wells"). In the regions of N-type, which are placed directly above the bottom diffusion regions 5 of type N+, bipolar transistors and capacitors will be formed. In the intermediate P-regions will after finished manufacture connection paths or regions exist which serve as connections between the circuits or components formed at the surface and the substrate 1.

Figure 12:
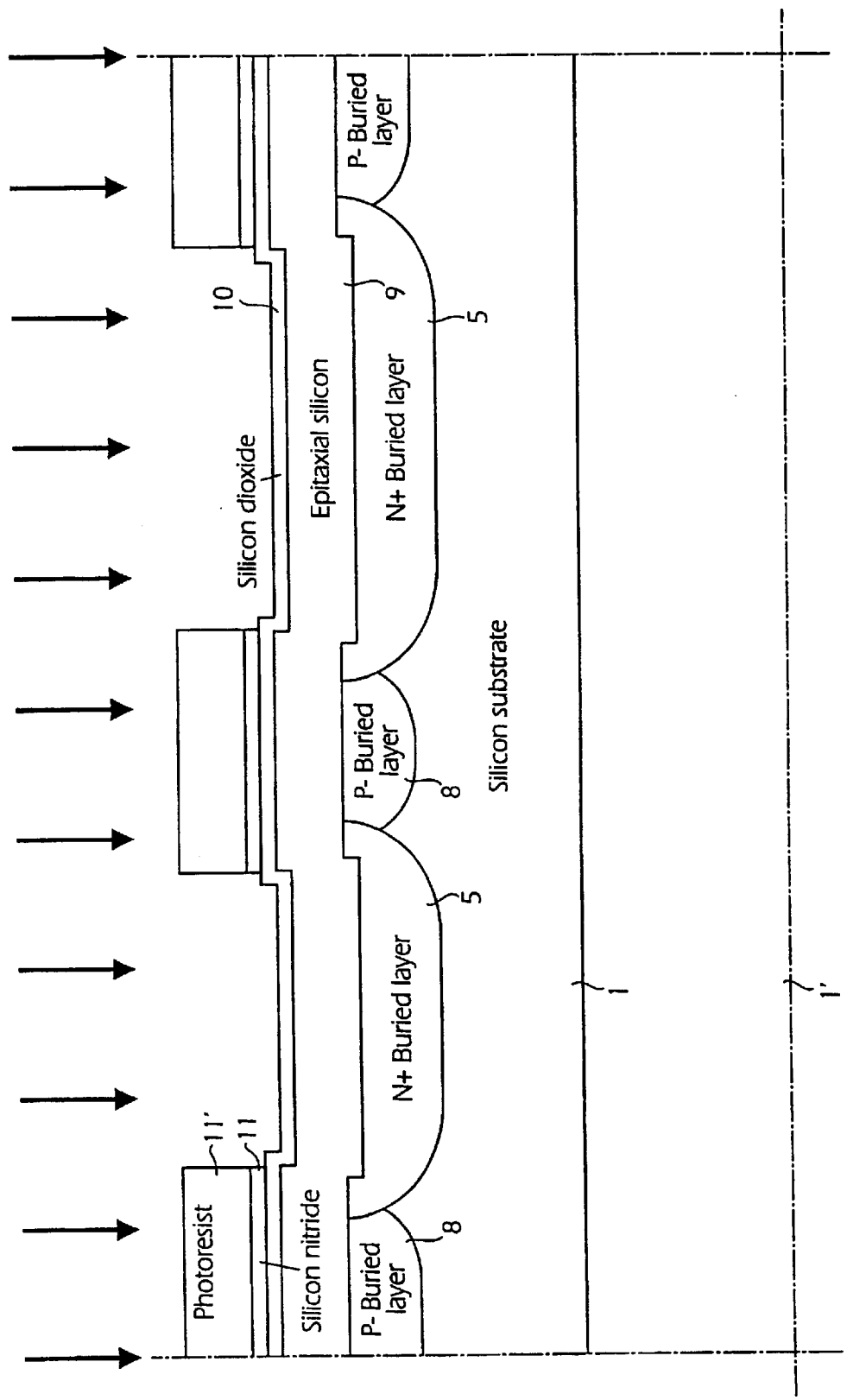
FIG. 12 is a cross-sectional view similar to FIG. 11 showing the state of the plate when selectively forming N-areas.

After growing the epitaxial silicon layer 9 a thin barrier silicon oxide layer 10 is produced, preferably by thermal oxidation, over the surface of the chip, see FIG. 12. The thickness of the oxide layer is typically about 40 nm. On top of the barrier oxide layer 10 is a thin silicon nitride layer 11, typically about 130 nm thick, deposited by means of LPCVD-methods ("Low Pressure Chemical Vapour Deposition"). This nitride layer 11 is lithographically patterned by applying a photoresist layer 11' and a patterning thereof, whereupon the nitride is etched away in those portions which are not protected by the photoresist layer 11', as is illustrated in FIG. 12, and these portions include the very component areas, in which now only the silicon dioxide layer 10 remains. The silicon nitride layer 11 is etched preferably using a suitable dry etching process, which selectively removes only the nitride and leaves the oxide layer 10 located under the nitride layer. In an ion implantation step following thereupon, which is illustrated by the arrows in FIG. 12, for producing the aforementioned regions of N-type or the N-regions 13, so called "N-wells", in the epitaxial silicon layer 9, the thin silicon oxide layer 10 located thereunder works as a protection layer for the surface of the epitaxial layer 9.

Figure 13:
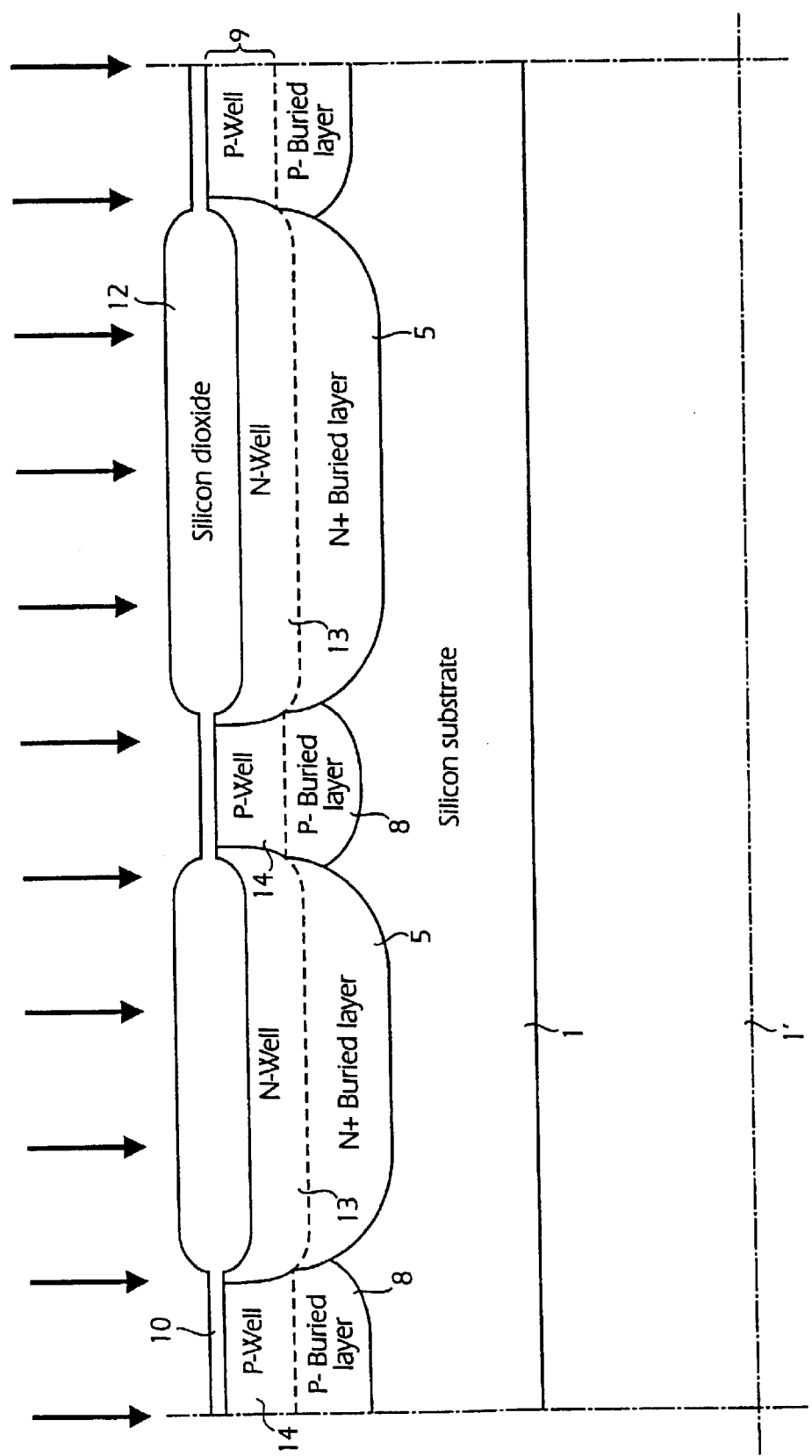
FIG. 13 is a cross-sectional view similar to FIG. 12 after selectively oxidizing N-areas and forming self-aligned P-areas.

In a preferred embodiment this ion implantation step for forming the N-regions 13, see FIG. 13, is performed by implanting preferably phosphorous at an energy of about 450 keV and a dose of about $1.5 \cdot 10^{12}$ ions/cm$^2$. However, the implantation conditions can be modified, if another dopant profile is desired in the N-regions 13.

After the implantation the photoresist layer 11' is removed in some known way, whereupon the thin oxide layer 10 in the openings in the nitride layer 11 is thickened by thermal growth, so that there, after the growth an about 450 nm thick silicon oxide layer 12 is obtained, see FIG. 13. The dopant used in the above described implantation, which in the preferred case is phosphorous, as has been mentioned above, will during this oxidation step diffuse into the epitaxial layer 9, whereby the manufacture of the N-regions 13 is partly finished. Some diffusion of dopants therefrom will occur during those of the following steps which include high temperatures. The remaining regions of the nitride layer 11, which act as barrier layers in a thermal oxidation of the surface of the silicon plate, result in that silicon oxide, in this thermal growth, only grows in those areas, in which the nitride layer 11 has been removed, i.e. in those regions which have been implanted. After the oxidation the nitride layer 11 is solved away completely from the plate, preferably by wet chemical methods. The thin oxide layer 10 located thereunder remains and forms steps at its edges at the thicker silicon oxide regions 12. The thin oxide layer 10 works as a protective layer in the following implantation, which is intended for producing the regions already mentioned above of P-type or the P-regions, the so called "P-wells", and which is illustrated by the arrows in FIG. 13.

The energy in this ion implantation step is adjusted, so that the ions are only capable of passing through the regions which have the thin oxide layer 10 at their surfaces, and are blocked by the regions having the thicker oxide layer 12 at the surfaces thereof. Thereby P-regions 14 or P-wells are obtained which are self-aligned with previously implanted N-regions 13. In the preferred embodiment this ion implantation for forming the P-regions 14 is performed by implanting preferably boron having an energy of about 50 keV and a dose of about $2 \cdot 10^{13}$–$2 \cdot 10^{14}$ ions/cm$^2$. However, the implantation conditions can as above be modified in the case where another dopant profile is desired in the P-regions 14. After the implantation an anneal is performed for making the implanted dopants diffuse at a high temperature, typically during 4 hours at about 1000° C., in order to obtain the desired diffusion depths for the N- and P-regions 13, 14. The resulting structure after the annealing step is shown in FIG. 13. Also the process described above for producing the N- and P-regions is described in the cited U.S. patent for Havemann.

After "driving-in" or the annealing step in order to produce a diffusion all oxide layers are solved away by preferably wet chemical etching, i.e. both regions having the thin oxide layer 10, regions having the thick oxide layer 12 and the possible extra oxide, which in addition has been formed at the surface of the plate in the immediately previous anneal made for making implanted atoms diffuse. After the solving away of the oxide the steps in the surface of the silicon chip again appear. Then the known LOCOS-methods are used for defining active openings for the components to be manufactured. Thus, first a thin barrier oxide layer 15, typically 15 nm thick, is applied over the total surface of the plate by preferably thermal oxidation, see FIG. 14. On top of this oxide layer 15 a considerably thicker nitride layer 16 is deposited, having typically a thickness of 200 nm, using preferably LPCVD-methods. The nitride layer 16 is lithographically patterned by applying a photoresist layer 17 and a patterning thereof for defining component areas, whereupon the nitride layer 16 is etched away in its portions which are not protected by the photoresist layer 17, as appears from FIG. 14. The nitride layer 16 is etched preferably using a suitable dry etching process, which selectively removes only the nitride and leaves the thin barrier oxide layer 15 located thereunder.

Figure 14:
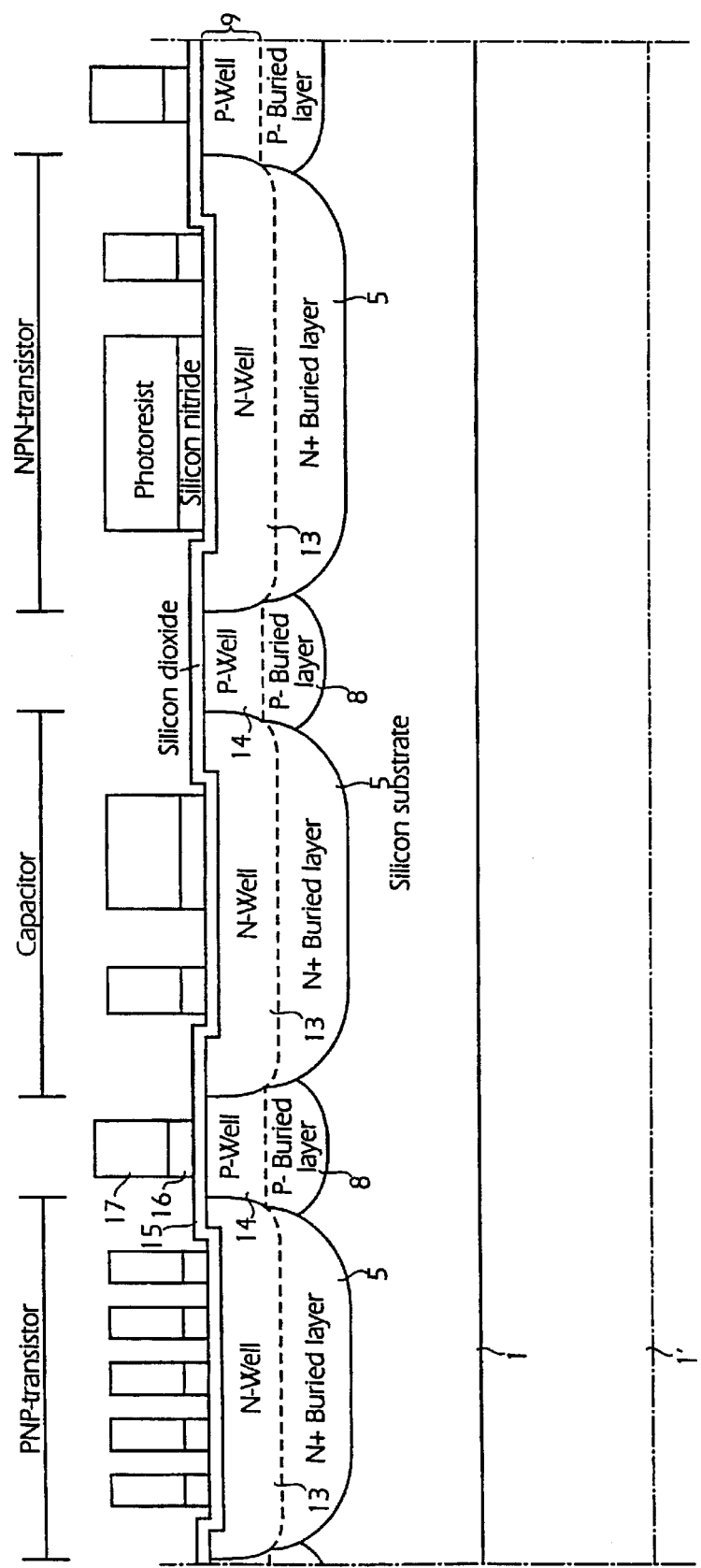
FIG. 14 is a cross-sectional view similar to FIG. 13 after defining component areas, in which different component areas are indicated.

In FIG. 14 three separate N-regions 13 are shown, in which from the left hand side to the right hand side a lateral PNP-transistor, a capacitor and a vertical NPN-transistor are to be formed. The silicon nitride layer 16 then covers substantially areas in which a base connection, a collector and an emitter in the lateral PNP-transistor are to be formed, an area, in which part of an electrode connection is to be formed, and another area, in which both an electrode connection and a dielectric layer are to be formed in the capacitor, and an active region and a region for collector connection in the vertical NPN-transistor.

Figure 15A:
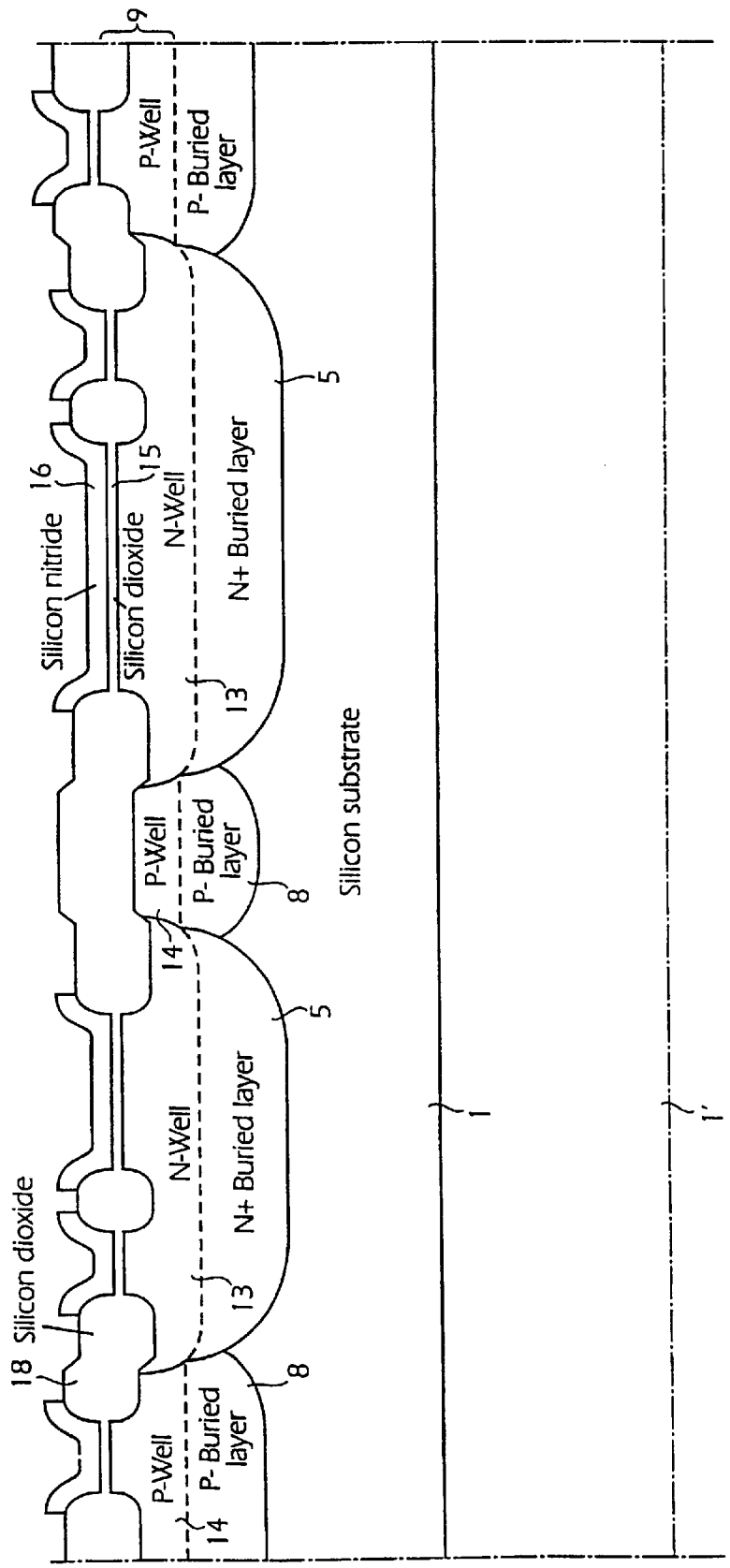
FIGS. 15a and 15b are cross-sectional views similar to FIG. 14 after field oxidizing, showing areas of an NPN-transistor and a capacitor and an area for a lateral PNP-transistor, respectively.
Figure 15B:
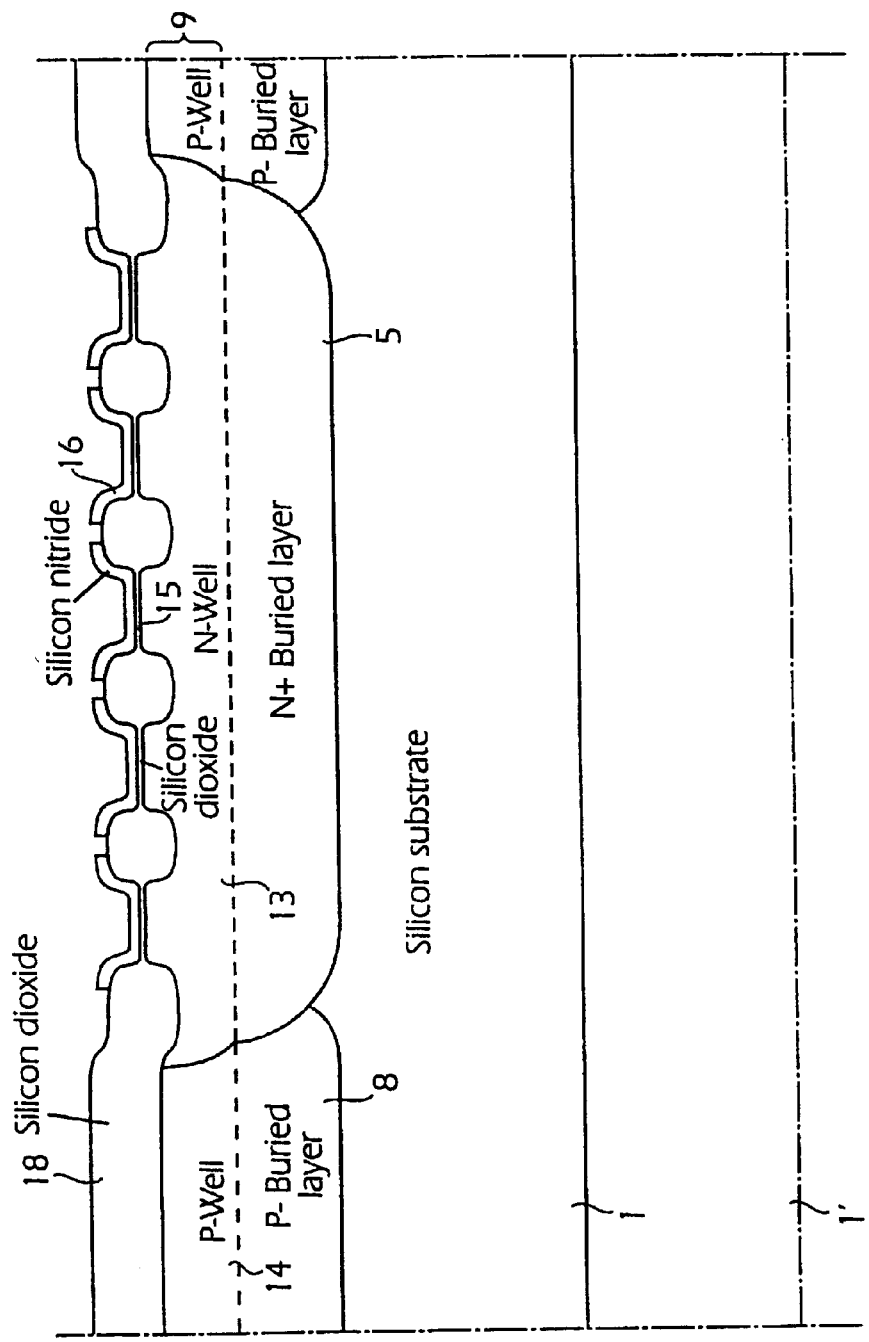

After etching the nitride layer 16 in the openings of the photoresist layer away the latter layer is removed in some known way, whereupon an about 600 nm thick silicon oxide layer 18, so called field oxide, is grown thermally in the openings of the nitride layer 16. In the preferred embodiment the field oxide 18 is preferably grown in a wet atmosphere at typically 950° C. The presence of the nitride layer 16, which acts as a barrier layer in the thermal oxidation of the silicon surface, results in that silicon oxide only grows in those areas within which the nitride has been removed. Since a portion of silicon in the openings of the nitride layer 16 is consumed in its transformation to silicon dioxide, the field oxide 18 will hereby be partly recessed, so called "semi-recessed", in the substrate surface or the very surface of the epitaxial layer 9. The result appears from FIGS. 15a and 15b, of which FIG. 15a shows those regions, within which the capacitor and the NPN-transistor are to be produced, and FIG. 15b shows the region, within which the lateral PNP-transistor is to be produced. In the latter figure it is also visible how the regions of field oxide layer 18 have grown into the material, under the marginal regions of the silicon nitride layer 16. The field oxide layer 18 has a depth smaller than the depth of the epitaxial layer 9, which as stated above is about 1.2 $\mu$m thick, so that under the different portions of the field oxide layer there is still a considerable depth of epitaxial material.

Figure 16:
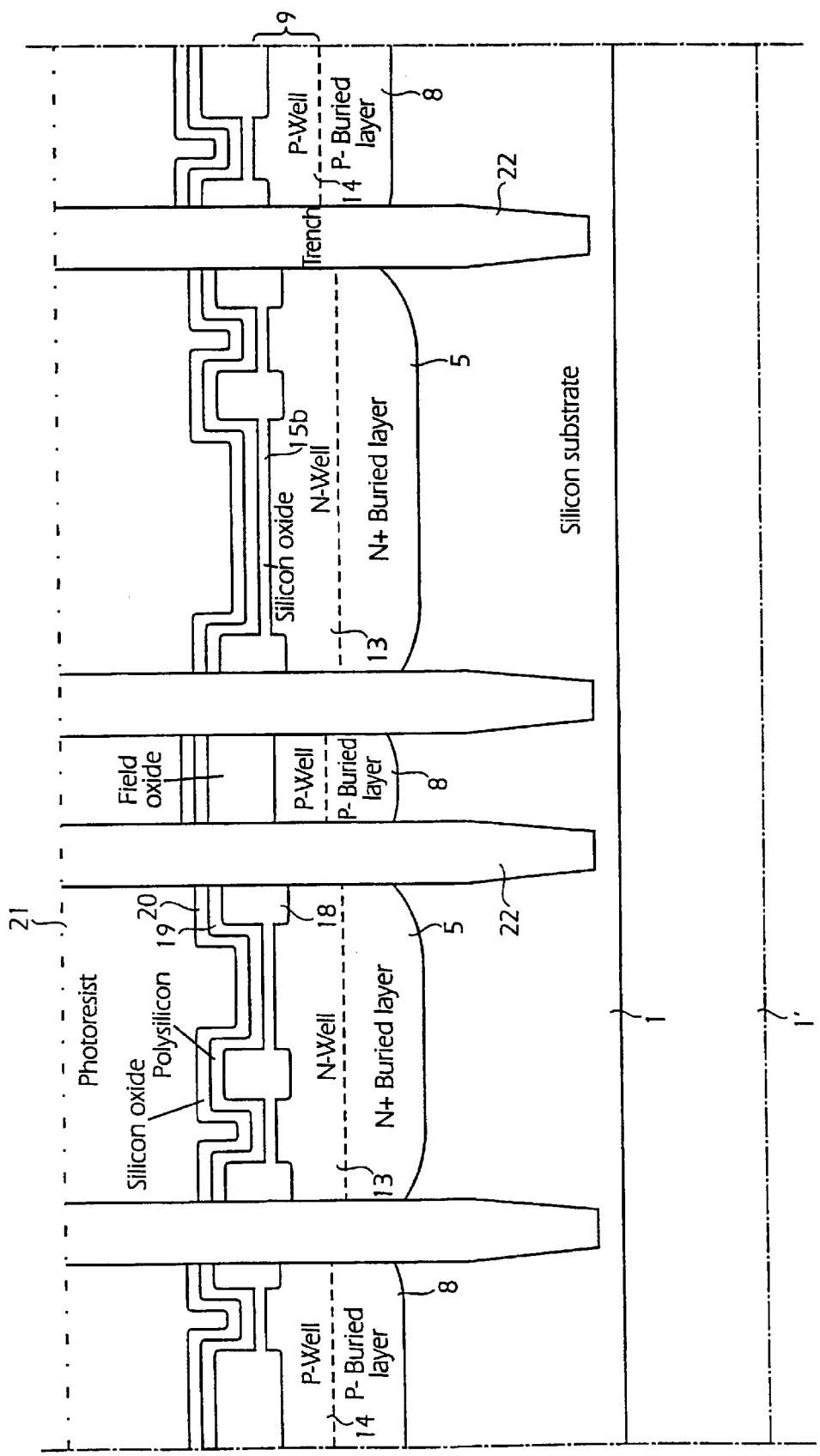
FIG. 16 is a cross-sectional view similar to FIG. 15a after defining trenches.
Figure 17:
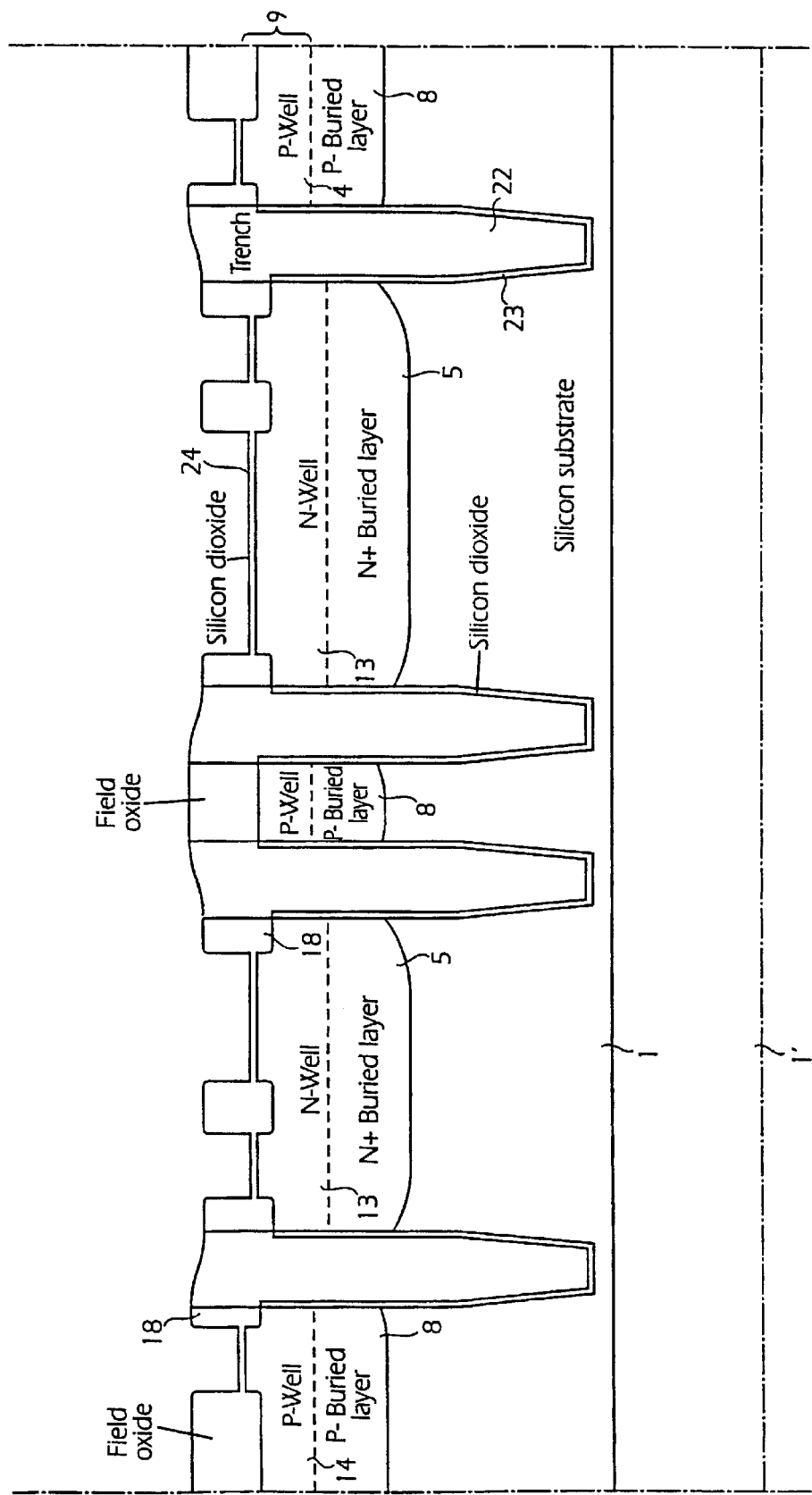
FIG. 17 is a cross-sectional view similar to FIG. 16 but after removing a hard mask and barrier layer and oxidizing walls in trenches.

After the field oxidation the nitride layer 16 and the silicon oxide layer 15 are removed in a preferably wet chemical way, whereupon a silicon oxide layer 15b having a thickness of about 30 nm, so called KOOI-oxide, is thermally grown, see FIG. 16. This layer is only visible in the areas between the regions of the field oxide 18. Then a thin barrier layer 19, typically about 60 nm thick, of polycrystalline silicon or poly-Si is deposited over the surface of the plate. In the preferred embodiment the polysilicon layer is deposited by LPCVD. However, the barrier layer 19 can advantageously also be made of another, here equivalent type of silicon such as microcrystalline or amorphous silicon. On top of the barrier layer 19 of polysilicon is a silicon oxide layer 20, typically 250 nm thick, deposited. In the preferred embodiment the oxide layer 20 is deposited by LPCVD using a thermal decomposition of TEOS, tetraethylorthosilicate. After the deposition the oxide layer 20 is densified by an annealing operation, typically during 3 hours at 800° C., in a wet atmosphere. The oxide layer 20 can also be made of so called LTO-oxide ("Low Temperature Oxide") or PECVD-oxide ("Plasma Enhanced Chemical Vapour Deposition"), since the purpose of this oxide layer is only to serve as a hard mask in the following steps comprising etching trenches, see also U.S. Pat. No. 4,958,213 for Eklund et al. However, in the known process a nitride layer is used instead of the oxide layer 20.

Thereupon the structure is lithographically patterned by applying a photoresist layer 21 and making openings therein, in the purpose of defining deep electrically isolating grooves or ditches, so called trenches, around the respective component and/or groups of components to be manufactured, see FIG. 16. In the preferred embodiment the openings for producing trenches are placed, so that they are located on top of areas of the field oxide layer 18 and completely or partly overlap those steps in the very silicon surface which indicate the connection between the P-regions or P-wells 14 and the N-regions or N-wells 13, which regions are mainly located in the epitaxial layer 9.

On those places which are not protected by the photoresist layer 21 the oxide layer 20 located at the top, the barrier layer 19 of polysilicon located thereunder and at the bottom the field oxide layer 18 are etched away, down to the surface of the epitaxial silicon layer 9. This etching process, which is made in several steps, which each are adapted to remove the respective material, is preferably made by dry etching. After the etching process the photoresist layer 21 is removed in some known way, whereupon deep trenches 22 are produced by further etching, down through the epitaxial layer 9 down to the silicon substrate 1 according to the pattern, which is defined by the openings which have been immediately before lithographically produced in the topmost silicon oxide layer 20. This oxide layer 20 thus serves during this trench etching step as a mask layer, a hard mask. In the preferred embodiment the trenches 22 are about 1 $\mu$m wide and about 6.5 $\mu$m deep. They can be produced, so that their side walls are next to vertical near the surface of the epitaxial silicon layer 9 and so that the trenches are made more narrow when passing downwards and are terminated by a weak rounded shape of their bottom portions, as is illustrated in FIG. 16. The purpose of the profile is to facilitate the following fining or plugging of the trenches 22 with polysilicon and to reduce mechanical stresses in the substrate 1, i.e. to reduce the tendency of the substrate to break at the deep trenches 22, which form indications of fracture. Such trenches are also disclosed in International Patent Application PCT/SE98/00929.

In the preferred embodiment the start material, according to the discussion above, consists of a so called epi-chip or epitaxial chip, i.e. the substrate comprises a highly doped silicon plate of type P+, typically having a resistivity of some tens of mohms·cm, on which an epitaxial, weakly doped silicon layer of type P− has been grown. The grown epitaxial layer is typically about 6 μm thick having a resistivity of 10–20 ohms·cm. Thereby, the depth of the trenches 22 will be such, that they always reach down into the highly doped silicon bulk material of type P+, see the above cited article by V. dela Torre et al. This ensures a high electrical field threshold along the lower portion of the trenches 22 and thereby prevents leakage currents to pass along the envelope surface of the trenches 22. Thereby, since the P-regions 14 and the N-regions 13 are separated by the trenches and the components are to be produced within the N-regions, furthermore a good electric isolation between the different components to be manufactured is ensured. In the case where a weakly doped substrate 1 of type P− is used, having typically a resistivity of 10–20 ohms·cm, an extra ion implantation step is performed after the etching for producing the trenches 22 in order to increase the electrical field threshold below the lower part of the trenches 22, i.e. to make a so called "trench channel stop". Then preferably boron atoms are implanted, for a "tilt angle" of 0° C., having an energy of about 20 keV and a dose of about $5 \cdot 10^{13}$ ions/cm$^2$, see the U.S. patent for Eklund et al. cited above. The energy and dose in this implantation step can vary somewhat depending on the conditions in the processing steps for producing the trenches 22. The processing in this case for a weakly doped substrate is shortly described in the article by P. C. Hunt et al., "Process HE: A highly Advanced Trench Isolated Bipolar Technology for Analogue and Digital Applications", Proceeding of IEEE 1988, Custom and Integrated Circuits Conference, New York, May 16–19.

After finished etching of trenches the remaining portions of the oxide layer 20, the "hard-mask", are etched away. Then the layer 19 of polysilicon located immediately thereunder serves as an etch stop. Thereupon the polysilicon 19 is etched away for a choice of etching agent and etching conditions which leave the field oxide portions 18 located directly under the polysilicon and also the silicon dioxide 15b as well as unaffected. Thereby the good uniformity of the thickness of the field oxide is preserved. This etching process can preferably be performed directly after finished etching of the trenches 22 by sequential dry etching in a multichamber system or "cluster system".

After etching the trenches 22 and after removing the silicon oxide hard mask 20 and the polysilicon barrier layer 19 and the silicon oxide layer 15b the surface of the plate is thermally oxidized at about 900° C. in a wet atmosphere. Then also the walls of the trenches 22 are oxidized and the resulting thickness of the oxide layer 23 on the walls of the trenches will be about 30 nm, see FIG. 17. The barrier oxide layer 24 thus obtained on the upper surface of the chip, which is grown simultaneously, by thermal oxidation, with the oxide layer 23 on the walls of the trenches, obtains a thickness of about 30 nm, and forms at the surface of the plate, in particular at the areas, which are to constitute active regions in components, a thin layer of so called KOOI-oxide. On top of the barrier oxide layer 24 then a thin layer of silicon nitride 25 is deposited, preferably by LPCVD, see FIG. 18. On top of it is deposed another silicon oxide layer 26, about 30 nm thick, by preferably thermal decomposition of TEOS, also using LPCVD. Surface layers corresponding to the nitride layer 25 and the oxide layer 25 obtained thereby are also found along the envelope surface and the bottom of the trenches 22 owing to the conformal deposition obtained using LPCVD. Finally, a thick layer 27 having a thickness of about 1.5 μm of substantially undoped microcrystalline silicon or polysilicon of electrically semi-isolating type, also using LPCVD, is deposited over the surface of the chip, so that all trenches 22 are completely filled by this silicon layer. In the preferred embodiment microcrystalline silicon is used, since it gives a better degree of filling.

Figure 18:
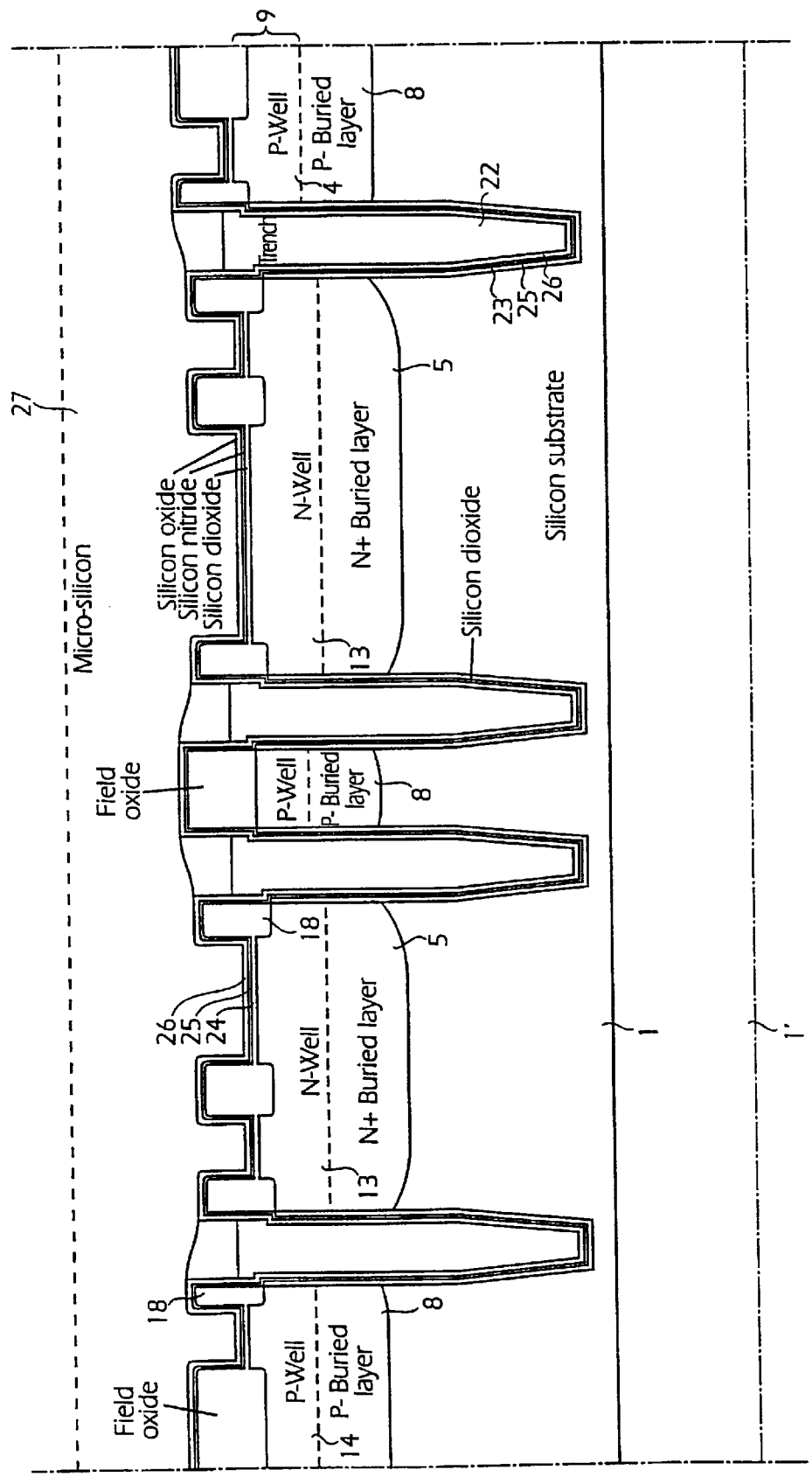
FIG. 18 is a cross-sectional view similar to FIG. 17 after filling trenches with a polysilicon layer.
Figure 19:
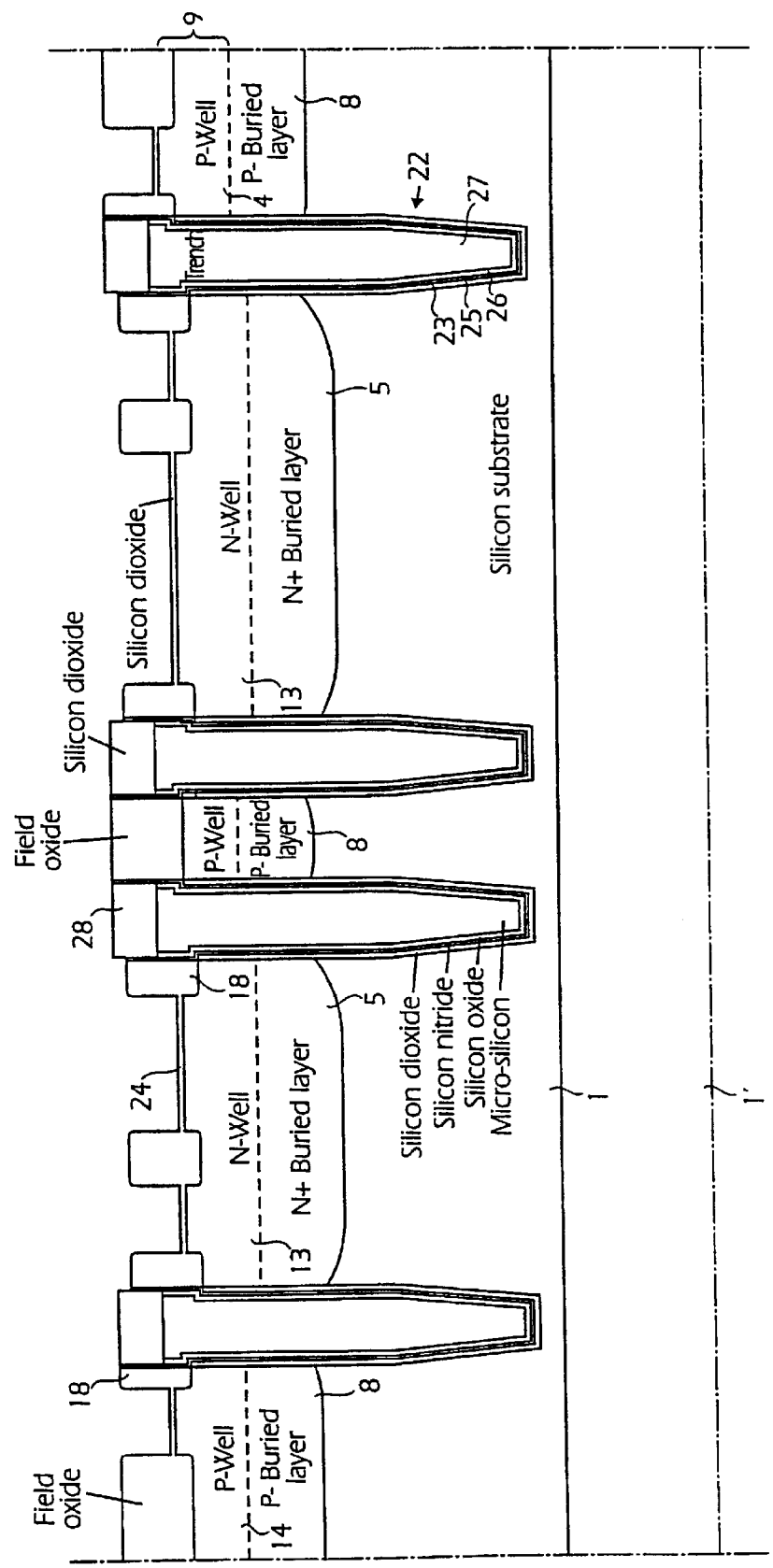
FIG. 19 is a cross-sectional view similar to FIG. 18 after oxidizing polysilicon in the openings of the trenches.

After depositing the layer 27 of microcrystalline silicon or polysilicon this layer is removed on all of the upper or exterior surface portions of the plate by dry etching, see FIG. 18, so that material from this silicon layer only remains in the trenches 22. In the preferred embodiment the etching process is stopped, when the oxide layer 26 located next under the layer 27 of microcrystalline silicon has been exposed at the upper or exterior surface portions of the plate. Thereby an unnecessary over-etching of the microcrystalline silicon or polysilicon is avoided which is the filling material in the trenches 22. It can still happen, that the trenches 22 do not remain completely filled after this step.

After finished etching the silicon chip is thermally oxidized at about 950° C. in a wet atmosphere. Then that silicon 27 is oxidized at its upper surface, which fins the trenches 22, so that an about 0.4 μm thick isolation layer 28, a so called "cap-oxide", of silicon dioxide is formed in the mouths or openings of the trenches, see FIG. 19. The present nitride layer 25, which acts as a oxidation barrier, prevents the other portions of the plate from being further oxidized. The top, thin oxide layer 26 and the nitride layer 25 located immediately under it on the upper surface of the chip are then removed by sequential dry etching. This dry etching is stopped at the layers immediately under the nitride layer 25, i.e. when the surfaces of the field oxide regions 18 and the barrier oxide layer 24 have been exposed.

The trenches 22 can also be filled with an electrically isolating material such as silicon oxide. Thus, in that case no microcrystalline layer 27 is applied but instead the silicon oxide layer 26 is applied in a greater thickness, not shown in the figures, so that the trenches 22 are completely filled, for example using SACVD ("SubAtmospheric Chemical Vapour Deposition"). This silicon oxide layer is etched away by some suitable dry etching process, until a flat surface is obtained at the openings of the trenches 22. In connection with this planarizing etching step also the silicon nitride layer 25 located directly under the silicon oxide layer is removed, on flat or horizontal portions, which silicon nitride layer works as an etch stopping layer in the etching process. A thermal oxidation in order to form the isolation layer 28, the so called "cap-oxide", of silicon dioxide in the mouths or openings of the trenches is not required in this case. The silicon nitride layer 25 remains in the trenches 22 and acts there, like above for the case of filling with microcrystalline silicon, as a diffusion barrier for possible impurities in the filling material.

In the beginning it was mentioned, that it is well known, that a bottom diffusion of type N+ is used as a low resistance collector electrode in an NPN-transistor. In order to ensure a low resistance between the collector connection terminal at the silicon surface and the buried bottom diffusion 5 a so called collector plug is formed. This plug is lithographically defined, see FIG. 20a, by applying a photoresist layer 31 over all of the surface of the chip and performing a patterning of this layer, so that an opening for a region 30' for the plug in the photoresist layer 31 is formed over the considered component area. In the preferred embodiment also the bottom diffusion 5 acts as one of the electrodes in a plate capacitor which is to be produced simultaneously. Consequently, in this processing step also an opening is defined for a region 30" for electrodes in the photoresist layer, within which region this capacitor is to be manufactured and which region comprises two separate areas of connection plugs to the buried region 5 of type N+ in order to reduce the series resistance to this buried bottom diffusion 5, which is to form a part of the connection with one of the capacitor electrodes. The openings 30', 30" in the photoresist layer 31 are made so that they cover whole areas between regions of the field oxide layer, what also means that the remaining portions of the photoresist layer 31 cover other whole areas between regions of the field oxide layer 18. This condition can also be worded in the way that the margins of the openings in the photoresist layer are always located above regions of the field oxide layer 18. Openings are also provided over regions 30'" for a base connection of the lateral PNP-transistor to be manufactured, see FIG. 20b.

Figure 20A:
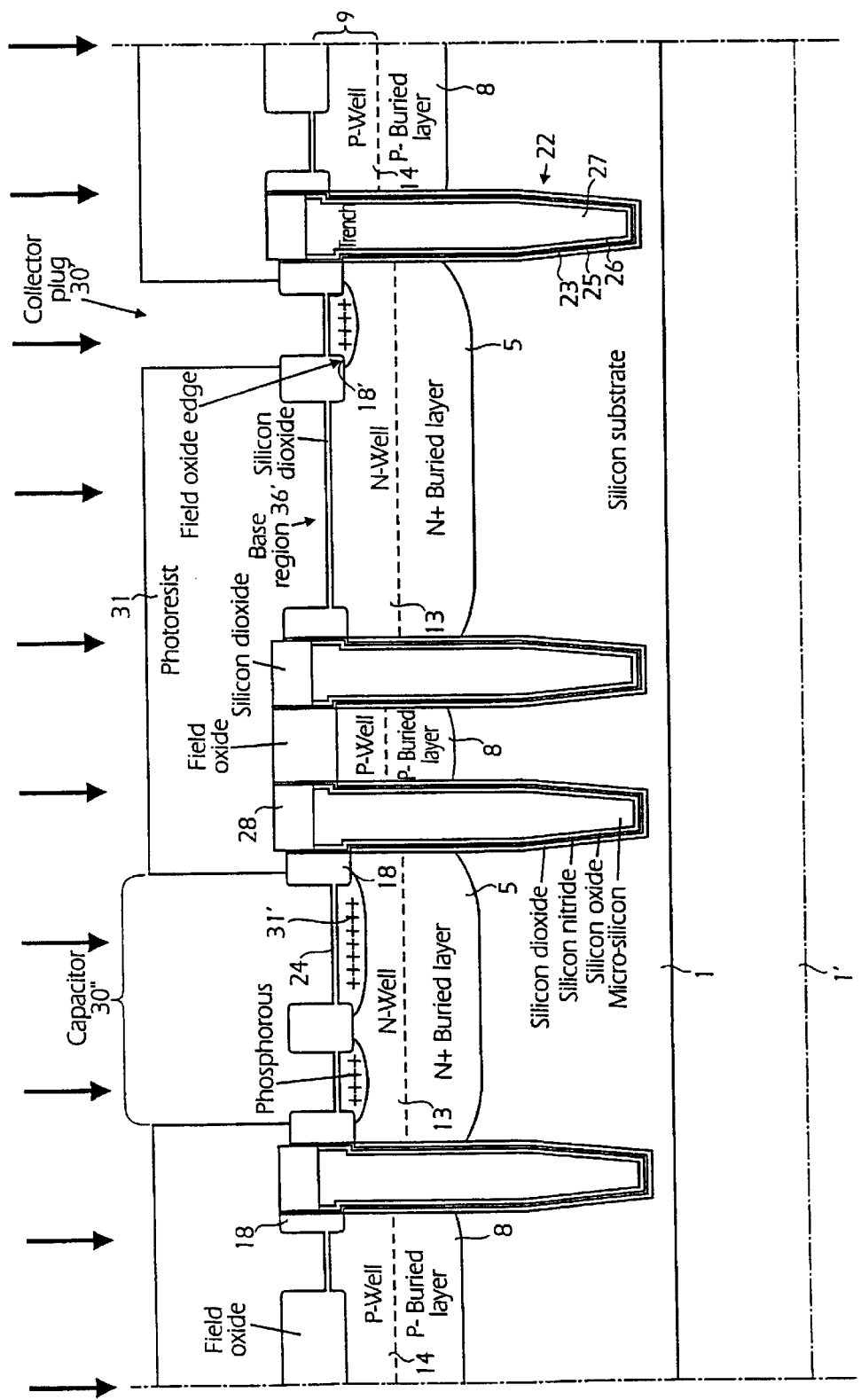
FIGS. 20a and 20b are cross-sectional views similar to FIG. 19 showing the state of the plate when forming a collector at areas for an NPN-transistor and a capacitor and an area for a lateral PNP-transistor respectively.
Figure 20B:
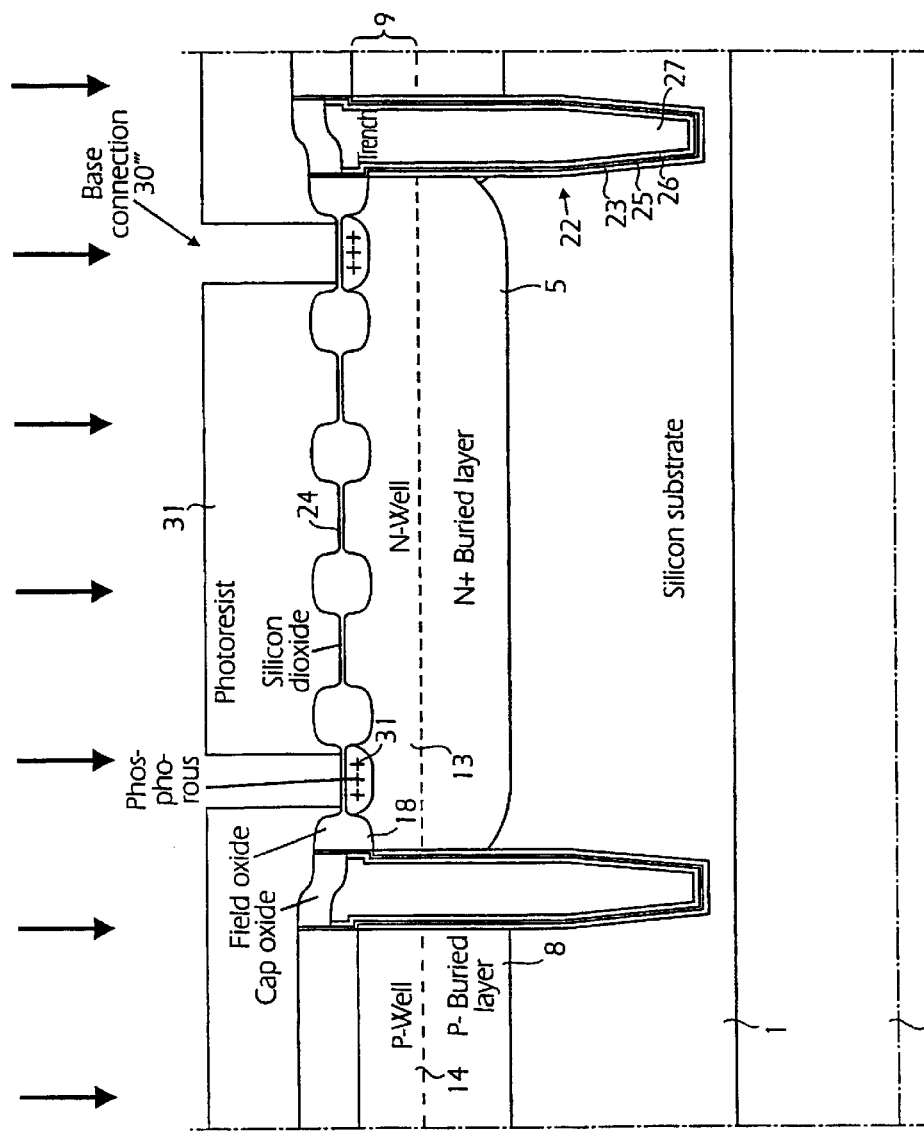

After patterning the photoresist layer 31 a doping is made in the openings of the photoresist layer 31, i.e. in the openings for the area 30' for the collector plug, the opening at the area 30" for the capacitor electrodes and at the openings 30'" for the regions for the base connection, for achieving regions which are strongly doped to N-type, as is illustrated by the arrows in FIGS. 20a and 20b. The dopant atoms are indicated by crosses 31'. This doping step is preferably performed by ion implanting e.g. phosphorous having an energy of about 50 keV and a typical dose of $5 \cdot 10^{15}$ ions/cm$^2$. It is important that the energy in this implantation is selected so that the location of the defects, which are introduced in the silicon in the very implantation step, does not pass down beyond the depth which is defined by the under surface or the bottom of the field oxide layer 18, i.e. the level where this layer ends, as seen in a downward direction from the surface of the plate. If the defects extend deeper downwards, it can result in creating dislocations in the neighbourhood of the emitter-base- and/or base-collector-junction together with associated leakage problems in the NPN-transistor to be manufactured. Consequently the implantation energy and the dose can have to be varied somewhat depending on the conditions in the previously made field oxidation for producing the field oxide layer 18, see in particular the aforementioned International Patent Application PCT/SE98/00929.

Figure 21A:
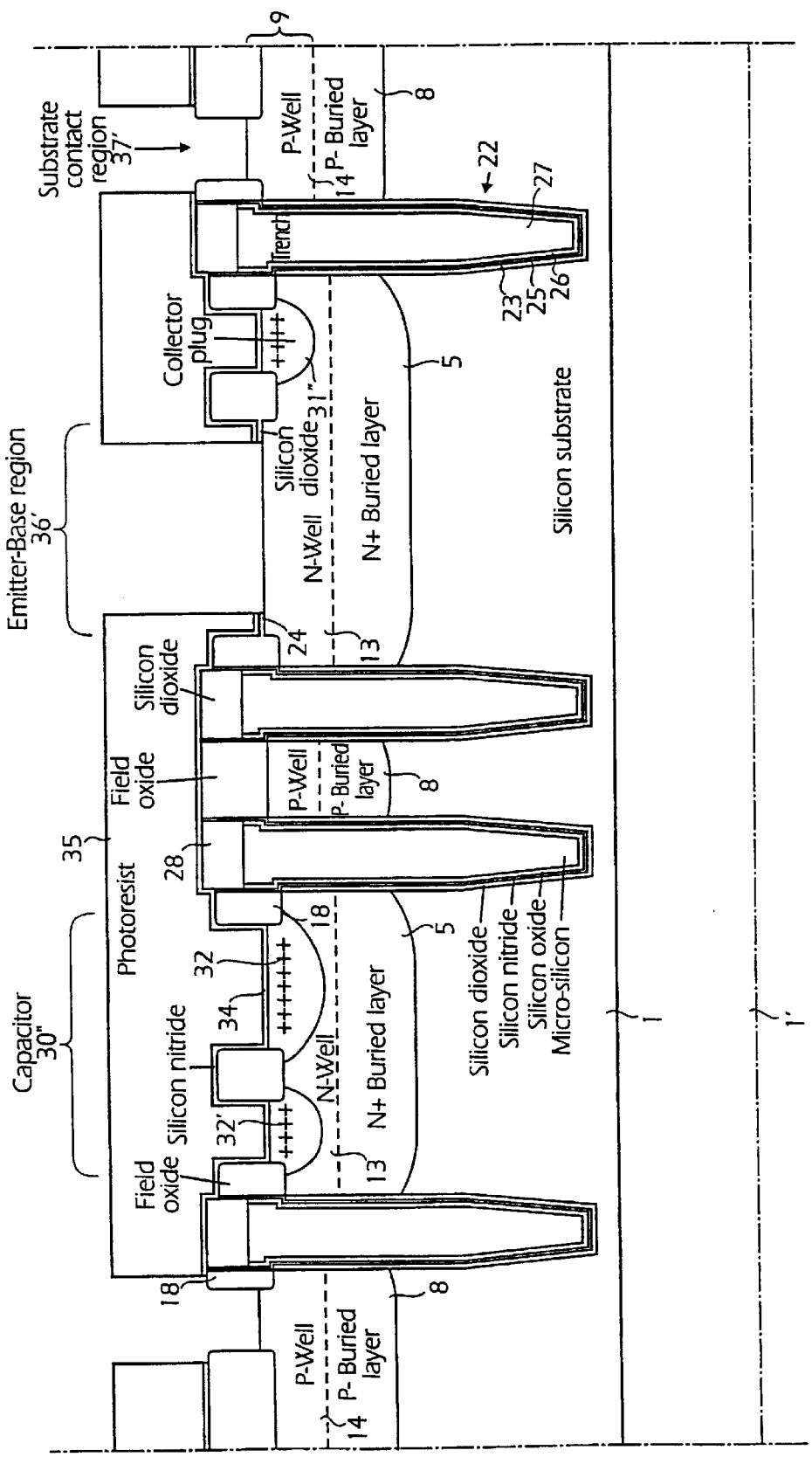
FIGS. 21a and 21b are cross-sectional views similar to FIGS. 20a and 20b respectively after depositing a silicon nitride layer and defining an emitter-base area.
Figure 21B:
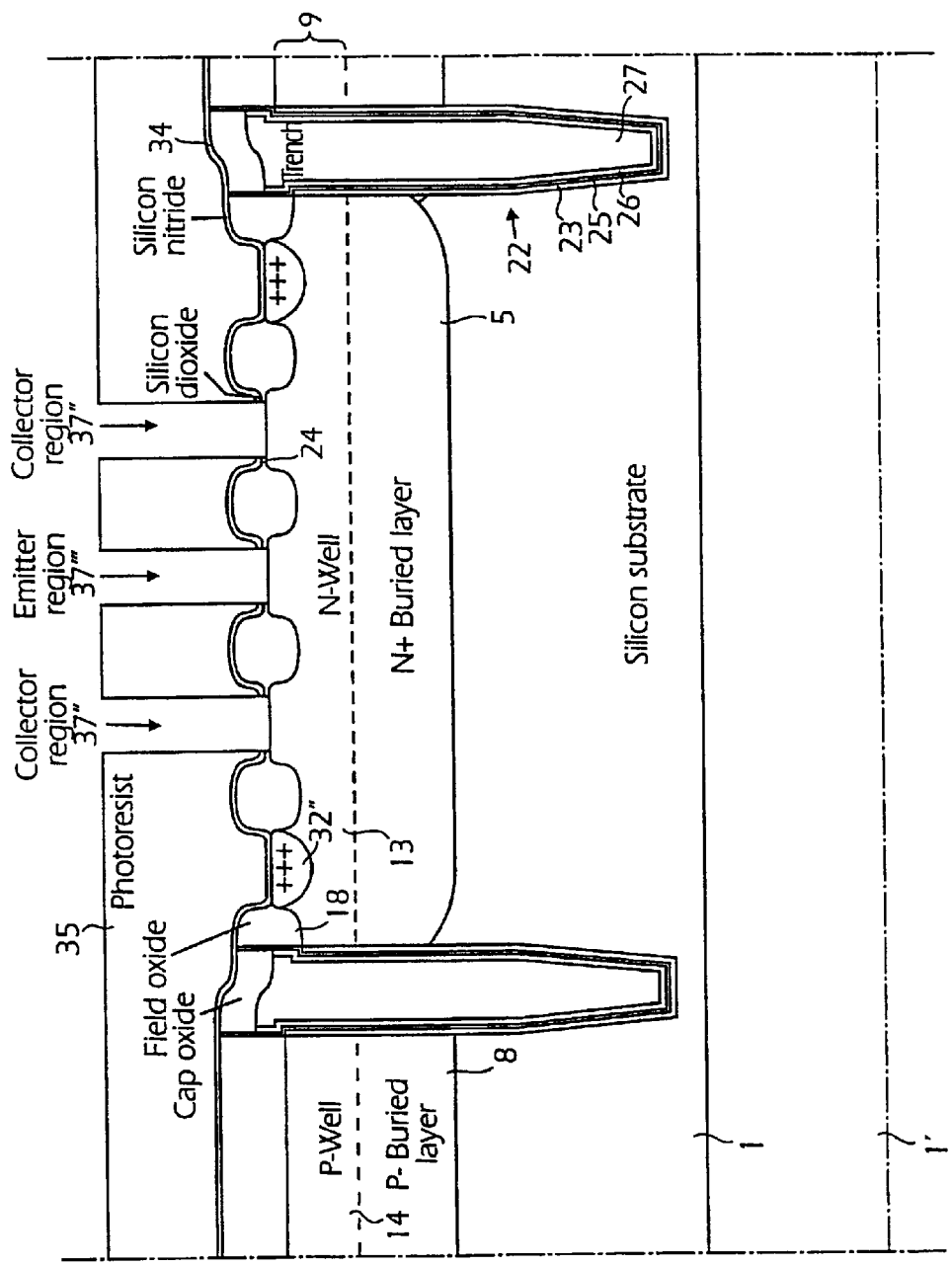

After the implantation the thin, protective oxide layer 24 is removed on top of the implanted regions, preferably by dry etching, see still FIGS. 20a and 20b. However, it can be observed that this oxide layer 24 remains on those surface portions which are covered by the photoresist layer 31, i.e. among other regions on those portions of the bipolar NPN-transistor where a base region 36' will later be defined, see FIG. 21a. Thereupon the photoresist layer 31 is removed in some known way, whereupon the plate, for driving the dopant in, i.e. make it to diffuse into the material, which dopant was introduced in the implantation, is annealed at typically 900° C. for about half an hour in a preferably non-oxidizing atmosphere, e.g. containing $N_2$ or Ar. The resulting collector plug 31" of type N+, one of the capacitor electrodes 32 and a connection 32' thereto, also of type N+, and plugs 32" for connection of the buried base connection layer 5 in the lateral PNP-transistor after this annealing step are shown in FIGS. 21a and 21b.

After finished annealing the possible, thin oxide layer is removed which has been formed in the area 30" for the capacitor and in the area 30', on top of the collector plug 31" for the NPN-transistor and in the areas 30'" for the base connection of the PNP-transistor, by etching the plate for a short time in diluted hydrofluoric acid. Directly after this etching is deposited, preferably by LPCVD, a thin silicon nitride layer 34 over the plate, see FIGS. 21a and 21b. This nitride layer 34 serves to achieve two special purposes in the manufacturing process:

i) That portion of the nitride layer 34, which is in direct contact with that region of the surface of the silicon plate, which is included in the capacitor area 30" and in which also one of the capacitor electrodes 30'" is to be formed, will act as a dielectric in the capacitor to be manufactured. Since silicon nitride has a higher dielectric constant (about twice) than silicon dioxide, capacitors using a nitride dielectric have a higher capacitance per surface unit compared to capacitors having a dielectric of silicon dioxide. The thickness of the nitride layer is adapted so that the capacitor obtains a capacitance of about 2.4 fF/$\mu$m$^2$. This corresponds to a nitride layer 34 deposited using LPCVD and having a thickness of about 27 nm.

ii) That portion of the nitride layer 34 which is deposited on top of the remaining oxide layer 24 in the active area 36', where the base connection to the bipolar NPN-transistor to be produced later will be formed, gives an increased thickness to the isolating dielectric thereof and consequently a smaller parasitic capacitance for the collector-base junction.

After applying the nitride layer 34, see still FIGS. 21a and 21b, the plate is lithe graphically patterned, by first applying a photoresist layer 35 and then making suitably located openings therein for defining a base area 36' for the NPN-transistor to be produced and openings 37", 37'" for a collector and an emitter in the lateral NPN-transistor to be produced and for defining openings for connection to substrate contacts 37' in the P-areas or P-wells 14. The opening for defining the base region 36' for the NPN-transistor to be manufactured is placed so that it is located above regions where no field oxide layer 18 exists, and so that the edges of the opening are located at a not too small distance from the regions of the field oxide layer 18. Openings for a collector and an emitter in the lateral PNP-transistor to be manufactured are in the same way placed above regions where no field oxide layer 18 exists. However, the edges of the openings are placed adjacent to or closer to the edges of the field oxide layer 18, see FIG. 21b. These openings are also located above N-regions 13 and thereby above bottom diffusions 5 of type N+. In contrast, the openings in the photoresist layer 35 for substrate connections (37') are located above P-regions 14 and thereby above bottom diffusions 8 of type P−.

Thereupon an etching is made in the openings of the photoresist layer 35, preferably by dry etching. This dry etching step is performed sequentially, the nitride layer 34 being first removed. Thereupon the underlying oxide layer 24 is etched away. The etching process is stopped when the silicon surface has been exposed. This patterning step which is particular to the process as described herein reduces, for the NPN-transistor to be manufactured, the area of the base region which otherwise would have been determined by openings in the field oxide layer but which as described herein is determined by the edges of the openings of the photoresist layer 35. Furthermore, it is avoided, that the base region which is to be produced in the NPN-transistor is made to be located in a near contact with the edges of the field oxide layer, where an increased concentration of dopants exists owing to "pile-up" of dopants from the N-regions or N-wells 13, as has been mentioned above. The patterning for producing openings in the nitride layer 34 and in the oxide layer 24 between the regions of the field oxide layer 18 is made in the purpose of reducing the capacitance between the collector and the base for the NPN-transistor to be manufactured, by the fact that a well defined opening can be obtained, and the remaining portions of the nitride layer are used for forming a dielectric layer for the capacitor to be manufactured. Furthermore the same patterning step can be used for defining the distance between the emitter and the collector of the lateral PNP-transistor to be manufactured. The advantage of this process is that the distance between the emitter and the collector therein becomes well defined and at the same time the emitter and collector openings can be made smaller, what reduces the capacitive coupling between these electrodes. This distance would otherwise have been defined by the field oxide strings 18, as is illustrated in FIG. 21b.

The advantage of the process as described above is that the dielectric of the capacitor which is formed by the nitride layer on top of the plug 32 forming one electrode of the capacitor is produced at the same time as that layer which defines the emitter-base region 36' of the NPN-transistor to be manufactured, at the same time as the parasitic contribution from the capacitance between the collector and the base of this NPN-transistor is reduced and that the emitter-base region 36 becomes well defined in the NPN-transistor to be manufactured, as well as that the distance between emitter and collector regions in the lateral PNP-transistor to be manufactured also becomes well defined, by the fact that it is lithographically defined.

After etching the nitride layer 34 and the oxide layer 24 for defining base regions 36' for the NPN-transistor to be manufactured, collector windows 37", 37'" for the lateral PNP-transistor to be manufactured and substrate connections 37', the photoresist layer 35 is removed in some known way. Thereupon, in the preferred embodiment a thin layer of amorphous silicon 38 having a thickness of about 200 nm is deposited, preferably using LPCVD, over the surface of the plate, see FIG. 22. This silicon layer 38, which will later in the process form electrical conductor paths for connecting the base of the NPN-transistor to be manufactured, a top electrode of the capacitor to be manufactured, conductor paths for connecting the emitter and the collector in the lateral PNP-transistor to be manufactured and connections to substrate contacts can also be constituted of microcrystalline silicon or polysilicon.

Figure 22:
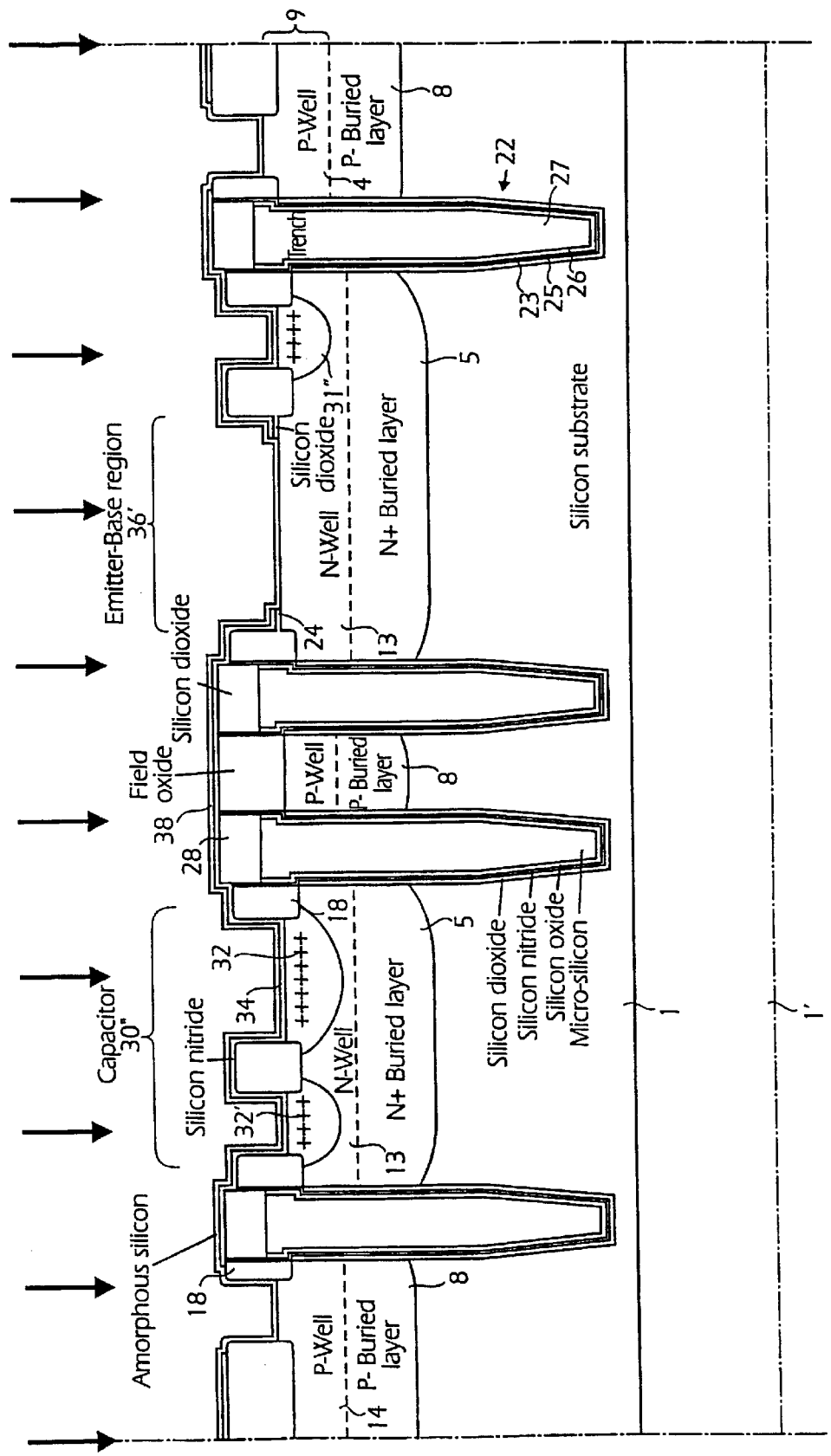
FIG. 22 is a cross-sectional view similar to FIG. 21a after defining a base area and depositing amorphous silicon.

In an ion implantation following hereafter, which is illustrated by the arrows in FIG. 22, the amorphous silicon layer 38 is doped to become heavily doped P-type. In the preferred embodiment this ion implantation step is made by preferably implanting $BF_2$ at an energy of about 50 keV and a dose of about $2 \cdot 10^{15}$ ions/cm$^2$. The energy in the implantation process is so adjusted that the implanted boron atoms do not reach down to the surface of the epitaxial layer 9. The dose and the energy can vary somewhat depending on the thickness of directly before deposited amorphous silicon layer 38 and on the nature thereof. Also other boron compounds and/or atomic boron can be used in the ion implantation of this silicon layer. The energy and the dose must in that case be adjusted to suitable values.

Figure 23A:
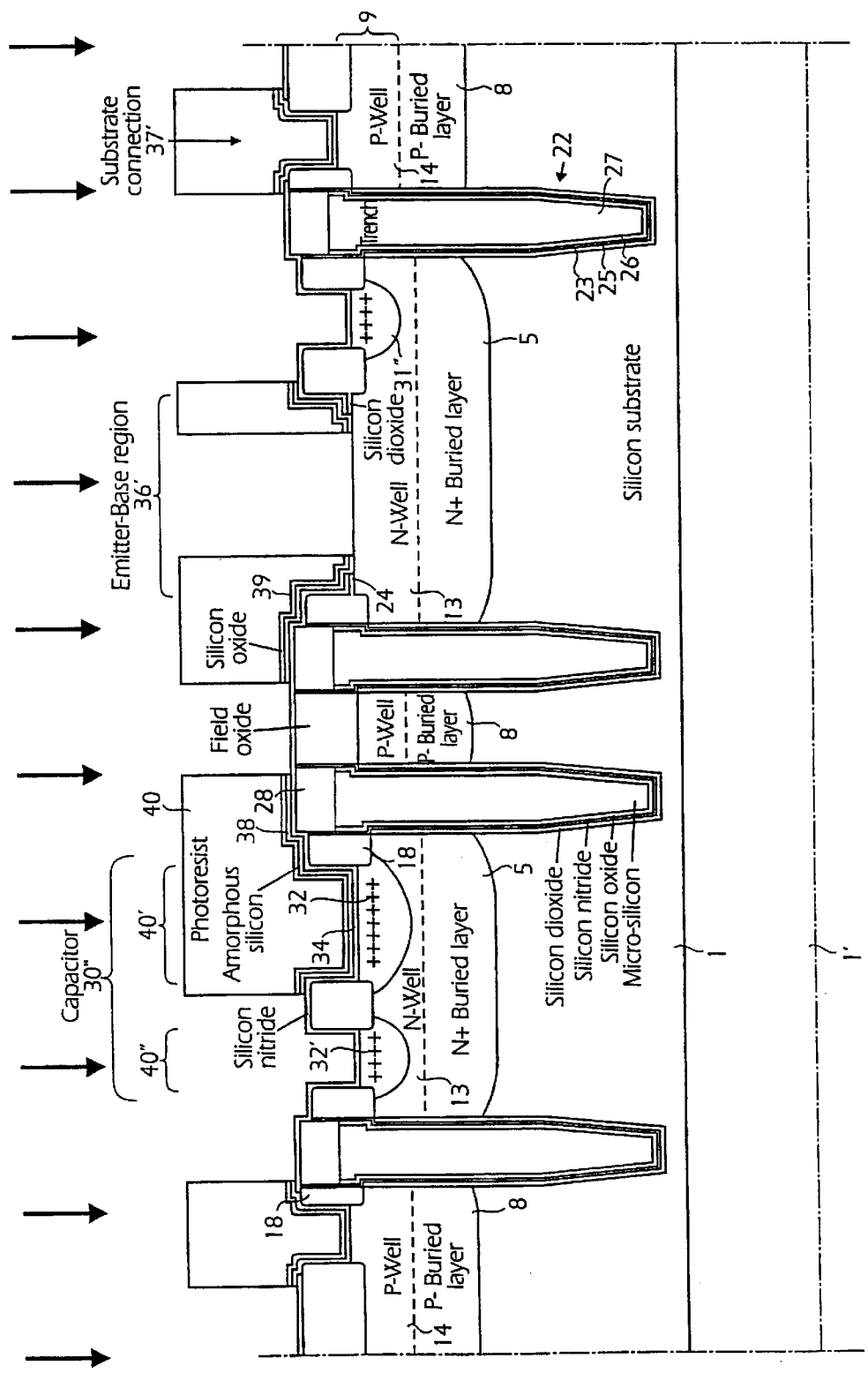
FIGS. 23a and 23b are cross-sectional views similar to FIG. 22 after defining an emitter-base area, an upper capacitor plate and substrate connections, showing areas for an NPN-transistor and a capacitor and an area for a lateral PNP-transistor respectively.
Figure 23B:
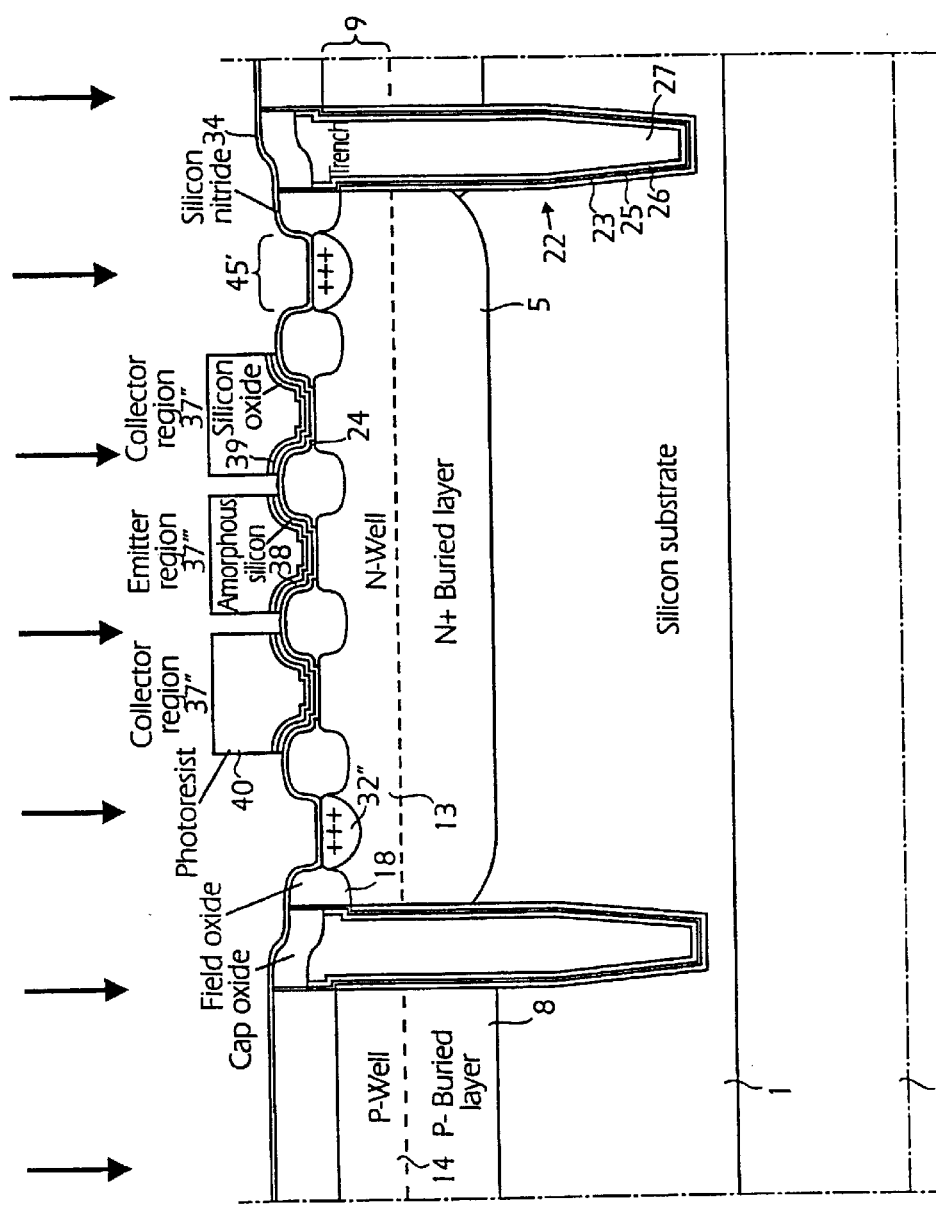

On top of the amorphous silicon layer 38 is a silicon oxide layer 39 deposited having a thickness of typically 150 nm, see FIGS. 23a and 23b. In the preferred embodiment this oxide layer 39 is deposited by PECVD but also other types of such so called low temperature oxides, deposited by means of some suitable CVD-method, e.g. LTO, can be used. In the preferred embodiment the temperature when depositing the oxide layer 39 is kept so low that the amorphous silicon layer 38 is not made to recrystallize. The advantage of using a combination of amorphous silicon which is implanted with $BF_2$ under a protective layer 39 of silicon oxide, deposited by PECVD, when producing conductors for connecting the base of NPN-transistors, is described in the International Patent Application PCT/SE96/01511.

After depositing the silicon oxide layer 39 the surface of the plate is coated with a photoresist layer 40 and is lithographically patterned, defining a region shown at 40', which is included in the capacitor area 30" and is intended for a top electrode which belongs to the plate capacitor to be manufactured and which is placed on top of the dielectric of nitride 34 which exists in the whole region 30", and which region 40' is thus covered by the photoresist layer 40. Furthermore, regions of the photoresist layer 40 cover areas around the beginning emitter-base area 36' for the NPN-transistor to be manufactured and further it covers regions 37' for substrate contact connections, regions 37" for collector electrodes and regions 37'" for emitter electrodes of the lateral PNP-transistor to be manufactured. Using the now applied and patterned photoresist layer 40 as a mask the silicon oxide layer 39 and the underlying layer 38 of amorphous silicon is etched away in the openings of the resist layer. The etching process which is stopped when the silicon nitride layer 34 has been completely exposed in the openings in the photoresist layer 40 where this nitride layer exists, such as on top of the field oxide and in the region 40", where a connection is made through the buried diffusion region to the bottom electrode in the capacitor to be manufactured, is preferably made by sequential dry etching in a multichamber system or "cluster system". The result is shown by FIGS. 23a and 23b. In the preferred embodiment this etching sequence is so adapted that a silicon thickness of about 20–40 nm of the substrate in the opening for the beginning emitter-base region 36' is consumed during the final step of the etching process, which is a so called over-etching step.

After finished etching an additional doping is made of that region which is to form the collector of the NPN-transistor in the purpose of minimizing so called "base widening" and thereby improving the high frequency characteristics of the transistor, see the article by M. C. Wilson, "The application of a selective implanted collector to an advanced bipolar process", ESSDERC'90, Nottingham, September 1990. In the preferred embodiment this doping is made by ion implanting phosphorous, as is indicated by the arrows in FIGS. 23a and 23b, and preferably in two steps. During the first step phosphorous is implanted at an energy of about 200 keV and in a dose of about $1 \cdot 10^{12}$ ions/cm$^2$. During the second step phosphorous is implanted at an energy of 460 keV and in a dose of about $1.8 \cdot 10^{12}$ ions/cm$^2$. The mutual order of these two implantation steps can vary. A small adjustment of the respective implantation dose and energy can in an accurate manufacturing process always be necessary for compensating minor process variations, e.g. minor changes of the thickness of the epitaxial layer 9, etc. Then it should be observed that the dopant is in register with or aligned with the opening of the beginning emitter-base region 36' and that the photoresist layer 40 remains on the plate in the implantation process for preventing the dopant, in the preferred case phosphorous, from entering into the epitaxial layer 9 at non-intended places. Any increased collector doping will therefore after finished processing steps not exist under the so called extrinsic base, i.e. the region along the edge of the region 36', where the amorphous silicon layer 38 of type P+ is in contact with the surface of the epitaxial silicon layer 9. Thereby a low capacitance between collector and base in the NPN-transistor to be manufactured can be maintained.

Figure 24:
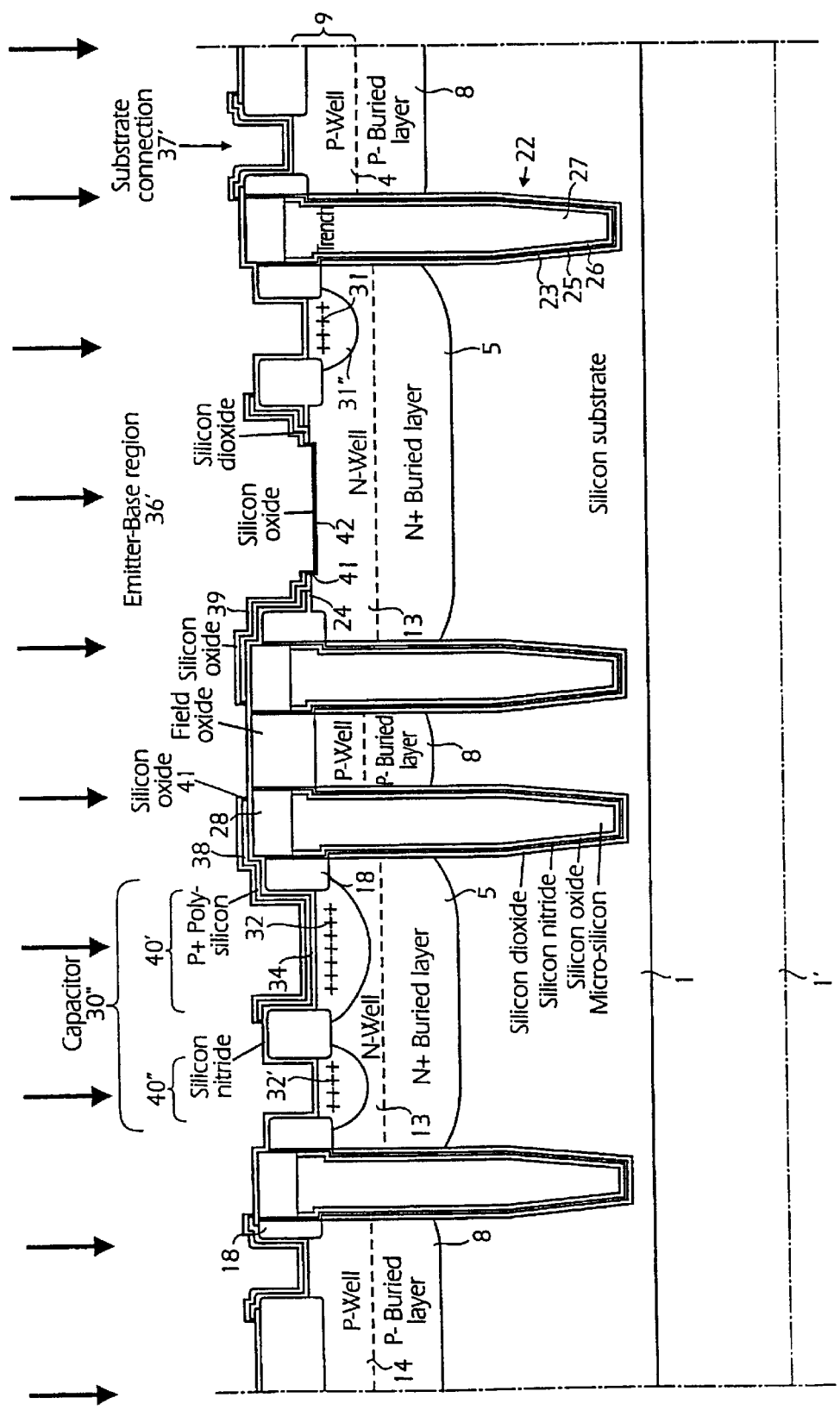
FIG. 24 is a cross-sectional view similar to FIG. 23a showing the state of the plate when making an implantation of a base.

After finished implantation the photoresist layer 40 is removed in some known way, whereupon a thin silicon dioxide layer 42, having a thickness of about 20 nm, is deposited over the surface of the plate, so that it in particular covers the openings 36' at the beginning emitter-base region, see FIG. 24. In the preferred embodiment this oxide layer 42 is deposited preferably by thermal oxidation in a wet atmosphere at 800° C. In this oxidation step the formerly applied silicon oxide layer 39, which has been deposited at a low temperature using e.g. PECVD according to the discussion above, will be densified at the same time as a silicon dioxide layer 41 is formed on the vertical free side walls or edge surfaces of the amorphous silicon layer 38. In the oxidation, which in itself comprises an annealing step, the amorphous silicon layer 38 is transformed to polycrystalline silicon or polysilicon, i.e. it partly crystallizes, at the same time as implanted boron is redistributed. The formerly amorphous silicon layer 38 will hereinafter be called a polysilicon layer of type P+. The result is illustrated by FIG. 24.

After producing the silicon dioxide layer 42 according to the description above preferably boron is implanted in the plate, as is illustrated by the arrows in FIG. 24, in order to form the intrinsic base region or the effective base region of the NPN-transistor to be manufactured. In the preferred embodiment boron is ion implanted at an energy of about 10 keV and in a dose of about $7 \cdot 10^{13}$ ions/cm$^2$. A minor change of the thickness of the topmost applied oxide layer 42 results in a corresponding adjustment of energy and/or dose. The implantation only penetrates through the different applied oxide, silicon and nitride layers only at those places where only the silicon oxide 42 is located directly on top of the upper surface of the epitaxial layer 9, i.e. in the beginning emitter-base region 36'.

After the base implantation as described above the plate is thermally oxidized, preferably in a wet atmosphere at 800° C. for about 20 minutes, what further reduces the surface concentration of boron atoms. In the preferred embodiment the plate is thereupon conformally coated with an about 180 nm thick nitride layer 44 by LPCVD, see FIG. 25a. In the preferred embodiment this nitride layer is etched using a particular anisotropic dry etching process, until in a known way a side-string or a so called "spacer" 45 of silicon nitride remains, at those places where large steps exist in the silicon nitride layer 44, as at the opening for the beginning emitter-base region 36' of the NPN-transistor to be manufactured. In this etching step is not only the nitride layer 44 etched away but also the previously applied nitride layer 34 at those regions where this is located directly under the latest applied nitride layer 44. The etching is stopped, when the surfaces of the regions of the field oxide layer 18 and of the silicon oxide layer 42 have been exposed. The opening in the beginning emitter-base region 36', which is formed in this etching process of the nitride layer 44, will form the so called emitter opening 36". After finished manufacture the emitter in the manufactured NPN-transistor will be separated from the polysilicon layer 38, which is of type P+, by the nitride side-strings 45 and by the oxide layer 41 at the edge surfaces of the polysilicon layer. In the etching also the silicon surface is exposed in the region 40", where a connection to the bottom electrode is to be formed in the capacitor to be manufactured. The silicon surface is also exposed in regions 45', in which base connections are to be formed to the lateral PNP-transistor to be manufactured, see FIG. 23b.

The remaining silicon oxide layer 42, which is noticeable only in the emitter opening, is thereupon solved away either in a wet chemical way or by dry etching. In the preferred embodiment dry etching in two steps is used, and then first the oxide layer 42 is removed by RIE ("Reactive Ion Etching") in a plasma of Ar/CHF$_3$/CF$_4$ followed by a mild isotropic silicon etching in situ in an atmosphere of Ar/NF$_3$ for removing impurities and irradiation damages from the previous RIE-step. This etching step in Ar/NF$_3$ removes a thickness of about 150–200 Å silicon from the free surface of the epitaxial layer 9, the intrinsic base, in the emitter opening 36". Since this etching step affects the intrinsic base profile, it can be required that the etching depth is somewhat varied depending on requirements on the current gain factor ($H_{fe}$) of the transistor to be manufactured.

Figure 25A:
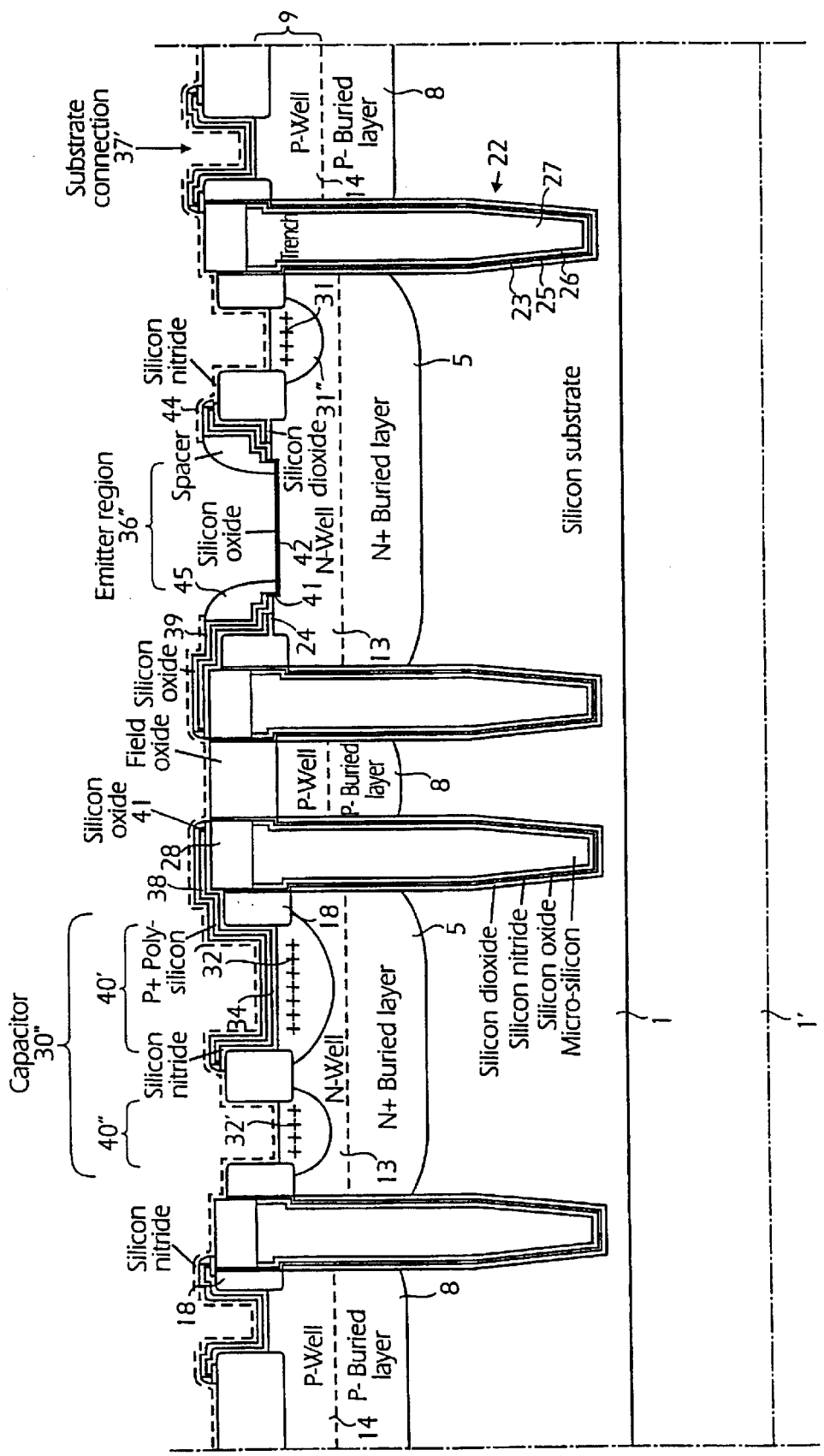
FIG. 25a is a cross-sectional view similar to FIG. 24 showing the state of the plate when forming spacers for isolating between the base connection terminal and the emitter connection terminal.
Figure 25B:
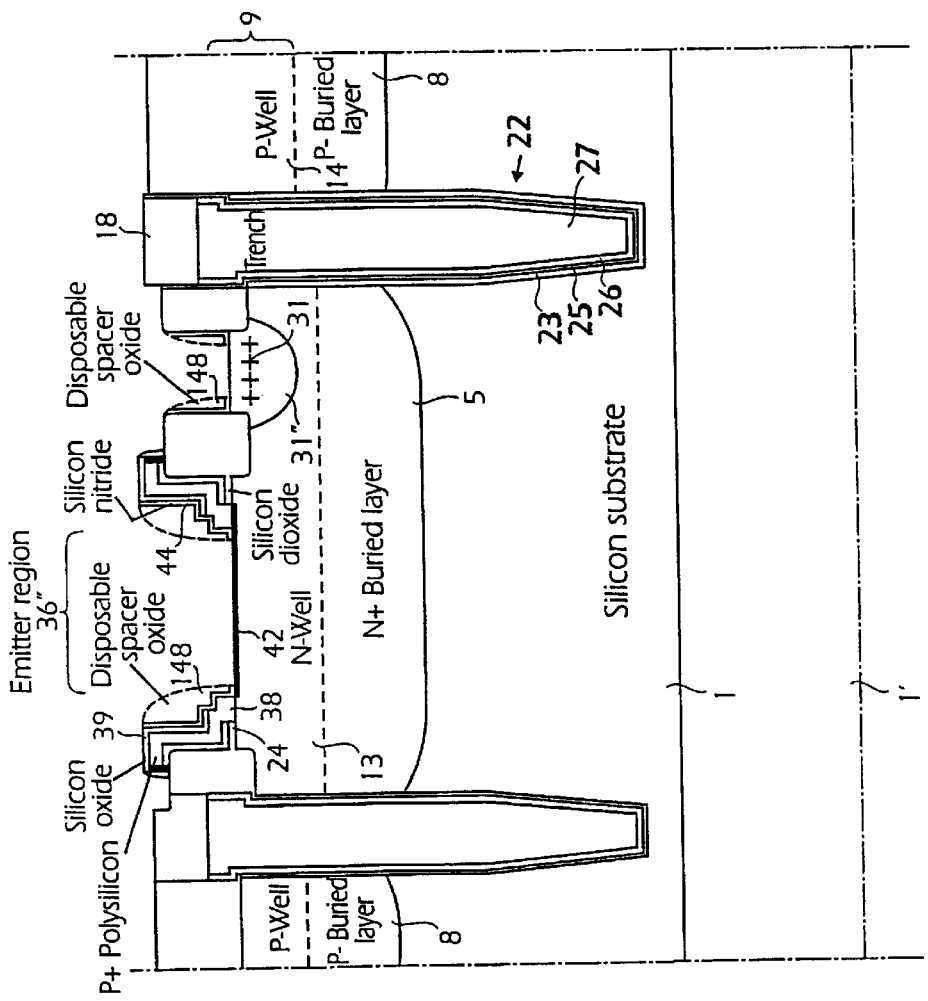
FIG. 25b is a cross-sectional view showing a portion of the cross-sectional view of FIG. 24 after forming spacers of an alternative design.

In an alternative embodiment illustrated in FIG. 25b, in which a so called "disposable spacer" is used, the silicon nitride layer 44 is exchanged by a somewhat thinner nitride layer 144, having a thickness of about 50 nm. Also this nitride layer 144 is conformally deposited over the plate by preferably LPCVD. On top of this nitride layer an about 150 nm thick silicon oxide layer 148 is deposited. This silicon oxide layer 148, which can be constituted of PECVD-TEOS-oxide or SACVD-oxide, is coated over the plate next to conformally. The oxide layer 148 is characterized by being produced at a low temperature, for example at about 400° C., and thereby it does not consist of stoichiometrically composed silicon dioxide but it is considerably more "porous". The last-mentioned property is used in the following step.

After the depositing step the oxide layer 148 and the underlying silicon nitride layer 144 are etched using anisotropic dry etching. In the case as described herein the re-etching is made as a RIE-process having three steps, in which the oxide layer 148 is first removed in a gas mixture of Ar, CHF$_3$ and CF$_4$. The etching is stopped, when the nitride layer 144 has been exposed on flat, horizontal surfaces, e.g. at nitride surfaces on top of the field oxide regions 18, and the side-strings of the porous oxide layer 148 remain on vertical surfaces. Thereupon in step 2 the nitride layer 144 is etched away using the resulting oxide side-strings as a mask, i.e. in principle on all horizontal surfaces. The etching process is stopped, when the surface of the field oxide regions 18 and the silicon oxide layer 42 in the emitter opening has been exposed. Analogous to the preferred embodiment is in step three the remaining oxide layer 42 removed in the emitter opening by RIE, followed by a mild silicon etching in Ar/NF$_3$ for removing surface impurities and radiation damages.

After finished dry etching the emitter opening will be enclosed by a composite side-string or spacer consisting of "porous" oxide/nitride/oxide 148, 144, 39. By subjecting for a short time the composite side string to HF (hydrofluoric acid) the "porous" oxide which is located at the outer side is removed without noticeably attacking regions having thermal oxide. The solving away of the "porous" oxide is advantageously made in HIF-vapour in equipment intended therefor, e.g. "FSI/Excalibur", but alternatively an HF-based wet chemical bath can also be used. The resulting side strings after the etching process will not have approximately triangular cross-sections but their cross-sections will more be like an "L", see FIG. 25b.

The advantage of the method described immediately above comprising a so called "disposable spacer" is that the opening in the polysilicon layer 38 of type P+ will not be narrowed. Thereby the following deposition and the diffusion outwards of dopants from the polysilicon 46 of type N+ is facilitated, i.e. the so called "poly-plug effect" is suppressed.

Figure 25D:
FIG. 25d is a picture of an emitter structure according to FIG. 25b captured by an electron microscope.
Figure 25C:
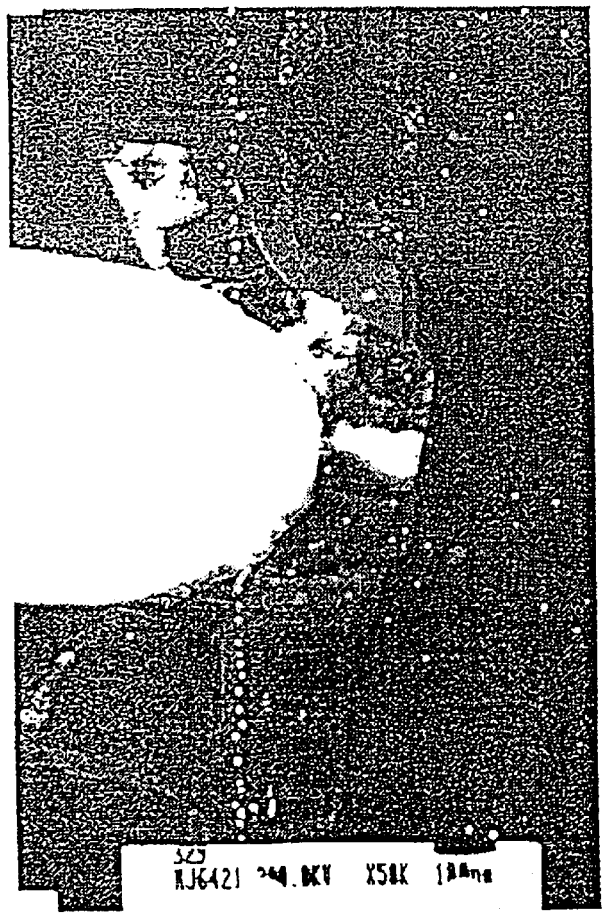
FIG. 25c is a picture of an emitter structure according to FIG. 25a captured by an electron microscope.

In FIG. 25c at the bottom is a cross-section of an NPN-transistor manufactured according to the embodiment described in conjunction with FIG. 25a represented, i.e. having nitride side strings left in the emitter opening. In FIG. 25d a corresponding structure is represented as manufactured using the method comprising a "disposable spacer" according to the discussion above, see also FIG. 25b. The cross-sectional pictures are captured by means of transmission electron microscopy, XTEM.

Figure 26A:
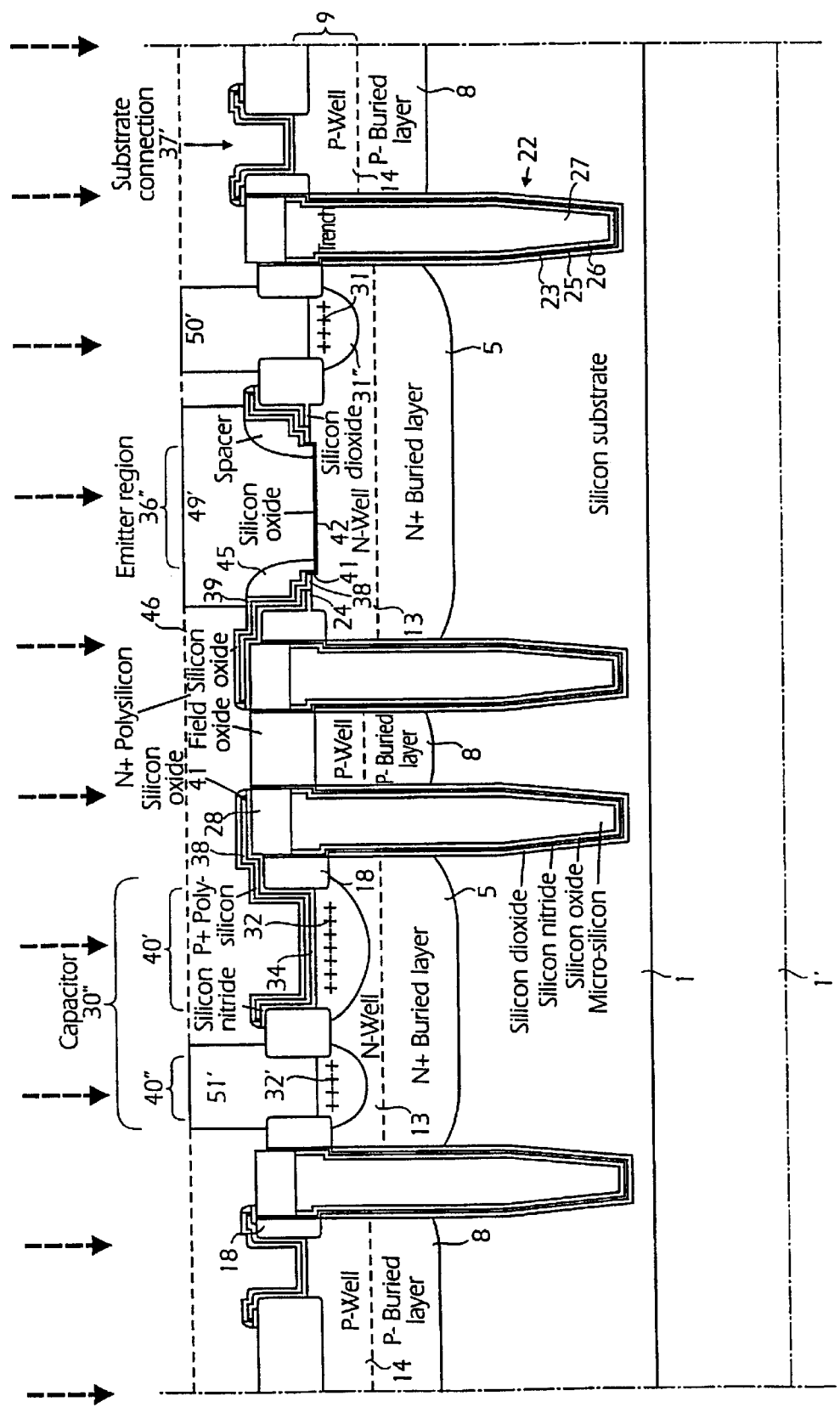
FIG. 26a is a cross-sectional view similar to FIG. 25a showing the state of the plate when forming an emitter, in which a polysilicon layer is shown before and after etching, and showing areas for an NPN-transistor and a capacitor.
Figure 26B:
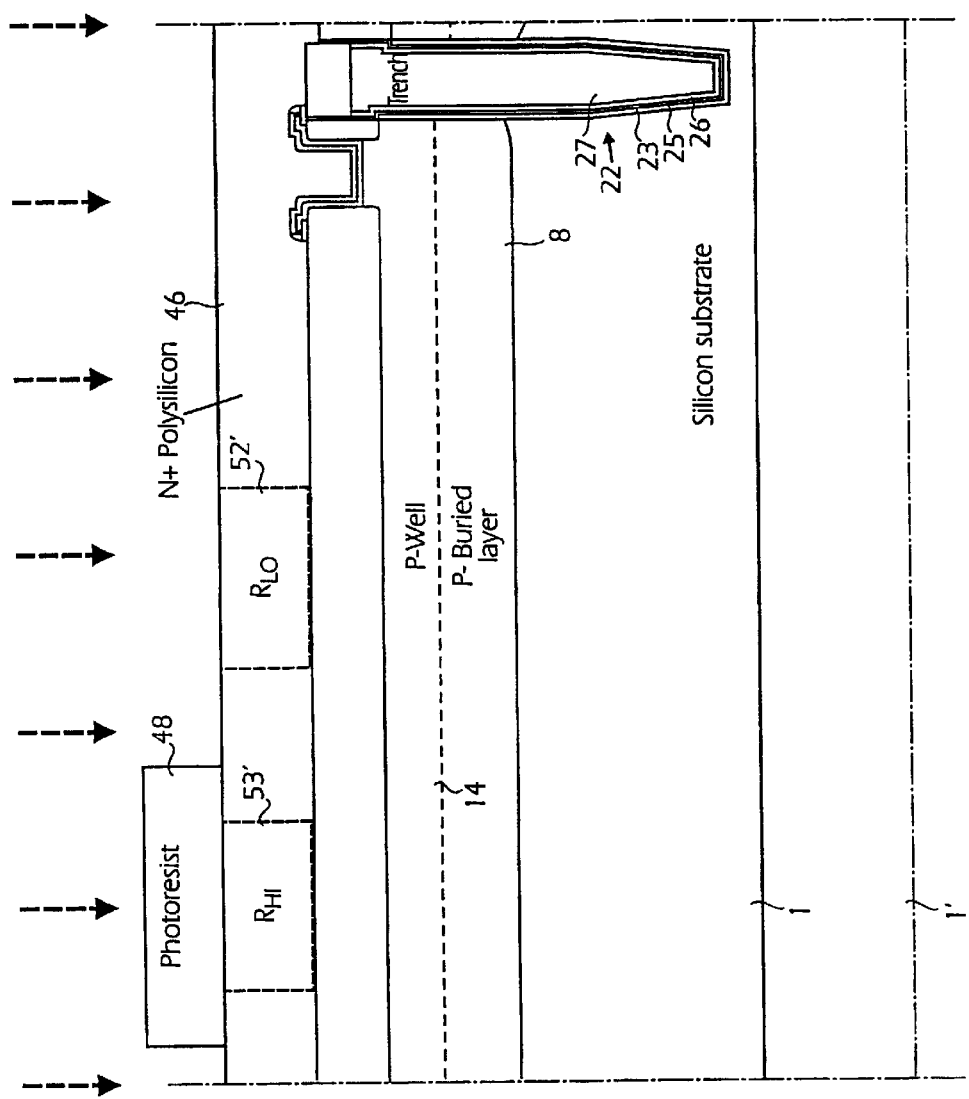
FIG. 26b is a cross-sectional view showing a part of the structure, which partly appears from FIG. 26a, and showing the production of low resistance and high resistance resistors.
Figure 26C:
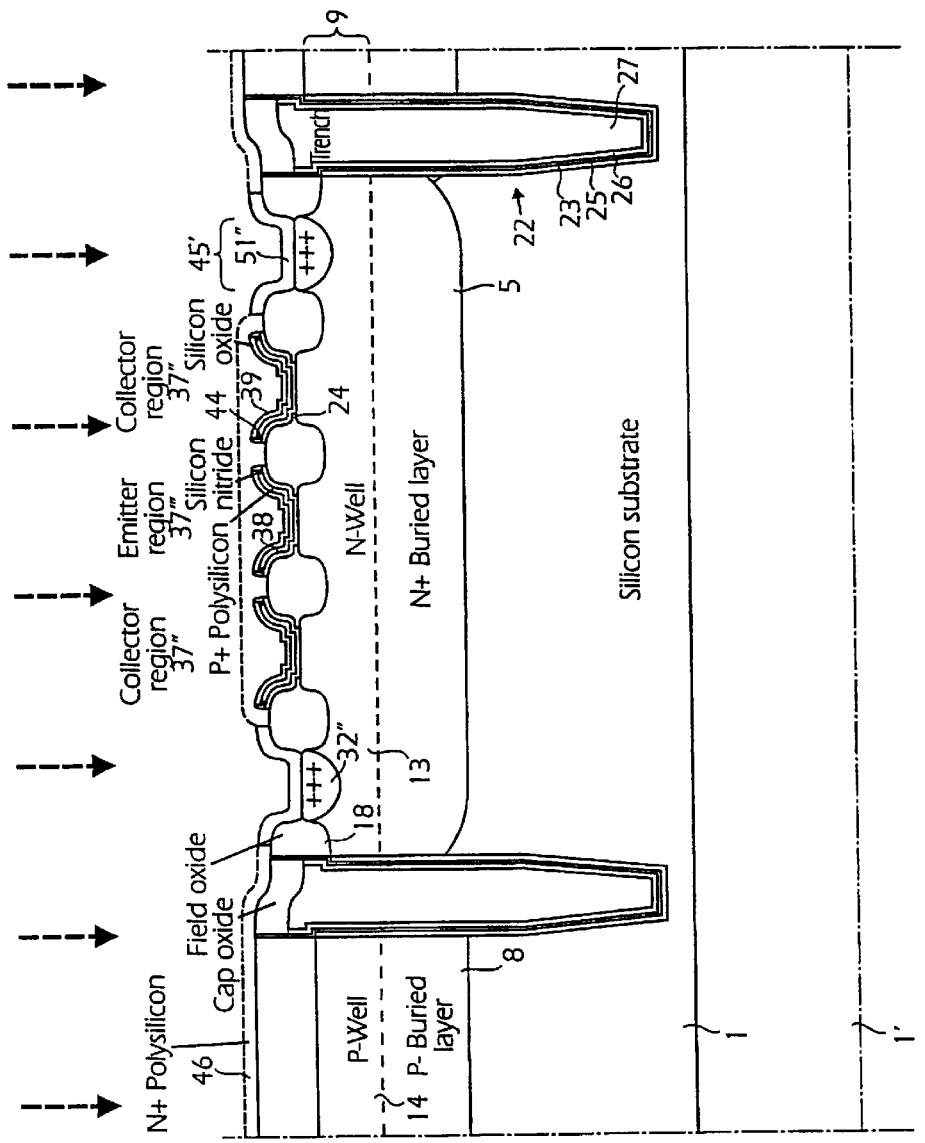
FIG. 26c is a cross-sectional view similar to FIG. 26a showing an area for a lateral PNP-transistor.

After exposing the monocrystalline silicon surface in the emitter opening 36" and at the collector plug 31" of the NPN-transistor to be manufactured and at the contact area in the region 40" of the bottom capacitor electrode 32 and at the base connection of the lateral PNP-transistor to be manufactured an about 250 nm thick polysilicon layer 46 is deposited by LPCVD, see FIGS. 26a and 26c. The polysilicon layer 46 is thereupon doped by preferably ion implanting arsenic and/or phosphorous, as is illustrated by the dashed arrows in FIGS. 26a and 26c. It should be observed that the polysilicon layer 46 is shown both before, bounded by a dashed line, and after, bounded by a solid line, the final patterning, which will be described hereinafter.

In the preferred embodiment this ion implantation is made in three operational steps before a patterning procedure described hereinafter of the directly before applied polysilicon layer 46 is executed. In the first step arsenic is implanted globally over the plate in a dose of about $3 \cdot 10^{15}$ ions/cm$^2$ and at an energy of about 50 keV. Thereupon the plate is lithographically patterned by applying a photoresist layer 48 and making openings therein, then leaving the photoresist layer 48 on portions of the plate where high resistance resistors, so called $R_{HI}$, later will be defined. Using this photoresist layer 48 as a mask another arsenic implantation is made but this time in a dose of about $1.2 \cdot 10^{16}$ ions/cm$^2$ and at an energy of about 150 keV, the situation being illustrated in FIG. 26b. It should be observed that all portions on the plate, except the regions for high resistance resistors $R_{HI}$, obtain both implantations.

Thereupon the plate is once more lithographically patterned, and then regions for low resistance resistors $R_{LO}$ are defined. In the last-mentioned case a photoresist layer applied for this patterning step and not shown will remain on all portions of the surface of the plate except on openings for low resistance resistors $R_{LO}$. Using this photoresist layer as a mask phosphorous is implanted at an energy of about 25 keV and in a dose of about $4 \cdot 10^{15}$ ions/cm$^2$. These operations do not appear from the figures, see however FIG. 26b. After finishing the production steps described herein the implantation procedure as mentioned above results in that high resistance resistors $R_{HI}$ having a surface resistance of about 500 ohms/square and low resistance resistors $R_{LO}$ having a surface resistance of about 100 ohms/square are obtained. A small adjustment of the implantation dose and/or energy can naturally be made in order to compensate for other process variations.

After finishing the varied doping of the polysilicon layer 46 this layer is patterned, as has been indicated above, in a conventional lithographic way. Then contact areas of the emitter 49' and the collector 50' for the NPN-transistor to be manufactured, the contact area 51' for the bottom electrode of the plate capacitor to be manufactured, see FIG. 26a, the base connection 51" with the lateral PNP-transistor to be manufactured, see FIG. 26b, and low resistance 52' and high resistance 53' resistors, $R_{LO}$ and $R_{HI}$, respectively are defined, see FIG. 26b. At those places where the polysilicon layer 46 has a direct contact with the monocrystalline silicon surface in the emitter opening 49", this highly doped polysilicon layer will in a later stage of the manufacturing process serve as a dopant source when "drving-in" the emitter, i.e. when making the dopant of the polysilicon layer 46 diffuse, in the intrinsic base region. Using a photoresist layer patterned therefor as a mask, not shown in the figures, but the result of which can be partly seen in FIGS. 26a and 26c, the polysilicon layer 46 doped to N+ is etched away, until the surface of the directly underlying field oxide regions 18 is exposed. This etching process is made preferably by RIE in a plasma consisting of $Cl_2$, HBr and $O_2$. After etching the polysilicon layer 46 the photoresist layer is removed in some known way.

Thereupon the oxide layer 39 is etched away, which is located on top of the previously produced polysilicon layer 38 of type P+. This etching process which is preferably made by dry etching, can either be made globally over the surface or in the preferred way be made after lithographically defining relevant parts, as will be described hereinafter.

Figure 27A:
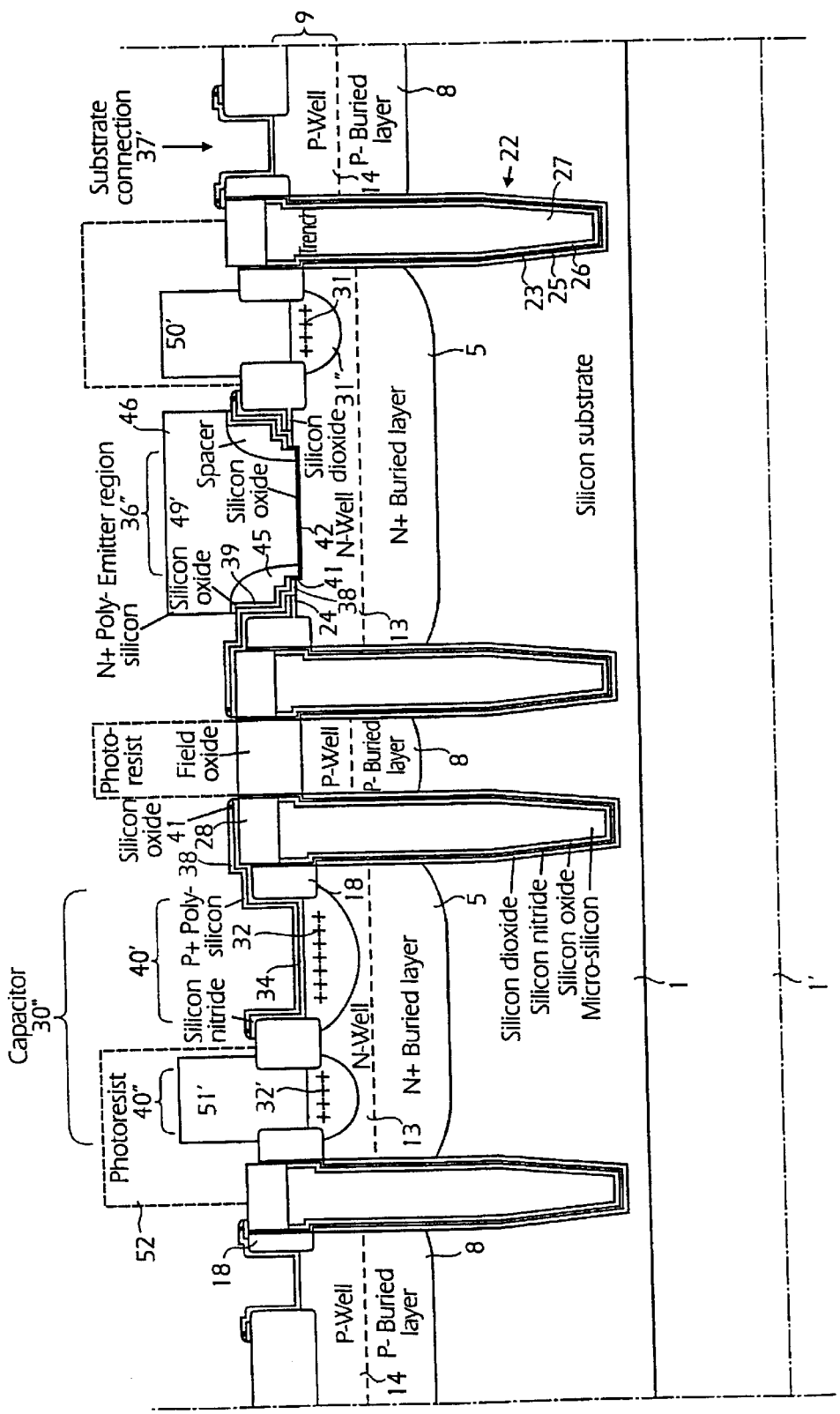
FIGS. 27a and 27b are cross-sectional views similar to FIG. 26a and 26c respectively after etching oxide layers applied on top of a polysilicon layer doped to P+.
Figure 27B:
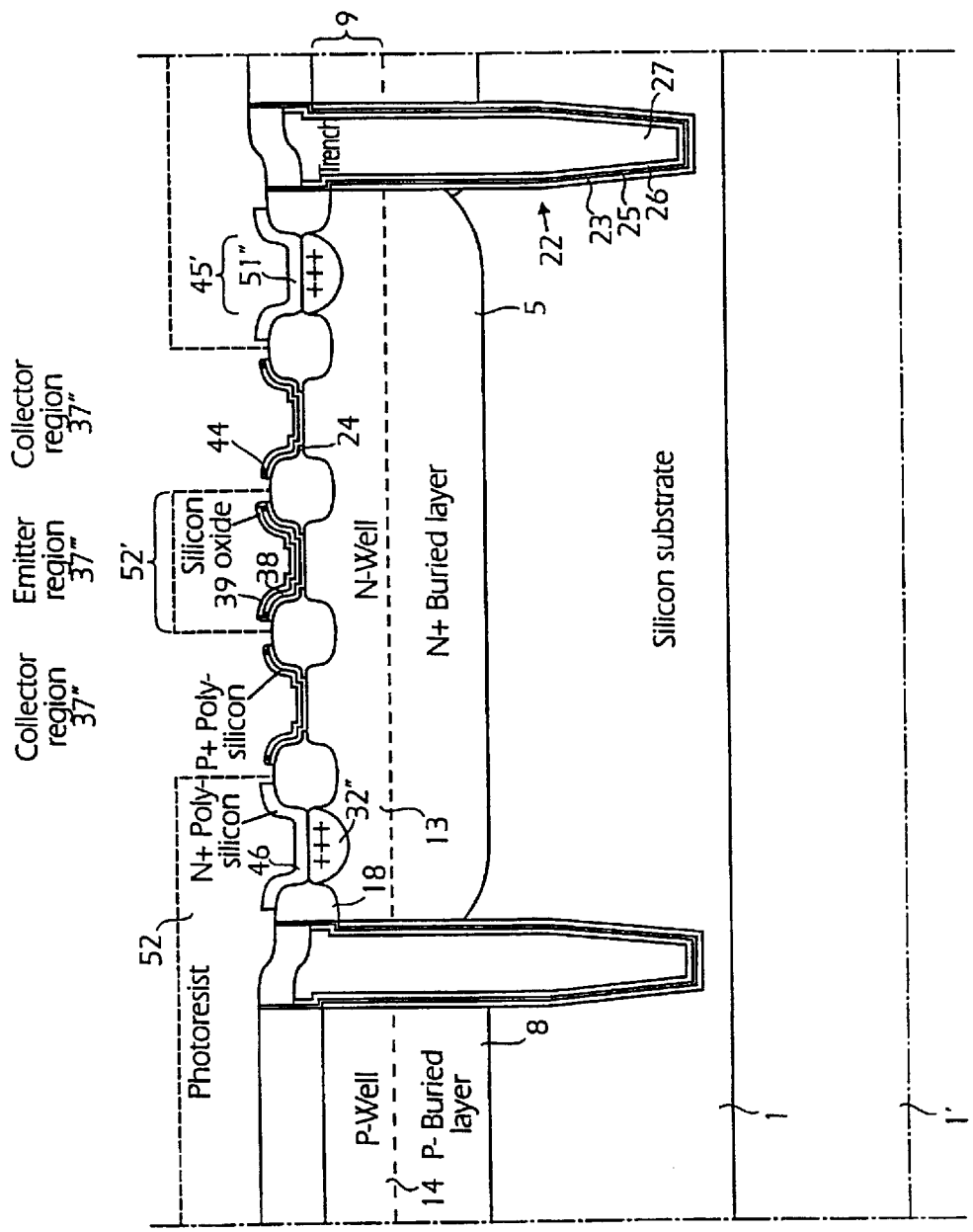

In the preferred embodiment thus the plate is first lithographically patterned and thus openings are made in a photoresist layer 52 applied over the polysilicon layer 38 and other regions, among other places over the regions of the later applied polysilicon layer 46, see FIGS. 27a and 27b. Thereupon the oxide layer 39 is etched away in the openings in the photoresist layer 52 by dry etching, such as RIE, in a plasma consisting of Ar, $CHF_3$ and $CF_4$. The etching is stopped, when the polysilicon layer 38 has been exposed in the openings. The advantage of this procedure not comprising a global etching and instead a lithographic patterning before the etching is that the field oxide regions 18, which otherwise would have been eroded in the dry etching step, are protected by the photoresist layer 52 and thereby remain intact. A further advantage is that the oxide layer 39 can be left on those portions where silicide, see hereinafter, is not desired, for example at the region 52' for the emitter of the lateral PNP-transistor to be manufactured, see FIG. 27b. This gives the process a better reproducibility. The result after etching oxide, according to the process described directly above, is illustrated in FIGS. 27a and 27b.

After the finished etching process the photoresist layer 52 is removed in some known way. A thin silicon oxide layer 56, about 30 nm thick, is thereupon deposited over the surface of the plate, see FIGS. 28a and 28b. In the preferred embodiment this deposition of oxide is made by thermal decomposition of TEOS. However, the oxide layer can be deposited using other methods, e.g. LTO or PECVD. On top of the now applied oxide layer 56 is then an about 100 nm thick silicon nitride layer 58 deposited by preferably LPCVD. This nitride layer 58 is conformally applied over the surface of the plate.

After this deposition of the nitride layer 58 the plate is annealed at a high temperature for making the previously implanted dopants diffuse and activate them. In the preferred embodiment this annealing operation is made in two steps. First the plate is annealed in an oven at 850° C. for about 30 minutes in a gas mixture of oxygen gas and nitrogen gas, in the purpose of distributing the dopants more evenly in the implanted layer. Thereupon the plate is annealed again, in a nitrogen gas atmosphere at about 1075° C. for about 16 seconds, in a so called RTA-equipment ("Rapid Thermal Annealing"). In the preferred embodiment a so called "Hotliner" in the RTA-equipment is used for controlling the temperature during this step of making dopants diffuse. The combination of diffusion temperature and time duration for processing in the RTA-equipment can be varied somewhat depending on the data which are required for the transistor to be manufactured. It should be observed that during this annealing operation the silicon nitride layer and the silicon oxide layer remain as protective layers over the plate in order to prevent diffusion of implanted dopants out into the surroundings.

In this annealing operation the arsenic, which was implanted in the upper polysilicon layer 46 of type N+, will by diffusion penetrate into the intrinsic base and there form the emitter-base junction 61'. In the total manufacturing process described herein the emitter depth is about 60 nm and the remaining thickness of the intrinsic base, under the emitter, about 100 nm. The concentration of arsenic in the emitter opening in the contact region between the surface of the epitaxial monocrystalline silicon layer 9 and the polysilicon layer 49' of type N+ is typically about $4 \cdot 10^{20}$ atoms/cm$^3$. The corresponding concentration of boron, in the intrinsic base, in the emitter-base junction is typically about $8 \cdot 10^{17}$ atoms/cm$^3$.

Simultaneously the boron which has been implanted in the polysilicon layer 38 of type P+ will owing to diffusion penetrate into and connect to the intrinsic base. For the total manufacturing process described herein the extrinsic base depth is about 200 nm and the corresponding concentration of boron in the border surface between this polysilicon layer 38 of type P+ and the epitaxial monocrystalline silicon layer 9 is typically about $2 \cdot 10^{19}$ atoms/cm$^3$. The highly doped region of type P+ resulting thereby is called the extrinsic base. The substrate contacts 60' are analogously formed by diffusion of boron out of the polysilicon layer 38 of type P+, see FIG. 28a. Analogously collector electrodes 62" and emitter electrodes 62''' are formed for the lateral PNP-transistor to be manufactured, see FIG. 28b.

Figure 29:
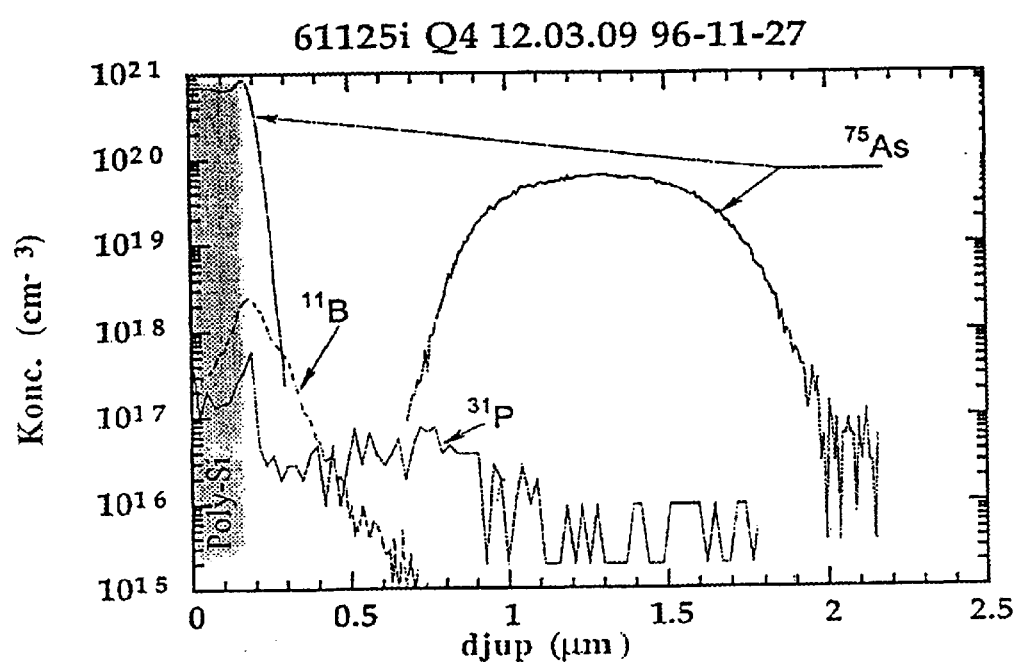
FIG. 29 is a diagram showing a dopant profile of a manufactured NPN-transistor, the profile being captured by means of SHIMS.

In FIG. 29 the profile of dopants below the polysilicon emitter of type N+ as measured by means of SHIMS is represented. The thickness of the polysilicon is indicated by the shaded portion at the left in FIG. 29. Some broadening of the arsenic signal, derived from the emitter, has taken place in the analysis. Consequently, the rear arsenic edge will extend deeper into the captured boron signal (which indicates the extension of the base) than what is actually true.

Figure 30:
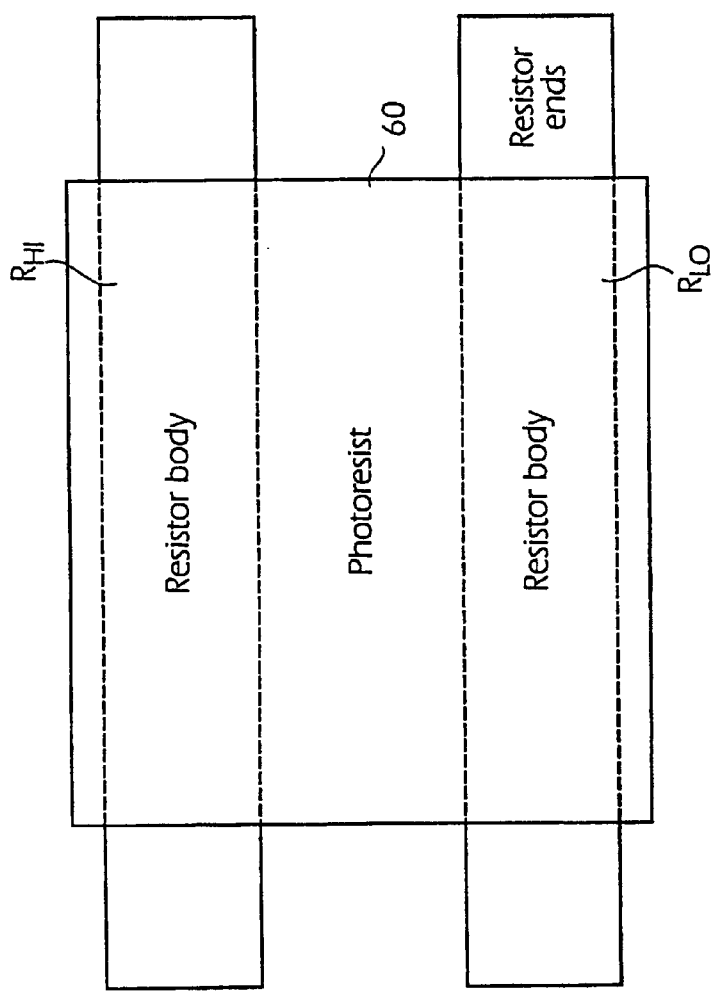
FIG. 30 is a view from above of a protective mask layer applied on top of resistors when etching the spacers shown in FIGS. 28a and 28b.

After the annealing operation to make the dopants diffuse the plate is lithographically patterned, so that after the patterning a protective layer 60 of photoresist will remain only over the resistor bodies of the resistors R$_{HI}$ and R$_{LO}$, see FIG. 30. End portions of the resistors will be exposed. After patterning the photoresist layer 60 the silicon nitride layer 58 and the silicon oxide layer 56 are etched away in the surface portions not covered by the photoresist layer 60, the etching being made by anisotropic dry etching, so that so called spacers or side strings 54 are formed along the edges of the polysilicon layer 46 of type N+, see FIG. 28a. In the case where the oxide layer 39 has been left on for example the emitter of the lateral PNP-transistor to be manufactured, for avoiding silicide formation, this etching of oxide is stopped, after removing the layer 56, before these portions have been exposed, see FIG. 28b. The process described herein in the manufacture of such so called spacers of silicon nitride on top of a thin silicon oxide layer is in substantial portions similar to the manufacturing process as described in U.S. Pat. No. 4,740,484 for H. Norstram et al. In the preferred embodiment an anisotropic, i.e. dependent on direction, plasma etching process is used for removing the silicon nitride layer. The etching process, which preferably employs the gases SF$_6$, HBr and O$_2$, is stopped, when all silicon nitride on the horizontal field oxide regions 18 of the plate has been removed. Since the silicon nitride layer 58 has been deposited in a well conformal way, i.e. having a covering of a homogeneous thickness over all of the surface, after the etching process strings of silicon nitride, spacers, will remain along the sharp steps or shelves on the surface of the plate, which have been produced by the patterned polysilicon layer 46 of type N+. Thereupon the thin silicon oxide layer 56 is etched away by RIE, and then the side strings or spacers 54 will obtain their final shape. This etching process, which preferably employs the gases Ar, CHF$_3$ and CF$_4$, is stopped, when both surfaces of the polysilicon layer 46 of type N+ and of the polysilicon layer 38 of type P+ have been exposed.

Figure 28A:
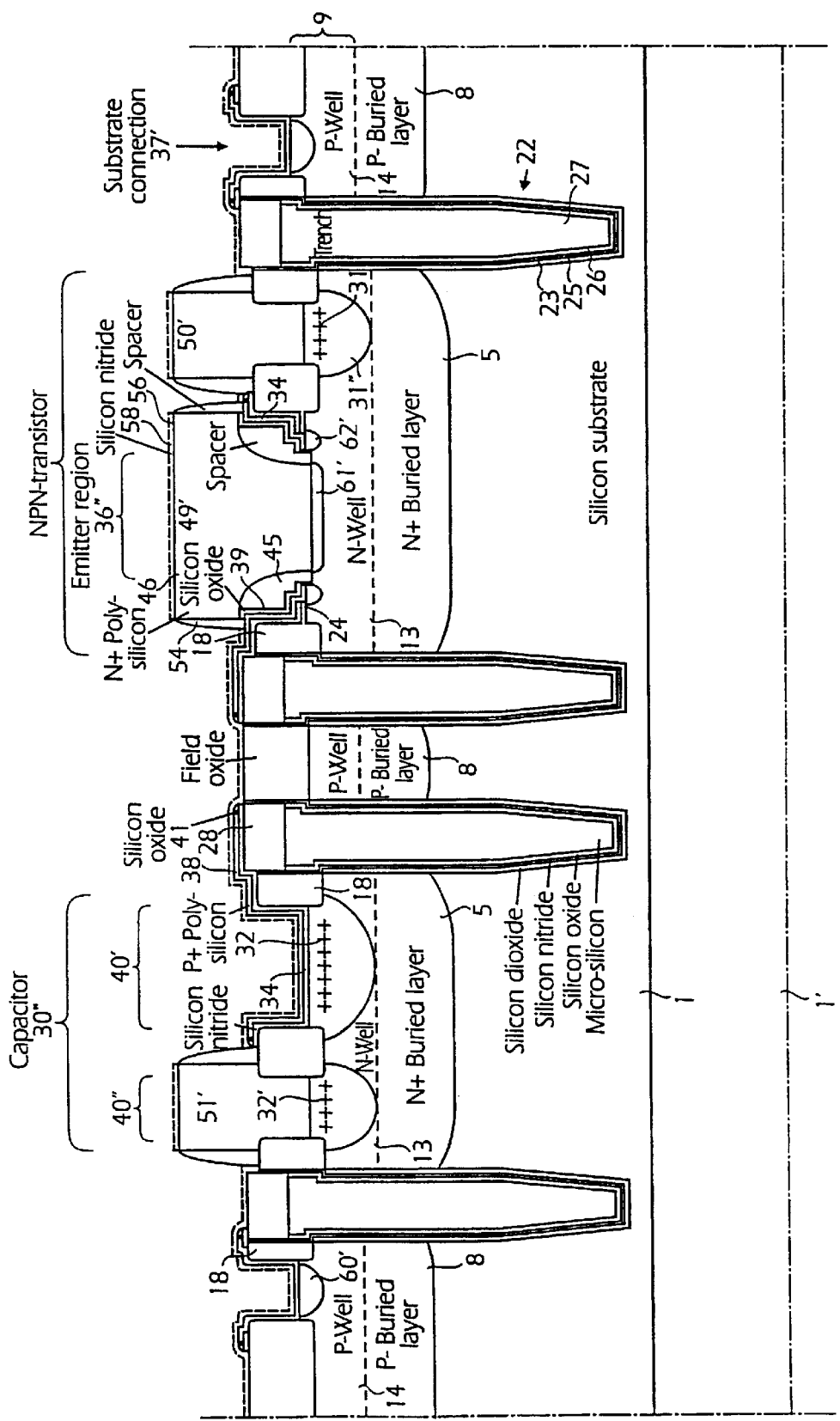
FIGS. 28a and 28b are cross-sectional views similar to FIGS. 27a and 27b respectively after making emitter and base areas by diffusion and etching in order to produce additional spacers.
Figure 28B:
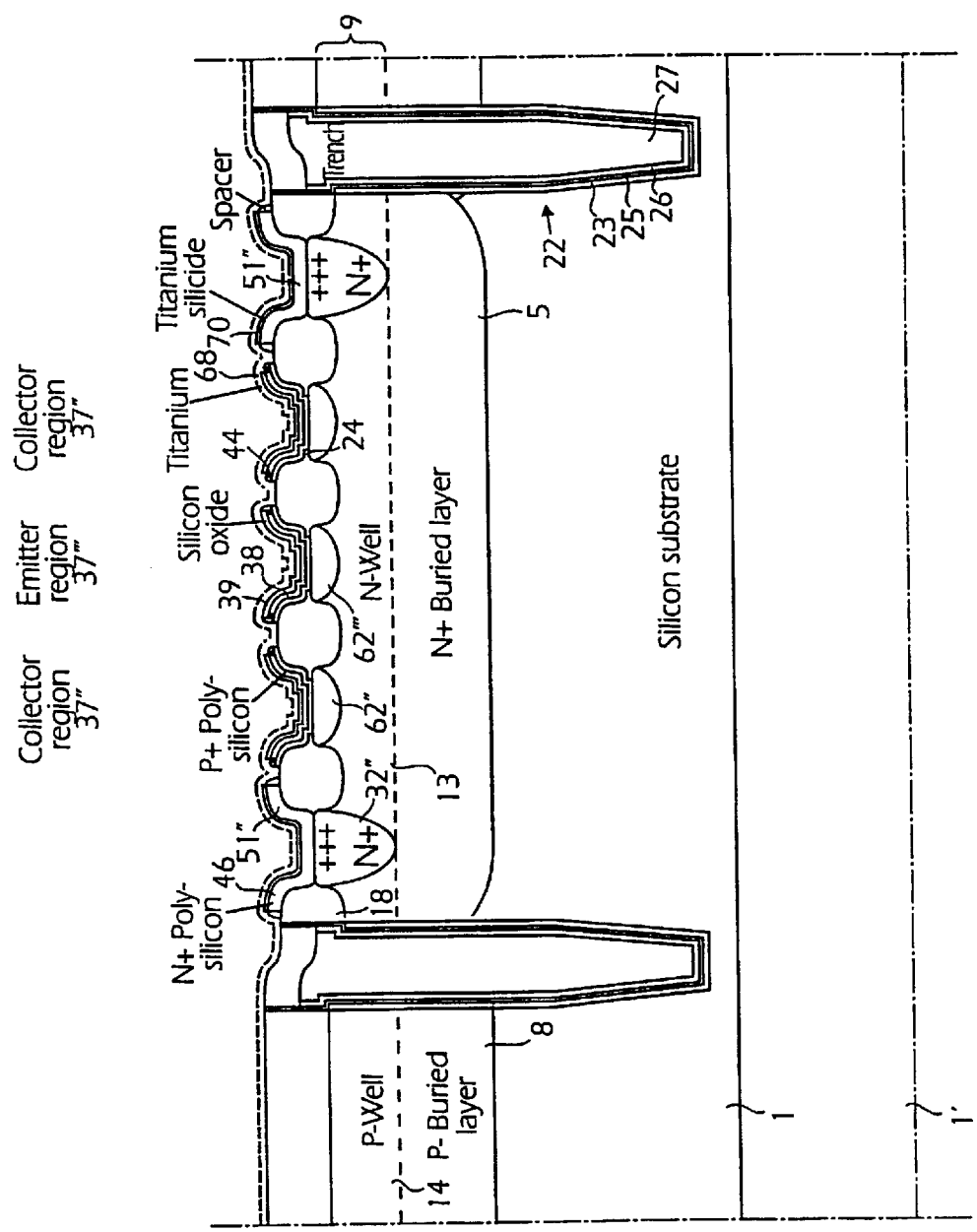
Figure 31:
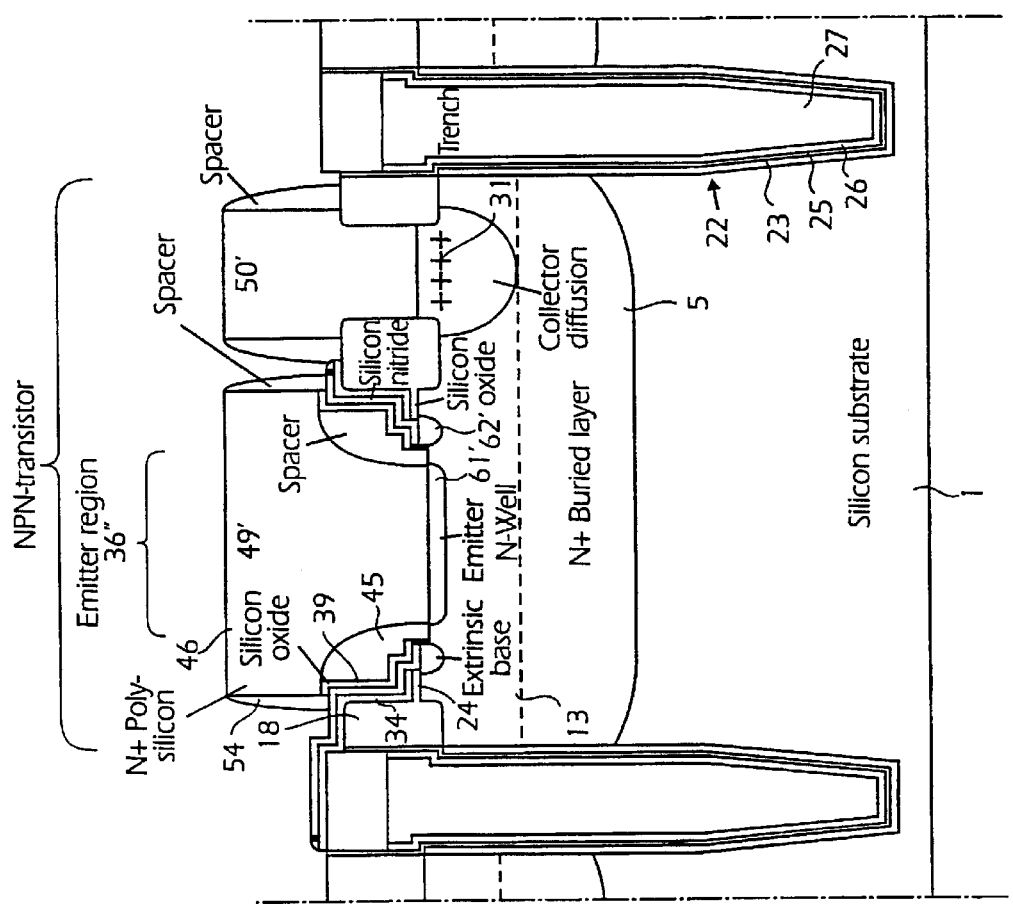
FIG. 31 is a part of the cross-sectional view of FIG. 27a showing only the produced transistor.
Figure 32A:
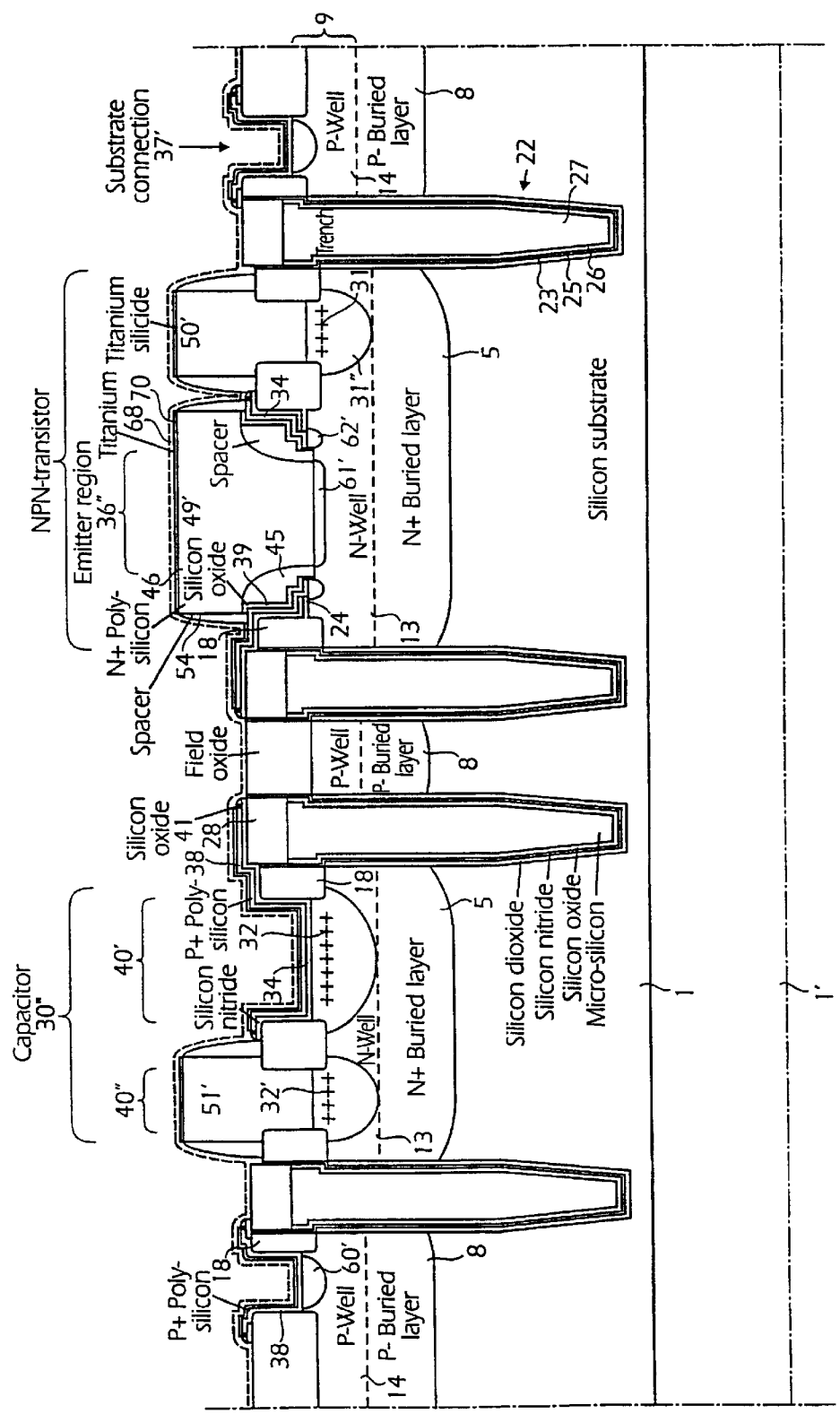
FIGS. 32a and 32b are cross-sectional views similar to FIGS. 28a and 28b respectively after depositing titanium and silicidizing and chemical removal of titanium and titanium nitride.
Figure 32B:
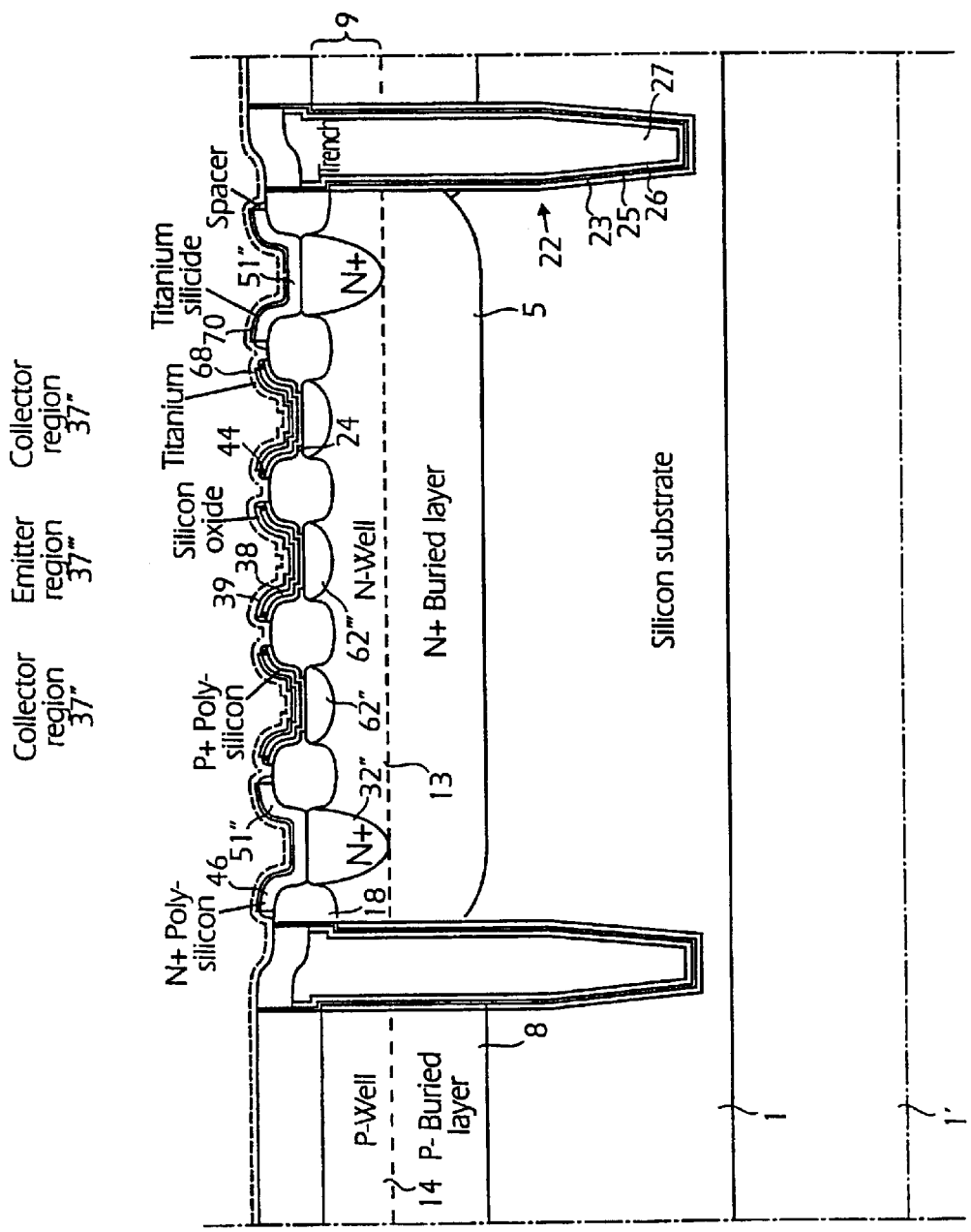

Thereupon the photoresist layer 60 is removed in some known way. The result is shown by FIGS. 28a, 28b and 31. The latter figure is a picture in a large scale of the region where an NPN-transistor is to be manufactured, after making dopants at the emitter and base diffuse into the adjacent material and after etching for producing side strings. It appears from FIG. 31 that the extrinsic base region which is lithographically defined by the opening in the silicon nitride layer 34 and the silicon oxide layer 24, is well separated from the most adjacent edge of field oxide regions 18. Thereby, as has been noted earlier in conjunction with the description of FIG. 16, the capacitance between collector and base will be reduced in the NPN-transistor to be manufactured.

After removing the photoresist layer 60, if desired, the polysilicon layer 46 of type N+ and the polysilicon layer 38 of type P+ can be provided with a thin silicide layer in order to reduce the resistance of conductors to the different electrode regions of the components to be manufactured—these conductors will then be shunted by such a silicide layer. This silicide layer can be constituted by e.g. PtSi, CoSi$_2$ or TiSi$_2$. In the preferred embodiment titanium disilicide TiSi$_2$ is used, which is formed using a so called "self aligning method" on top of exposed silicon surfaces. Since the resistor bodies are not exposed but are protected by the remaining portions of the silicon nitride layer 58, no silicide is obtained thereon.

In such a self-aligned silicidation ("SALICIDE"), see U.S. Pat. No. 4,789,995 for Brighton et al. and U.S. Pat. No. 4,622,735 for Shibata, a thin metal layer 70 is deposited, in this case a layer of titanium having a thickness of about 50 nm, preferably by sputtering, over the surface of the plate, see FIGS. 32a and 32b. The metal layer is thereupon made to react for a short time, for about 20 seconds, with exposed silicon at an elevated temperature of about 715° C. in a nitrogen gas atmosphere in an RTA-equipment. In certain cases also a mixture of oxygen gas and ammoniac can be employed. Thereupon the titanium is solved away which has not reacted with silicon, i.e. from those portions which before the application of metal had no exposed silicon surface, by wet chemical methods. This etching step, which selectively removes titanium which has not reacted, affects the very titanium silicide only to a small extent. After the wet chemical etching process the plate is annealed at about 875° C. for about 30 seconds, so that a low resistive form of titanium disilicide is formed. The silicide layer thus produced which has a surface resistance of about 2–5 ohms/square will then only exist on the previously exposed silicon surfaces of the plate, i.e. be self-aligned with these surfaces.

Figure 33:
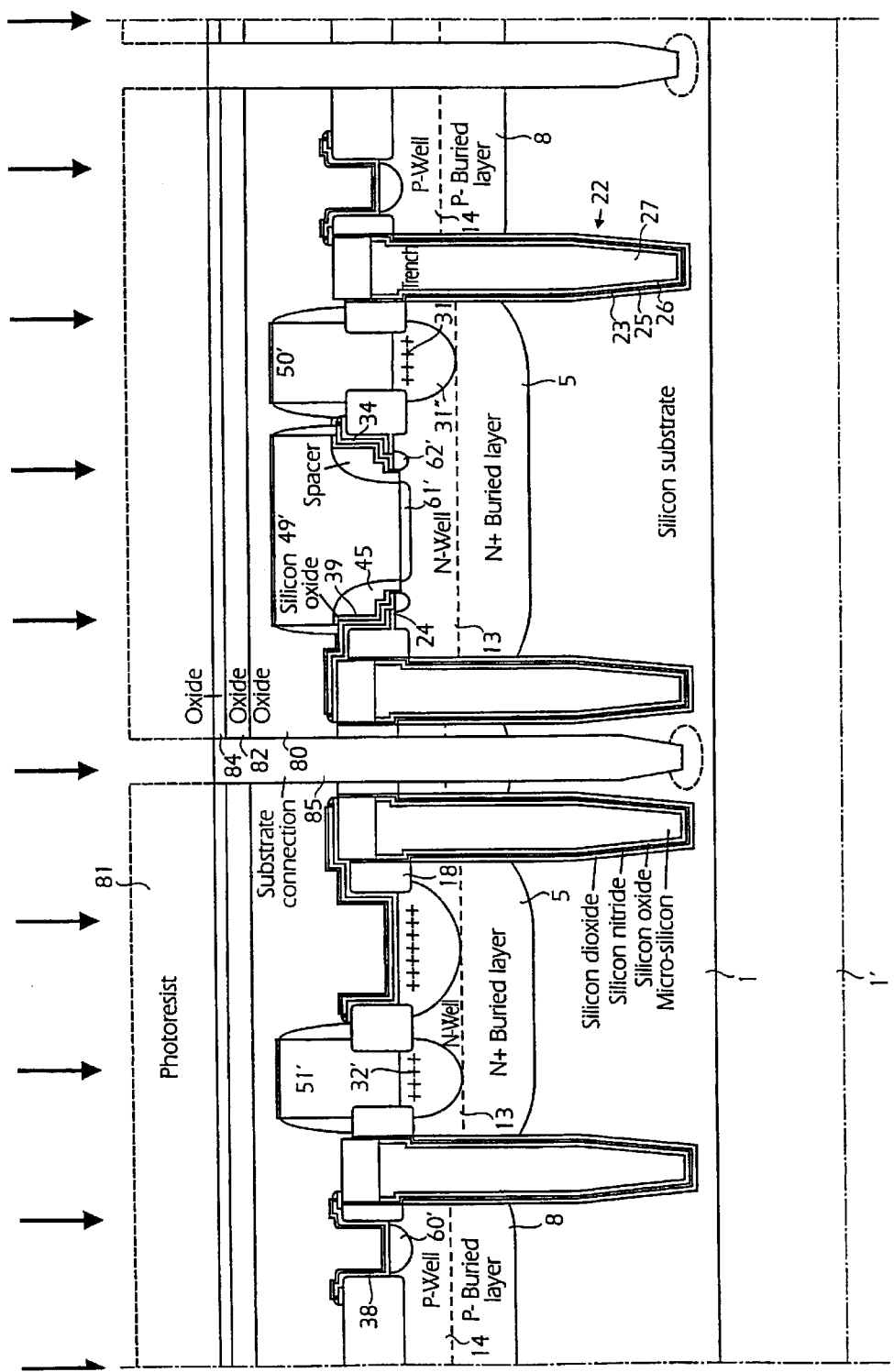
FIG. 33 is a cross-sectional view similar to FIG. 32a after etching deep contact holes for electrical connection of a substrate.

After silicidation a passivating layer 80 of silicon oxide is deposited, see FIG. 33. This oxide layer 80 can preferably be constituted of a TEOS-based oxide, which has been either deposited by thermal decomposition or using PECVD. The oxide layer 80, which will later be planarized using so called Resist Etch Back (REB), is deposited to a thickness of about 1 µm. Thereupon a photoresist layer is applied, not shown in the figures, having a thickness also of about 1 µm, as measured on large flat portions, over the surface of the plate. The resist layer is thereupon subjected to heat for a couple of minutes at about 190° C. Owing to the surface smoothing properties of the resist the top surface thereof will be relatively flat in spite of the topography of the underlying surface, which can be rather uneven or rough. The plate is then plasma etched for removing this photoresist layer and also projecting or protruding portions of the passivating layer 80 of silicon oxide in the same velocity. Thereby as a final result is achieved, after a complete removal of the photoresist layer, that the surface of the passivating oxide layer 80 obtains an evened topography, i.e. that the surface becomes rather flat and horizontal. This planarizing method (REB) is described in A. C. Adams, C. D. Capio, "Planarization phosphorous doped silicon dioxide", Journal of the Electrochem. Soc., Vol. 128, 1981, pp. 423 ff.

The planarized oxide layer 80 is thereupon coated with an about 400 nm thick doped silicon oxide layer 82. This oxide layer 82, which is formed by TEOS-based oxide, is preferably doped with about 4% phosphorous for the purpose of obtaining so called gettering, in order to bind easily diffusing Na-ions. Also other combinations of dopants are conceivable, e.g. 3% boron and 6% phosphorous. On top of the doped oxide layer 82 is then deposited, preferably by PECVD, an about 250 nm thick undoped TEOS-oxide layer 84. This silicon oxide layer will later act as a so called hard mask. The silicon oxide layers are then densified by annealing in nitrogen gas at 700° C. for a time duration of about 40 minutes. Alternatively an RTA-process can be used at 875° C. for 20–30 s. This RTA-process can also replace the earlier performed annealing for producing low resistivity titanium disilicide.

In the preferred embodiment the plate is then lithographically patterned whereby deep substrate contacts are defined. These are obtained by first transferring the pattern of am applied photoresist layer 81 to the underlying oxide layer 84 (82, 80) by anisotropic plasma etching. Thereupon the photoresist layer 81 is removed in some known way and about 7 µm deep holes 85 are made down into the substrate (9, 1) by dry etching. The process is analogous to that described for etching trenches 22 for the purpose of isolation. When etching the holes 85 for contacting the substrate 1, the topmost oxide layer 84, the so called hard mask, will be completely or partly consumed. The result after etching substrate connections is shown in FIG. 33.

After etching the substrate connection holes 85 boron is implanted in the plate in a dose of about $3 \cdot 10^{15}$ ions/cm$^2$ and at an energy of about 30 keV, what is illustrated by the arrows in FIG. 33. The implantation energy is so adjusted that the boron atoms are blocked by the doped layer 82 of passivating oxide and only are capable of penetrating into the silicon substrate by first passing through the openings of the holes 85. After the implantation the plate is annealed at typically 875° C. in oxygen gas for about 30 seconds. The advantage of producing and implementing the deep substrate contacts mentioned above in manufacturing IC-circuits for radio frequency use is described in the International Patent Application PCT/SE97/00487.

Figure 34A:
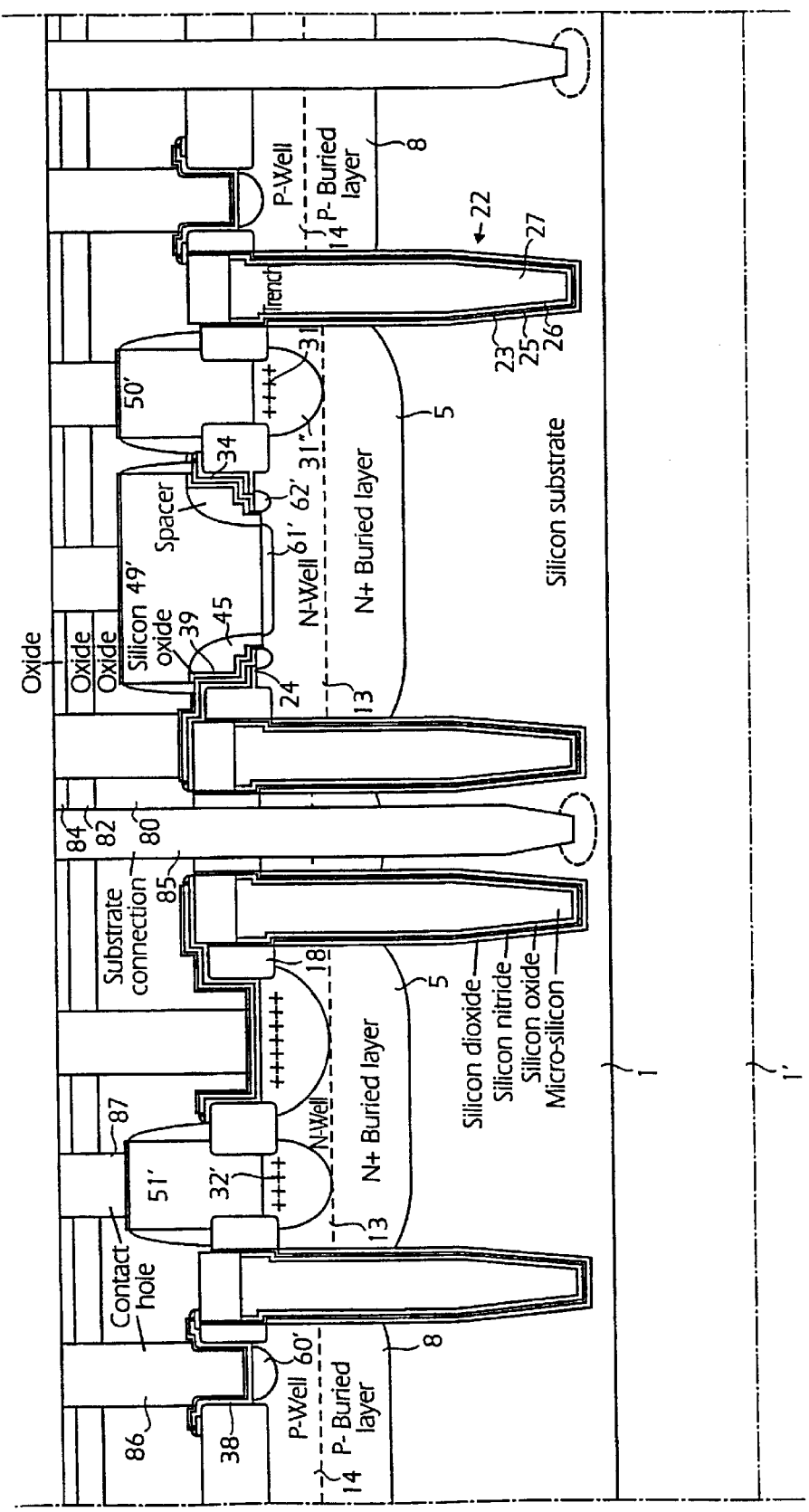
FIGS. 34a and 34b are cross-sectional views similar to FIG. 33 after etching all contact holes.
Figure 34B:
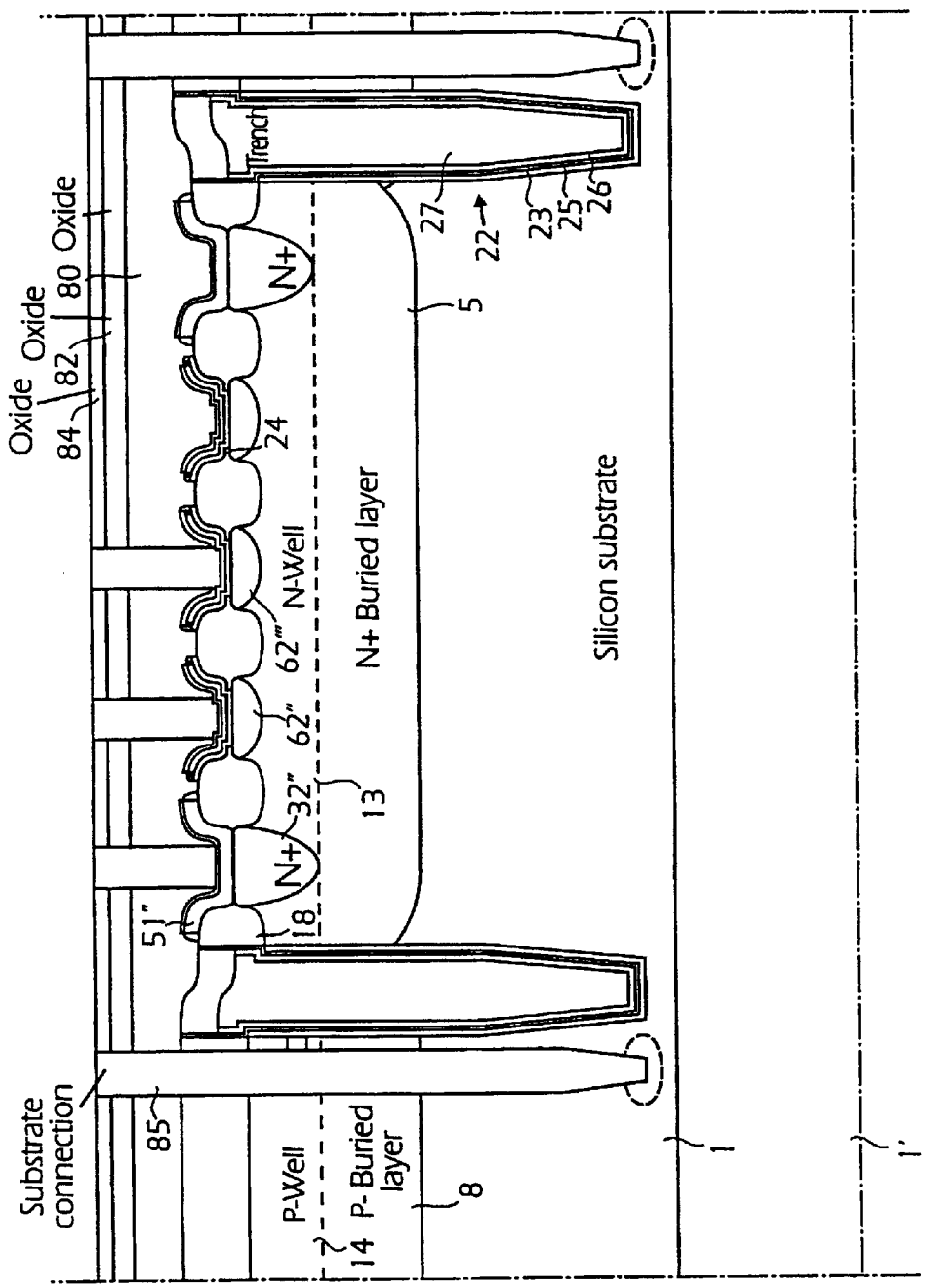

After implantation and annealing the plate is again coated with a photoresist layer and this time contact holes are patterned for active and passive components, see FIGS. 34a and 34b. Contact holes 86, 87 are then made in the laminated oxide layer 82, 80 musing anisotropic plasma etching. Owing to different depths of the contact holes, owing to the underlying topography, fixed time durations are used for the etching. Some connection layers will thereby be subjected to a stronger over-etching than other ones depending on the topographic differences. After this etching of contact holes the photoresist layer is removed in some known way. In this situation thus both contact holes 86 for connection to the substrate 1 and contact holes 87 to the connections of passive and active components will be defined. The result is illustrated by FIGS. 34a and 34b.

The plate is thereupon coated with a two layer structure or a sandwich structure by sputtering, the coated structure consisting of at the bottom an about 100 nm layer of Ti and on top thereof a layer of TiN having a thickness of about 50 nm. In the preferred embodiment the Ti-layer is deposited by sputtering in a so called "Ion Metal Plasma"-equipment (IMP-equipment), e.g. a "Vectra Source" (trademark for the company Applied Materials) in order to be better capable of coating the bottom of the deep substrate contact holes 85. The TiN-layer is deposited by reactive sputtering, such as in gas mixture of Ar and $N_2$. It can be performed by using so called collimating methods, also called coherent sputtering. Deposition of the TiN-layer can also be made by reactive sputtering using IMP-Vectra Source analogously to the Ti-layer.

After depositing the contact metal layer of Ti and the layer of metal nitride TiN, which forms a barrier layer for the underlying metal layer, the plate is annealed at an elevated temperature whereby the Ti-layer is made to react with underlying silicon, at those places where free silicon surfaces exist, i.e. in the substrate contact holes, or with titanium silicide layers, i.e. in the contact holes for components. In the preferred embodiment this annealing is made in an oven in a mixture of $N_2$ and $H_2$ at typically about 600° C. for about half an hour. Alternatively annealing can be made in an RTA-equipment at a higher temperature and for a shorter time duration, for example in an atmosphere of $N_2$ or ammoniac. It can also be used for reinforcing the barrier in the deep substrate contacts, so that the implanted boron atoms diffuse into the substrate material.

Thereupon an about 1 µm thick tungsten layer is deposited by CVD. This deposition process which has a good conformity is made over all of the surface of the plate. Thereby all contact holes will be completely and conformally filled with tungsten. Directly connected to the deposition process of tungsten a re-etching step is made which intends to remove all tungsten from the flat, i.e. horizontal, portions of the plate. The etching process is stopped when the surface of the TiN-layer has been exposed. Thereby tungsten will remain in the contact holes and form so called contact plugs.

Thereupon a first conductor layer is deposited consisting of about 50 nm TiN, which is deposited in the same way as above and is covered by an about 600 nm thick layer of aluminum. The aluminum layer, which is deposited by sputtering, preferably contains 0.5–2.0% copper in order to suppress electromigration. The used layer thicknesses of these metal layers can somewhat vary depending on the application intended. On top of the aluminum layer a thin layer of TiN having a thickness of typically about 50 nm is deposited by reactive sputtering for facilitating the following patterning and for suppressing so called "hillocking" ("buckling upwards"). The metal layer structure consisting of Ti/TiN/Al—Cu/TiN is then lithographically patterned after which the connections between components are defined by dry etching.

More metal layers can be added to the process, by depositing a passivating layer on top of the first connection layer, whereupon via connections are defined using lithography and dry etching. Thereupon a two layer structure of Ti/TiN is deposited by sputtering according to the description above, whereupon the via openings are plugged using tungsten according to the process also described above. A second metal layer structure consisting of a laminate of TiN/Al—Cu/TiN is then deposited by sputtering. The connection layer is thereupon defined using lithography and dry etching. The sequence is repeated for the case where more connection layers are desired. The thickness of the employed Al—Cu-layer can vary from a few hundreds of nm up to a couple of $\mu$m depending on the complexity of the metal system and the circuit application. A metal system of multilayer type having relatively thick conductor layers of e.g. Al—Cu can be advantageous in the case where flat coils are to be integrated in the circuit. A manufacturing process employing several metal layers connected in parallel and located on top of a substrate slotted by trenches in the manufacture of flat coils for RF-IC-applications is described in the International Patent Application PCT/SE97/00954. This previously known process can be executed within the process as described above.

Figure 35A:
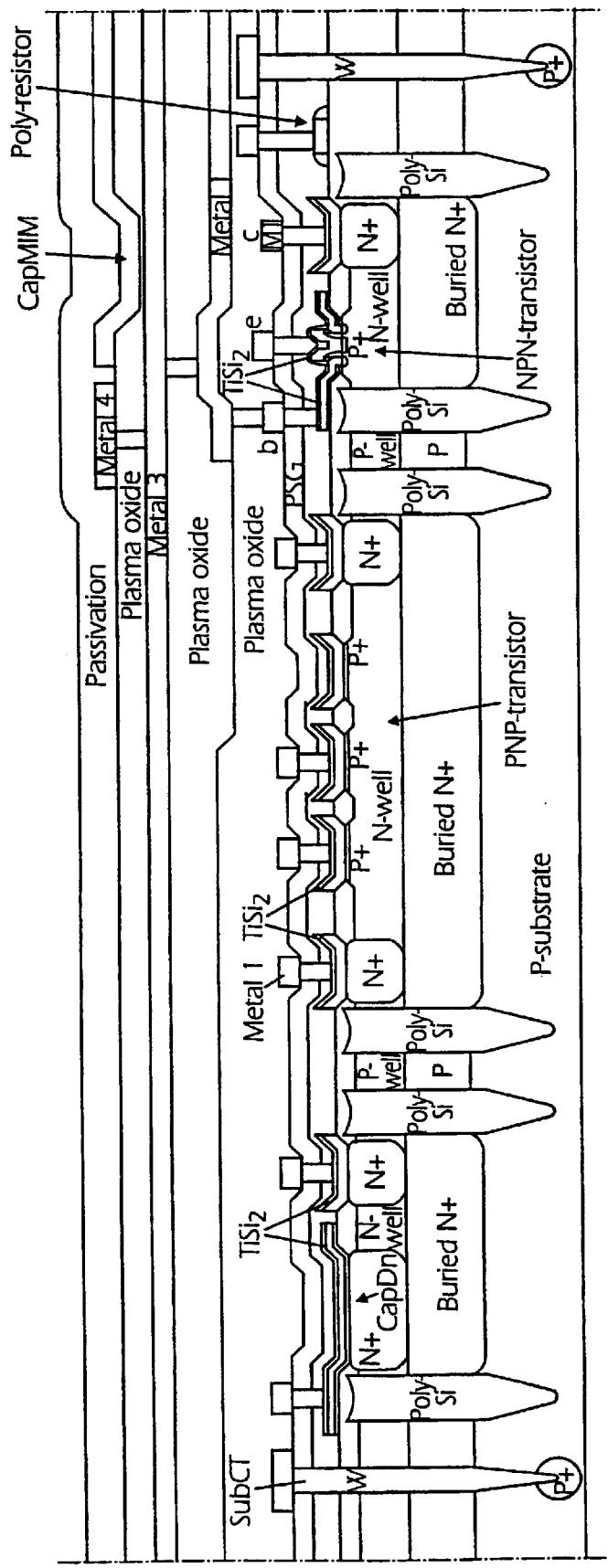
FIG. 35a is a cross-sectional view of finally produced electronic circuit elements comprising two kinds of transistors, two kinds of capacitors and a resistor element.

The final result, after adding several layers of metal to the process, appears from FIG. 35a. At the leftmost place in FIG. 35a a cross-section is shown of the manufactured plate capacitor, called "CapDn". The electrodes thereof are formed by an underlying monocrystalline silicon layer doped to N+ and a polysilicon layer of type P+ located on top of a dielectric of nitride. Directly to the right of the capacitor a lateral PNP-transistor is located, which employs polysilicon of type P+ in the formation of emitter and collector. The base connection is formed by the plug diffusion of type N+ from the surface in series with the bottom diffusion of type N+. At the rightmost location then a cross-section of the manufactured NPN-transistor is shown and a resistor produced of polysilicon of type N+. It should be observed that all components located in the silicon substrate are isolated from each other by deep trenches. The deep substrate contact holes filled with tungsten in the holes 85 and/or the substrate connections which have been made by diffusing from P+ polysilicon are suitably located between the isolation trenches 22 which surround each component area, for the best possible electrical decoupling.

It appears also from FIG. 35a that a further capacitor, CapMIM, in addition to that already described, CapDn, has been integrated between the topmost metal layers. The manufacturing process in implementing this metal—metal capacitor CapMIM, which employs a PECVD-nitride as a dielectric, has been adjusted to the use of tungsten-plugged vias. The advantage of the way in which the manufacture of this latter capacitor is integrated in the total manufacturing process, is described in the International Patent Application PCT/SE95/00619.

Figure 35B:
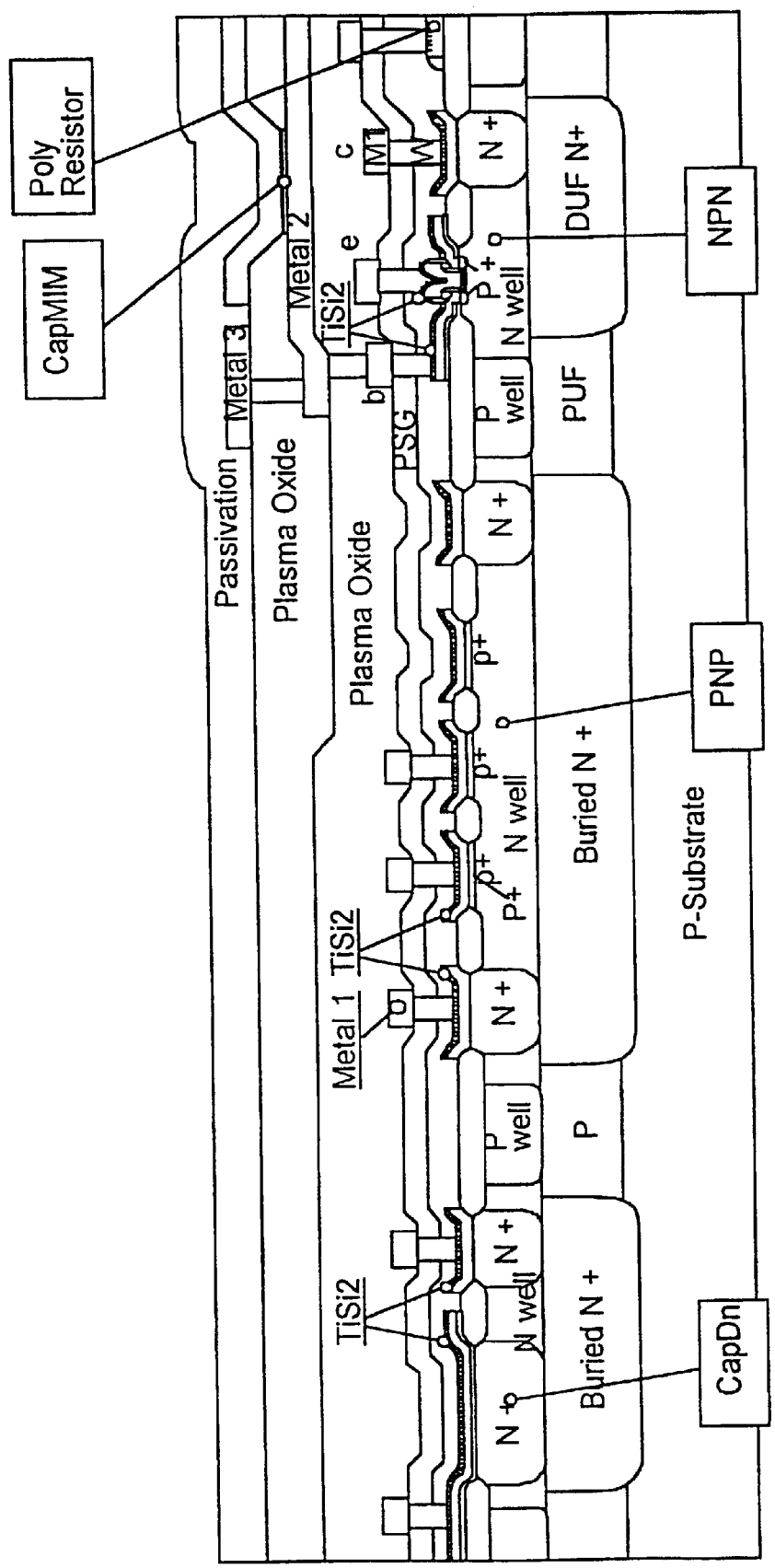
FIG. 35b is a cross-sectional view similar to FIG. 35a, in which substantially the same finally produced electronic circuit elements are illustrated but which are not isolated from each other by trenches.

In FIG. 35b the same structure as in FIG. 35a is illustrated but having no trenches 22, which electrically isolate different components. The isolation between different components at the surface of the circuit plate is in the structure according to FIG. 35 only constituted by the buried regions 8 of type P− and the P-regions or P-wells 14. In this case, when implanting boron for producing the P-regions 14, a dose at the higher limit of the mentioned range is used, i.e. of about $1 \cdot 10^{14}$ ions/cm$^2$, in order to obtain a sufficiently high electrical conductivity in the P-regions and hence a good isolation at the surface of the circuit plate between different component areas. When producing the structure illustrated in FIG. 35b the steps described above are omitted, which are only necessary to the production of the trenches 22, i.e. applying the photoresist layer 21 and making suitably placed openings therein, dry etching for producing openings in the hard mask, i.e. in the oxide layer 20, down through the barrier layer 19 of polysilicon and the field oxide layer 18, removing the photoresist layer 21, etching the very trenches 22, the possible ion implanting step after etching trenches for elevating the electrical field threshold, etching the remaining portions of the oxide layer 20 away, etching the polysilicon layer 19 away, depositing the layer 25 of microcrystalline silicon or polysilicon for filling the trenches 22, etching this silicon layer 27 away, thermally oxidizing the silicon plate in order to oxidize the silicon 27 in the trenches 22 for producing the isolating layer or cap-oxide 28 of silicon dioxide in the mouths or openings of the trenches. However, the thermal oxidation of the surface of the plate, which as described above gives an oxidation of the walls of the trenches 22, when producing the layer 23, see FIG. 18, must be executed, since in this oxidation the layer 24 of KOOI-oxide is formed on active surfaces.

Figure 36:
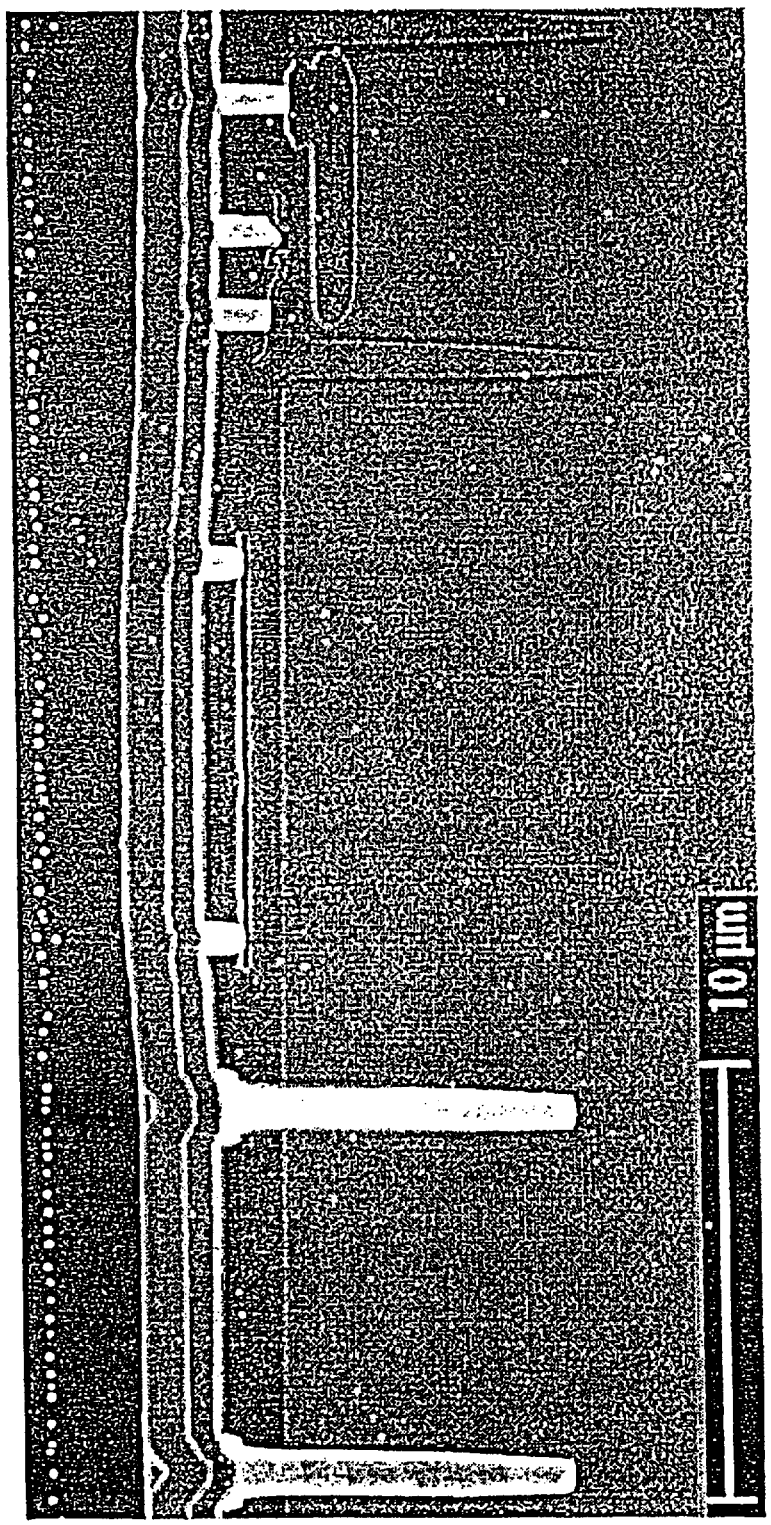
FIG. 36 is a picture captured by an electron microscope of a finally produced circuit, in which deep substrate contacts filled with tungsten, a polysilicon resistor and an NPN-transistor isolated by trenches are visible.

In FIG. 36 a picture is shown which is captured by electron microscopy of the finally produced circuit, in which deep substrate contacts filled with tungsten, a polysilicon resistor and an NPN-transistor isolated by trenches are visible.

Figure 37:
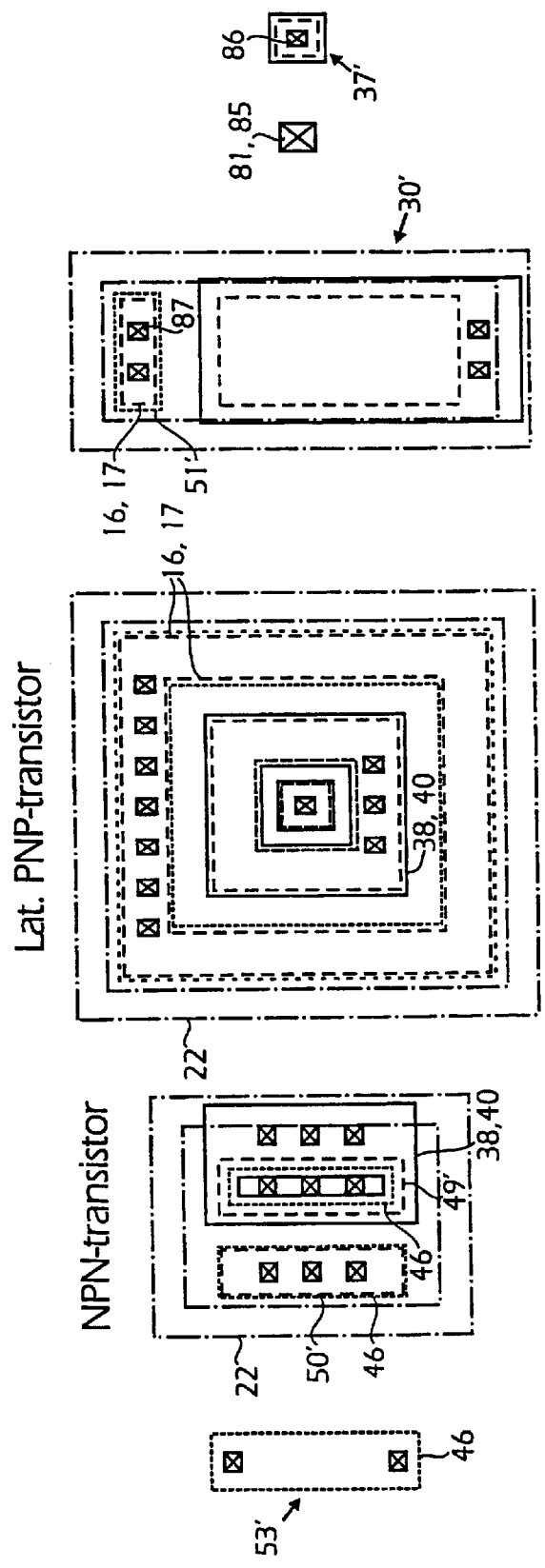
FIG. 37 is a view from above schematically illustrating how the different components are designed.

In the view from above in FIG. 37 the extensions horizontally, along the surface of the plate, of the different components are visible. The NPN-transistor has an extension in the depth direction, perpendicularly to the plane of the paper in the sectional views. The lateral PNP-transistor has in contrast a square shape where the emitter is located in the centre.

While specific embodiments of the invention have been illustrated and described herein, it is realized that numerous additional advantages, modifications and changes will readily occur to those skilled in the art. Therefore, the invention in its broader aspects is not limited to the specific details, representative devices and illustrated examples shown and described herein. Accordingly, various modifications may be made without departing from the spirit or scope of the general inventive concept as defined by the appended claims and their equivalents. It is therefore to be understood that the appended claims are intended to cover all such modifications and changes as fall within a true spirit and scope of the invention.

What is claimed is:

1. A process of manufacturing a vertical bipolar transistor, the process comprising the steps of:

providing a substrate having a surface;

producing a first doped region at the surface of the substrate, the first doped region being of a first doping type;

producing thick field oxide at a surface of the first doped region, the thick field oxide extending laterally outward from an opening in the field oxide to form a boundary region around the opening, the surface of the first doped region being exposed in the opening;

producing a first electrically isolating layer over at least the boundary region and the surface of the first doped region exposed in the opening in the field oxide;

removing a portion of the first electrically isolating layer inside the opening in the field oxide to form an extrinsic base opening exposing the surface of the first doped region, the extrinsic base opening being located at a first distance from the edges of the opening in the field oxide whereby a second portion of the first electrically isolating layer remains in contact with at least the surface of the first doped region along the edges of the opening in the field oxide;

applying a doped, electrically conducting silicon layer of a second doping type opposite the first doping type over at least a portion of the boundary region, the second portion of the first electrically isolating layer, and the surface of the first doped region exposed in the extrinsic base opening;

producing a second electrically isolating layer on top of the doped, electrically conducting silicon layer;

removing a portion of the doped, electrically conducting silicon layer and the second electrically isolating layer inside the extrinsic base opening to form an intrinsic base opening exposing the surface of the first doped region, the intrinsic base opening being located at a second distance from the edges of the opening in the field oxide greater than the first distance whereby a second portion of the doped, electrically conducting silicon layer and the second electrically isolating layer remains in contact with at least the surface of the first doped region along the edges of the extrinsic base opening;

depositing a first thin silicon dioxide layer to cover the intrinsic base opening and at least one of vertical free side walls and edge surfaces of the doped, electrically conducting silicon layer;

doping by ion implantation a surface layer of the surface of the first doped region through the first thin silicon dioxide layer in the intrinsic base opening using the second doping type to produce a base doping;

removing a portion of the first thin silicon dioxide layer inside the intrinsic base opening to produce an emitter opening; and doping a surface layer of the surface of the first doped region exposed in the emitter opening using the first doping type to produce an emitter doping.

2. The process of claim 1, wherein the first doping type is N-type.

3. The process of claim 1, wherein the step of producing the first electrically isolating layer includes the steps of first producing a bottom sublayer over at least a portion of the boundary region and the surface of the first doped region exposed in the opening in the field oxide and then applying a top sublayer on top of the bottom sublayer, whereby a laminated second layer is produced.

4. The process of claim 3, wherein the bottom sublayer is produced by producing a second thin oxide layer over the surface of the first doped region exposed in the opening in the field oxide.

5. The process of claim 4, wherein the top sublayer is applied by applying a nitride layer over at least a portion of the boundary region and over the second thin oxide layer.

6. The process of claim 1, further comprising the step of annealing the transistor after the step of doping a surface layer of the surface of the first doped region exposed in the emitter opening, whereby dopants diffuse out from the doped, electrically conducting silicon layer to form an extrinsic base and from the doped surface layers of the first doped region to form an intrinsic base and an intrinsic emitter.

7. The process of claim 1, wherein in the step of producing the first doped region, a second doped region separate from the first doped region is simultaneously produced at the surface of the substrate, the second doped region being similar to the first doped region and of the first doping type, and in the step of producing the first electrically isolating layer, a portion of the first electrically isolating layer is further produced over a surface of the second doped region to form a dielectric in a capacitor.

8. The process of claim 7, wherein, the doped, electrically conducting silicon layer is further applied over the portion of the first electrically isolating layer forming the dielectric, whereby the doped, electrically conducting silicon layer forms an upper electrode in the capacitor.

9. The process of claim 7, wherein the step of producing the first electrically isolating layer includes the steps of first producing a thin bottom silicon oxide layer over the surface of the second doped region, removing a portion of the thin bottom silicon oxide layer to expose the surface of the second doped region for forming a contact plug of a buried electrode of the capacitor, and then applying a silicon nitride layer on top of the thin bottom silicon oxide layer.

10. A process of manufacturing a lateral bipolar transistor, the process comprising the steps of:

providing a substrate having a surface;

producing a first doped region at the surface of the substrate, the first doped region being of a first doping type;

producing thick field oxide at a surface of the first doped region, the thick field oxide extending laterally outward from openings in the thick field oxide to form boundary regions around the openings, surfaces of the first doped region being exposed in the openings;

producing an electrically isolating layer over at least portions of the boundary regions and the surfaces of the first doped regions exposed in the openings in the field oxide;

removing portions of the electrically isolating layer inside at least one of the openings in the field oxide to form at least one emitter opening and inside at least another of the openings in the field oxide to form at least one collector opening, the at least one emitter and collector openings being located a distance from the edges of corresponding openings in the field oxide and exposing respective surfaces of the first doped region, whereby other portions of the electrically isolating layer remain in contact with at least the surface of the first doped region along the edges of the openings in the field oxide;

doping the respective surfaces of the first doped region exposed in the emitter and collector openings using a second doping type opposite the first doping type to form respective emitter and a collector dopings; and making electrical connections to the emitter and collector dopings and to a base portion of the first doped region being doped with the first doping type.

11. The process of claim 10, wherein in the step of doping the respective surfaces of the first doped region, dopants out-diffuse from a doped, electrically conducting silicon layer of the second doping type applied over at least portions of the boundary regions, the other portions of the electrically isolating layer, and the surfaces of the first doped region exposed in the emitter and collector openings, into the respective surfaces of the first doped region to form the electrical connections to the emitter and collector dopings.

12. The process of claim 10, wherein the step of producing the electrically isolating layer includes the steps of first applying a bottom sublayer over at least portions of the boundary region and the surfaces of the first doped region exposed in the openings in the field oxide, and then applying a top sublayer on top of the bottom sublayer whereby a laminated layer is produced.

13. The process of claim 12, wherein the bottom sublayer is produced by producing a thin silicon oxide layer over the surfaces of the first doped region exposed in the openings in the field oxide.

14. The process of claim 13, wherein the top sublayer is applied by applying a silicon nitride layer over at least portions of the boundary region and over the thin silicon oxide layer.

* * * * *